United States Patent
Haigh

(10) Patent No.: US 9,529,954 B1
(45) Date of Patent: *Dec. 27, 2016

(54) STANDARD CELL LIBRARY WITH DFM-OPTIMIZED M0 CUTS

(71) Applicant: PDF Solutions, Inc., San Jose, CA (US)

(72) Inventor: Jonathan Haigh, Pittsburgh, PA (US)

(73) Assignee: PDF Solutions, Inc., San Jose, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 15/067,252

(22) Filed: Mar. 11, 2016

(51) Int. Cl.
*G06F 17/50* (2006.01)
*H01L 27/118* (2006.01)
*H01L 27/02* (2006.01)

(52) U.S. Cl.
CPC ....... *G06F 17/5068* (2013.01); *H01L 27/0207* (2013.01); *H01L 27/11807* (2013.01); *H01L 2027/11883* (2013.01)

(58) Field of Classification Search
CPC ............ G06F 17/5068; H01L 27/11807; H01L 27/0207; H01L 2027/11883
See application file for complete search history.

(56) References Cited

U.S. PATENT DOCUMENTS

| | | | | |
|---|---|---|---|---|
| 7,487,474 B2 * | 2/2009 | Ciplickas | ............ | G06F 17/5045 716/112 |
| 7,919,792 B2 * | 4/2011 | Law | ..................... | H01L 27/0207 257/202 |
| 9,202,820 B1 * | 12/2015 | Haigh | ............... | H01L 27/11807 |
| 2016/0111421 A1 * | 4/2016 | Rodder | ............... | H01L 27/0886 257/401 |

OTHER PUBLICATIONS

V. Timoshkov, et al., "Imaging challenges in 20nm and 14nm logic nodes: hot spots performance in Metal1 layer," 29th European Mask and Lithography Conference, Jun. 30, 2013.
P. Mishra, et al., "FinFET Circuit Design," Springer Science+Business Media, LLC, 2011.
A. B. Kahng, "Lithography-Induced Limits to Scaling of Design Quality," Proc. SPIE 9053, Design-Process-Technology Co-optimization for Manufacturability VIII, Mar. 28, 2014.
C. Piguet, "Microelectronics for Systems on Chips," Lecture notes for Chapter 1, Part 1, 2014.
C. Piguet, "Microelectronics for Systems on Chips," Lecture notes for Chapter 1, Part 2, 2014.
C. Piguet, "Microelectronics for Systems on Chips," Lecture notes for Chapter 2, Part 1, 2014.
C. Piguet, "Microelectronics for Systems on Chips," Lecture notes for Chapter 2, Part 2, 2014.
J. Baker, "CMOS: circuit design, layout, and simulation (3rd ed.)," John Wiley & Sons, 2010.
J. Wright, "Standard Cell Libraries for use in Mixed Signal Circuits," EE Times, Nov. 7, 2000.
E. N. Shauly, "CMOS Leakage and Power Reduction in Transistors and Circuits: Process and Layout Considerations," Journal of Low Power Electronics and Applications, Jan. 27, 2012.

(Continued)

*Primary Examiner* — Naum B Levin
(74) *Attorney, Agent, or Firm* — David Garrod

(57) ABSTRACT

A library of a DFM-improved standard logic cells that avoid pattern-degrading configurations in the M0 layer is disclosed, along with wafers, chips and systems constructed from such cells.

20 Claims, 279 Drawing Sheets latqx1

(56) References Cited

OTHER PUBLICATIONS

K. Vaidyanathan, et al., "Design implications of extremely restricted patterning," Journal of Micro/Nanolithography, MEMS, and MOEMS, Oct. 3, 2014.
R. Aitken, "Physical design and FinFETs," Keynote address, Proceedings of the 2014 on International symposium on physical design, Mar. 30, 2014.
T.-J. K. Liu, "Bulk CMOS Scaling to the End of the Roadmap," Symposium on VLSI Circuits Short Course, Jun. 13, 2012.
A. J. Al-Khalili, "ASIC Design," Lecture notes from Concordia University course, date unknown.
J. Warnock, "Circuit and PD Challenges at the 14nm Technology Node," Advanced Technologies and Design for Manufacturability, ISPD 2013, Mar. 24, 2013.
J. Sulistyo, "Development of CMOS Standard Cell Library," VTVT Group, Virginia Information Systems Center, Oct. 31, 2014.
No author, no title, slides from Concordia VLSI Design Lab, pp. 1-90, date unknown.
A. Biddle, "Design Solutions for 20nm and Beyond," White Paper, Synopsys, pp. 1-10, Jun. 2012.
P. De Bisschop, et al., "Joint-Optimization of Layout and Litho for SRAM and Logic towards the 20 nm node, using 193i," Proc. SPIE 7973, Optical Microlithography, Mar. 23, 2011.
B. Yu, "Design for Manufacturability: From Ad Hoc Solution to Extreme Regular Design," VLSI Circuits and Systems Letter, Oct. 18, 2015.
R. S. Ghaida, et al., "Single-Mask Double-Patterning Lithography for Reduced Cost and Improved Overlay Control," IEEE Transactions on Semiconductor Manufacturing, pp. 93-103, Feb. 2011.
A. B. Kahng, "Futures at the IC Design-Manufacturing Interface," UCSD VLSI CAD Laboratory, date unknown.
GUC, "The Challenge and Experience Sharing on 16nm Chip Implementation," 2014.
M. Smayling, "Gridded Design Rules: 1-D Approach Enables Scaling of CMOS Logic," Nanochip Technology Journal, pp. 33-37, 2008.
M. P. Sole, "Layout Regularity for Design and Manufacturability," Ph.D. Thesis, Universitat Politecnica de Catalunya, Jul. 8, 2012.

\* cited by examiner

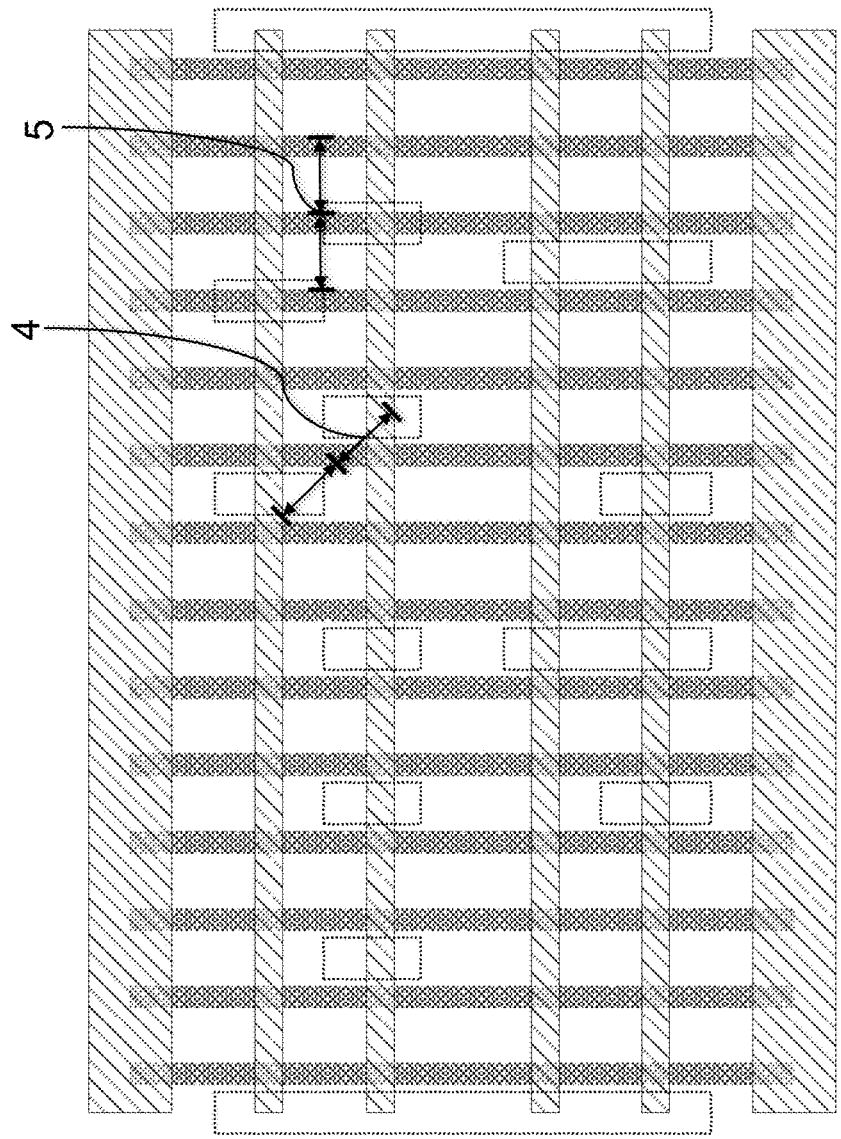

mux2x1_alt an2x1 an2x1 an2x2 an2x2 an2x2 an3x1 an3x1 an3x2 an3x2 an3x2 an4x1 an4x1 an4x2 an4x2 an4x2 ao21x1 ao21x1 ao21x1 ao31x1 ao211x1 ao211x1 ao211x1 aoi21x1 aoi21x1 aoi21x2 aoi21x2 aoi22x1 aoi22x1 aoi22x1

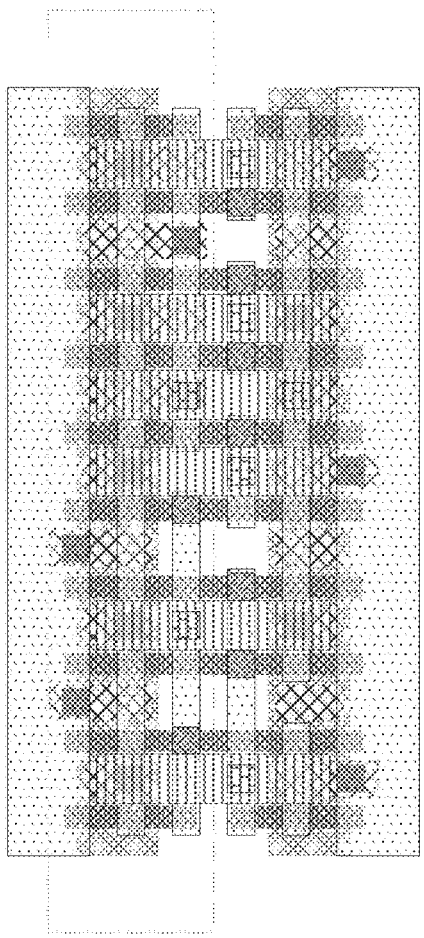

aoi22x2 aoi22x2 aoi31x1 aoi31x2 aoi31x2 aoi31x2 aoi211x1 aoi211x1 aoi211x1 aoi222x1 aoi222x1 aoi222x1 bufhx6 bufhx6 bufx1 bufx1 bufx2 bufx2 bufx2 bufx3 bufx3 bufx4 bufx4 bufx4 bufx6 bufx6 bufx8 bufx8 bufx8 ckor2lban2x1 ckor2lban2x1 dlyx1 dlyx1 fax1 fax1 hax1 hax1 iaoi21x1 iaoi21x1 ind2x1 ind2x2 ind2x2 ind3x1 ind3x2 ind3x2 inr2x1 inr2x1 inr2x2 inr2x2

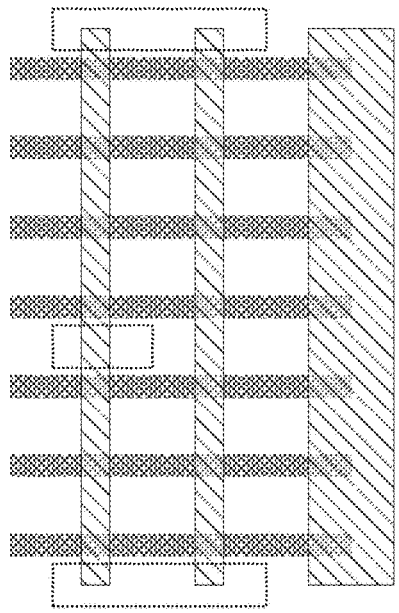
FIG. 37C  inr2x2 inr3x1 inr3x1 inr3x1 inr3x2 inr3x2 inr3x2 invx1 invx1 invx1 invx2 invx2 invx2 invx4 invx4 invx6 invx6 invx6 invx8 invx8 ioai21x1 ioai21x1 ioai21x1 latqx1 latqx1 mux2x1 mux2x1 mux2x1 mux2x2 mux2x2 mux2x2 muxi2x1 muxi2x1 muxi2x1 nd2x1 nd2x1 nd2x1 nd2x2 nd2x2 nd2x3 nd2x3 nd2x3 nd2x4 nd2x4 nd2x4 nd3x1 nd3x1 nd3x2 nd3x2 nd3x3 nd3x3 nd3x3 nd3x4 nd3x4 nd4x1 nd4x1 nd4x1 nd4x2 nd4x2 nd4x2 nr2x1 nr2x1 nr2x1 nr2x2 nr2x2 nr2x2

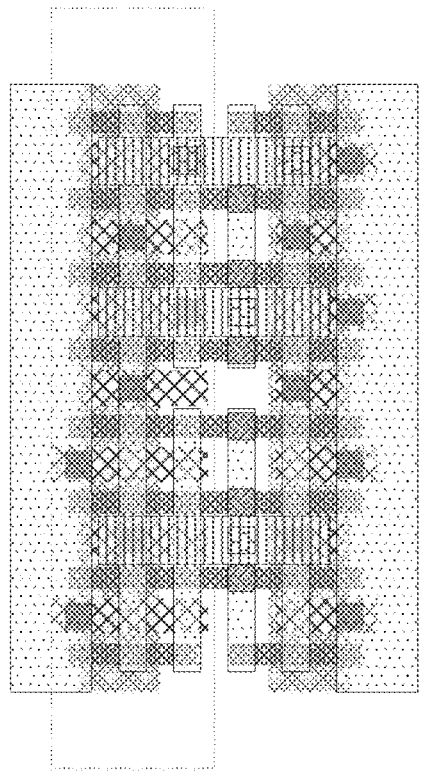
FIG. 61.1A

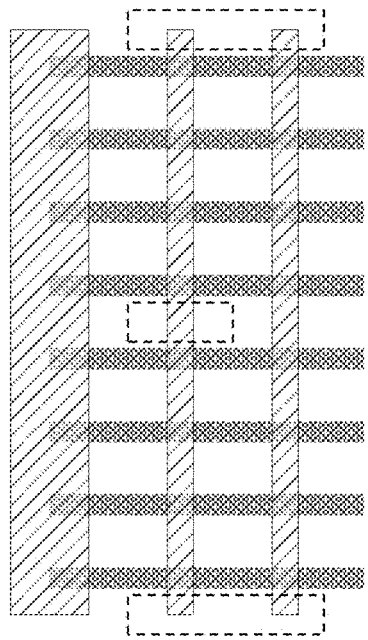
FIG. 61.1B

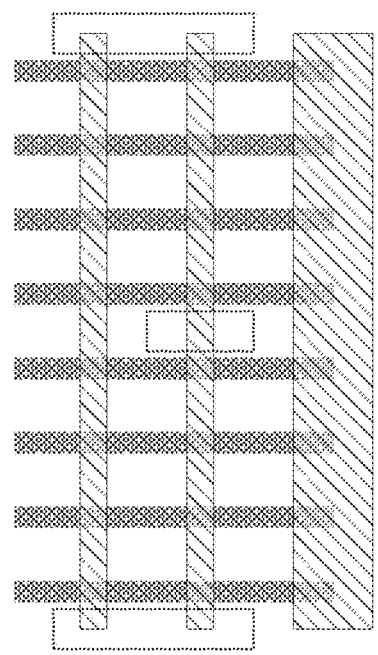
nr2x3
FIG. 61.1C nr2x4 nr2x4 nr3x1 nr3x1 nr3x1 nr3x2 nr3x2 nr3x2 nr3x3 nr3x3 nr3x3 nr3x4 nr4x1 nr4x1 nr4x1 nr4x2 nr4x2 nr4x2 oa21x1 oa21x1 oa21x1 oa31x1 oa31x1 oa31x1 oa211x1 oa211x1 oa211x1 oai21x1 oai21x1 oai21x1 oai21x2 oai21x2 oai21x2 oai22x1 oai22x1 oai22x1 oai22x2 oai22x2 oai22x2 oai31x1 oai31x1 oai31x1 oai31x2 oai31x2 oai211x1 oai211x1 oai211x1 oai222x1 oai222x1 oai222x1 or2x1 or2x1 or2x1 or2x2 or2x2 or2x2 or3x1 or3x1 or3x2 or3x2 or3x2 or4x1 or4x1 or4x1 or4x2 or4x2 or4x2 sdffqx1 sdffrsqx1 sdffrsqx1 tiehix1 tiehix1 tiehix1 tie1ox1 tielox1 tielox1 xnr2x1 xnr2x1 xnr2x1 xor2x1 xor2x1

PC

M0_color1

M0CUT1

ND CELL LIBRARY WITH
STANDARD CELL LIBRARY WITH
DFM-OPTIMIZED M0 CUTS

A portion of the disclosure of this patent document contains material which is subject to mask work protection, *M*, PDF Solutions, Inc. The mask work owner (PDF Solutions, Inc.) has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to design for manufacturability (DFM) of standard cells for advanced semiconductor processes (e.g., 10 nm, 7 nm), to libraries containing such cells, and to wafers/chips that contain instances of such cells.

BACKGROUND OF THE INVENTION

As semiconductor processes advance to render increasingly smaller features, the design of dense, high-yielding (manufacturable) cells becomes increasingly challenging. See, e.g., U.S. Pat. No. 9,202,820, "Flip-flop, latch, and mux cells for use in a standard cell library and integrated circuits made therefrom," to the inventor herein.

In the most advanced processes, patterning of critical layers is typically restricted to one direction (unidirectional) in each layer, delimited by cut masks, with the cut masks increasingly multi-patterned. In such technologies, careful attention to often non-obvious potential manufacturability problems is critical to successful implementation of a standard cell library. The invention, as described in detail below, provides an example of a DFM-optimized standard cell library for use in such advanced semiconductor processes.

SUMMARY OF THE INVENTION

One aspect relates to a library of DFM-improved standard cells, optimized for use in advanced semiconductor processes that include multi-patterned M0 cut masks.

Another aspect of the invention relates to wafers, chips, and systems that include such DFM-improved cells.

Applicant has discovered that, with very careful design, seemingly incompatible demands for cell density and avoidance of certain difficult-to-manufacture features can be simultaneously achieved. In particular, as exemplified by the depicted cells herein, the present invention provides a library of competitively dense logic cells with highly-optimized patterning in the first-level metal (M0) layer. As described in greater detail below, such patterning avoids spacing M0 cuts so close that they increase the risk of manufacturing failure.

Accordingly, generally speaking, and without intending to be limiting, certain aspects of the invention relate to collections of standard logic cells, implementing a plurality of logic functions, wherein each standard cell comprises, for example, at least the following: two elongated supply rails, each formed in a first metal (M0) layer, each supply rail having a width at least twice a minimum permitted width for M0 features, and each supply rail extending horizontally across the entire width of the standard cell; at least three elongated gate stripes, each formed in a gate (PC) layer, and each extending vertically between at least two of the supply rails, with adjacent gate stripes spaced at a minimum contacted poly pitch (CPP); positioned vertically between the supply rails, at least two, first-exposure M0 tracks, each of the first-exposure M0 tracks having the minimum permitted width and extending horizontally across the cell, the first-exposure M0 tracks patterned, in part, by portion(s) of a first-exposure M0 mask (M0_color1) and, in part, by portion(s) of a first-exposure M0 cut mask (M0CUT1); positioned vertically between the supply rails, at least two, second-exposure M0 tracks, each of the second-exposure M0 tracks having the minimum permitted width and extending horizontally across the cell, the second-exposure M0 tracks patterned, in part, by portion(s) of a second-exposure M0 mask (M0_color2) and, in part, by portion(s) of a second-exposure M0 cut mask (M0CUT2); and additional patterned features, in NW (N-well), TS (trench silicide), RX (active), CA (contact to active), GO (gate open, a/k/a CB), V0 (via to interconnect), and M1 (first-level interconnect) layers, configured to realize a logical function or behavior of the standard cell; wherein within in the cell: all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature; and all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature. Such collections may be embodied on silicon wafers, chips, or systems, or as instructions for patterning such cells, where such instruction are contained in a non-transient, computer-readable mediums, in data formats such as GDSII. Such collections preferably include cells implementing at least four, six, eight, ten, twelve, fourteen, sixteen, eighteen, twenty or more logical functions selected from the following list, each of which may be provided in multiple drive strength variants:

1. the logic function of a 2-input AND;
2. the logic function of a 3-input AND;
3. the logic function of a 4-input AND;
4. the logic function OR(AND(a,b),c);
5. the logic function OR(AND(a,b,c),d);
6. the logic function OR(AND(a,b),c,d);
7. the logic function NOT(OR(AND(a,b),c));
8. the logic function NOT(OR(AND(a,b),AND(c,d)));
9. the logic function NOT(OR(AND(a,b,c),d));
10. the logic function NOT(OR(AND(a,b),c,d));
11. the logic function NOT(OR(AND(a,b),AND(c,d), AND(e,f)));
12. the logic function of a buffer;
13. the logic function of a clock-gating latch;
14. the logic function of a delay gate;
15. the logic function of a full adder;
16. the logic function of a half adder;

17. the logic function NOT(OR(AND(a,b),c)), with one of its inputs inverted;
18. the logic function of a 2-input NAND, with one of its inputs inverted;
19. the logic function of a 3-input NAND, with one of its inputs inverted;
20. the logic function of a 2-input NOR, with one of its inputs inverted;
21. the logic function of a 3-input NOR, with one of its inputs inverted;
22. the logic function of an inverter;
23. the logic function NOT(AND(OR(a,b),c)), with one of its inputs inverted;
24. the logic function of a latch;
25. the logic function of a 2-input MUX;
26. the logic function of a 2-input MUX, with one of its inputs inverted;
27. the logic function of a 2-input NAND;
28. the logic function of a 3-input NAND;
29. the logic function of a 4-input NAND;
30. the logic function of a 2-input NOR;
31. the logic function of a 3-input NOR;
32. the logic function of a 4-input NOR;
33. the logic function AND(OR(a,b),c);
34. the logic function AND(OR(a,b,c),d);
35. the logic function AND(OR(a,b),c,d);
36. the logic function NOT(AND(OR(a,b),c));
37. the logic function NOT(AND(OR(a,b),OR(c,d));
38. the logic function NOT(AND(OR(a,b,c),d));
39. the logic function NOT(AND(OR(a,b),c,d));
40. the logic function NOT(AND(OR(a,b),OR(c,d),OR(e,f)));
41. the logic function of a 2-input OR;
42. the logic function of a 3-input OR;
43. the logic function of a 4-input OR;
44. the logic function of a scan-enabled D flip-flop;
45. the logic function of a scan-enabled D flip-flop, with set and reset;
46. the logic function 1;
47. the logic function 0;
48. the logic function of a 2-input XNOR; and,
49. the logic function of a 2-input XOR.

Again, generally speaking, and without intending to be limiting, other aspects of the invention relate to collections of standard logic cells, implementing a plurality of logic functions, wherein each standard cell comprises, for example, at least the following: at least two elongated supply rails, extending horizontally across the standard cell; at least three elongated gate stripes, each extending vertically between at least two of said supply rails, adjacent gate stripes spaced at a minimum contacted poly pitch (CPP); positioned vertically between the supply rails, one or more first-exposure M0 tracks, each of the first-exposure M0 tracks having a minimum permitted width for M0 patterning and extending horizontally across the cell, the first-exposure M0 tracks patterned, in part, by feature(s) of a first-exposure M0 mask (M0_color1) and, in part, by feature(s) of a first-exposure M0 cut mask (M0CUT1); positioned vertically between the supply rails, one or more second-exposure M0 tracks, each of the second-exposure M0 tracks having the minimum permitted width and extending horizontally across the cell, the second-exposure M0 tracks patterned, in part, by feature(s) of a second-exposure M0 mask (M0_color2) and, in part, by feature(s) of a second-exposure M0 cut mask (M0CUT2); and means, including additional patterned features in NW (N-well), TS (trench silicide), RX (active), CA (contact to active), GO (gate open), V0 (via to interconnect), and M1 (first-level interconnect) layers, configured to realize a logical function or behavior of the standard cell; and wherein within in the cell: all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature; and all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature.

BRIEF DESCRIPTION OF THE DRAWINGS

The above, as well as other, aspects, features and advantages of the present invention are illustrated in the accompanying set of figures, which are rendered to relative scale, and in which:

FIGS. 1A-C depict an sdffqx1_alt cell;
FIGS. 15A-C depict an aoi22x2 cell.

FIGS. 37A-C depict an inr2x2 cell;
FIGS. 61.1A-C depict an nr2x3 cell.

DESCRIPTION OF EXEMPLARY EMBODIMENT(S)

Figure 92:
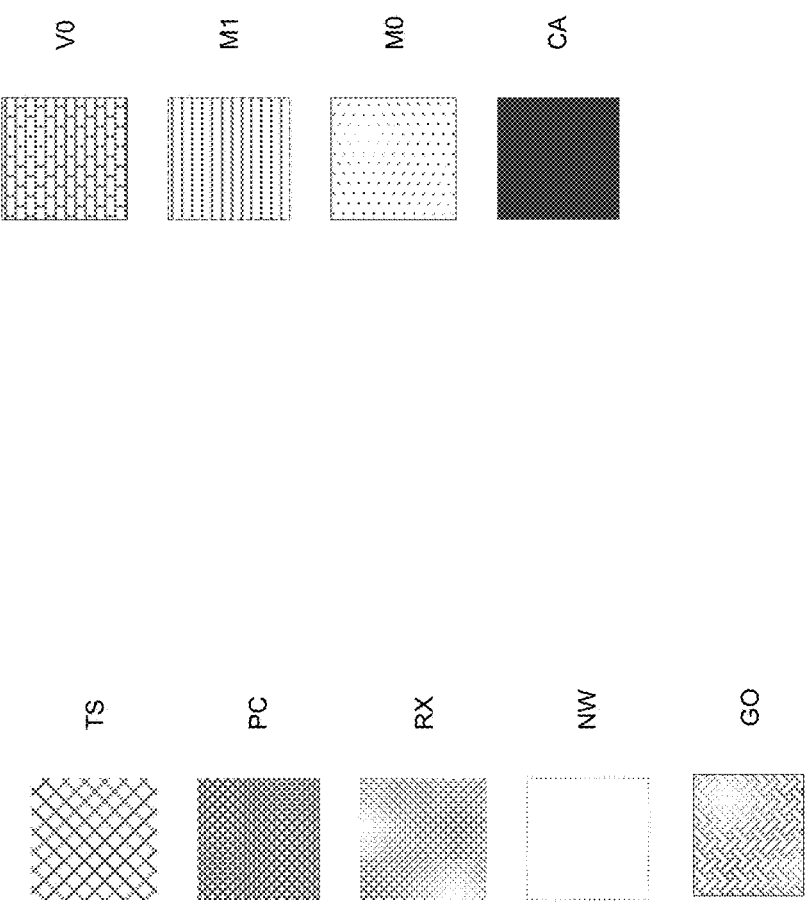
FIG. 92 contains a layer legend for the A-labeled (i.e., 1A, 2A, 3A, etc.) figures.
Figure 93:
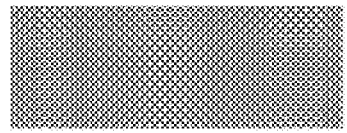
FIG. 93 contains a layer legend the B-labeled figures; and,
FIG. 94 contains a layer legend for the C-labeled figures;.
Figure 93:
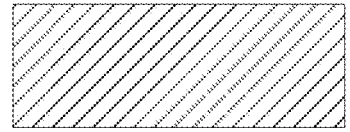
Figure 93:
Figure 94:
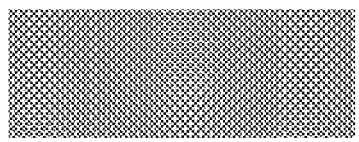
Figure 94:
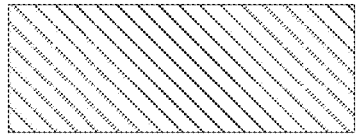
Figure 94:

FIGS. 92-94 show layer maps for the respective A-labeled, B-labeled and C-labeled figures that follow. With reference to FIG. 92, the full set of depicted layers includes: M0 (first metal), NW (N-well), TS (trench silicide), RX (active), CA (contact to active), PC (gate, a/k/a polysilicon or poly—although the gate material in advanced processes is typically metallic), GO (gate open, a/k/a CB), V0 (via to interconnect), and M1 (first-level interconnect). Persons skilled in the art will appreciate that any of these layers may be created through multiple exposure (e.g., double, triple or quadruple patterned) processes, and/or through use of cut masks, which themselves may be multi-patterned. The A-labeled figures in this application are intended to show the resulting complete cells as clearly as possible; thus, the details of multi-patterning and cut-masking have been eliminated from these figures.

Referring now to FIGs. 93 and 94, these show the layer maps for the B-labeled and C-labeled figures, which depict the multi-patterning, cut-masked details of M0 patterning in the inventive cells. In particular, in the exemplary embodiment herein, M0 is patterned in two exposures (M0_color1 and M0_color2), each of which is patterned by its own cut mask (M0CUT1 and M0CUT2, respectively). PC is shown in both the A-labeled and B-labeled figures as a measurement reference. Persons skilled in the art will understand that variations on the M0 process are possible. For example, M0 may be triple patterned, with a separate cut mask for each exposure, and/or an additional cut mask may be provided that cuts both (or all) exposures of M0.

Figure 1A:
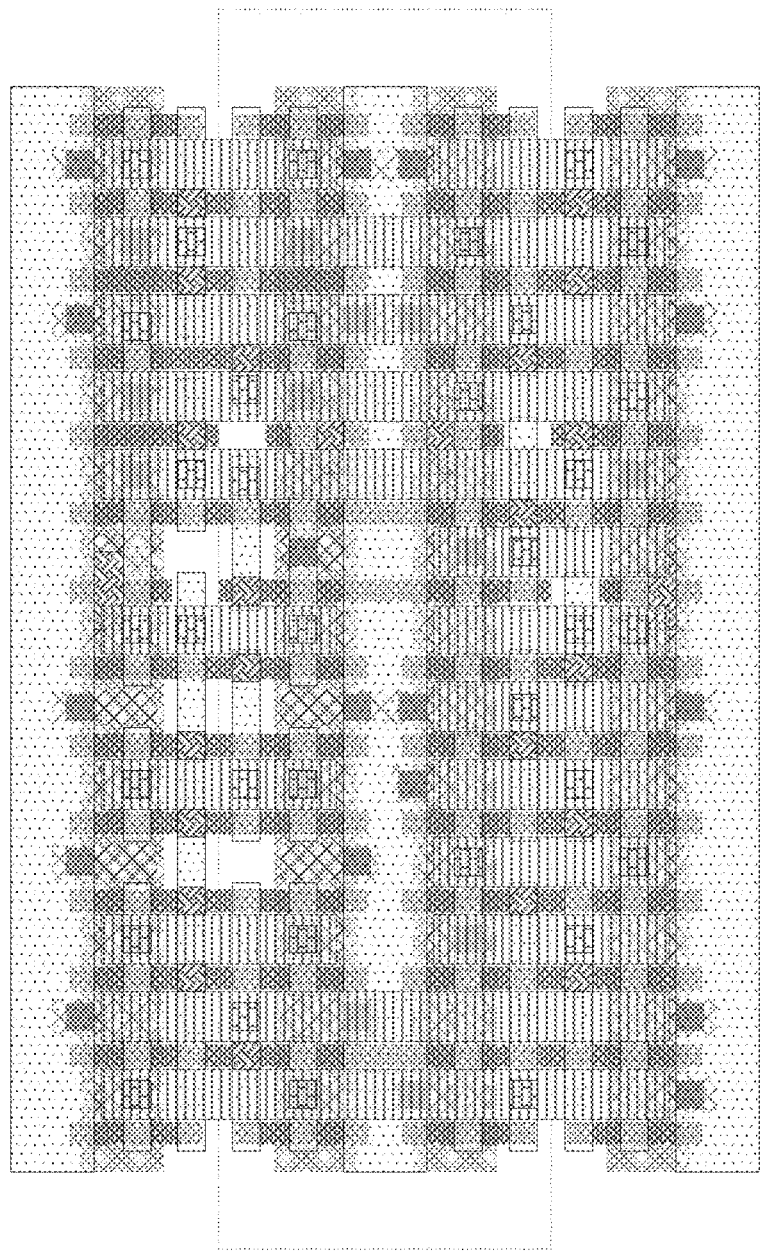
Figure 1B:
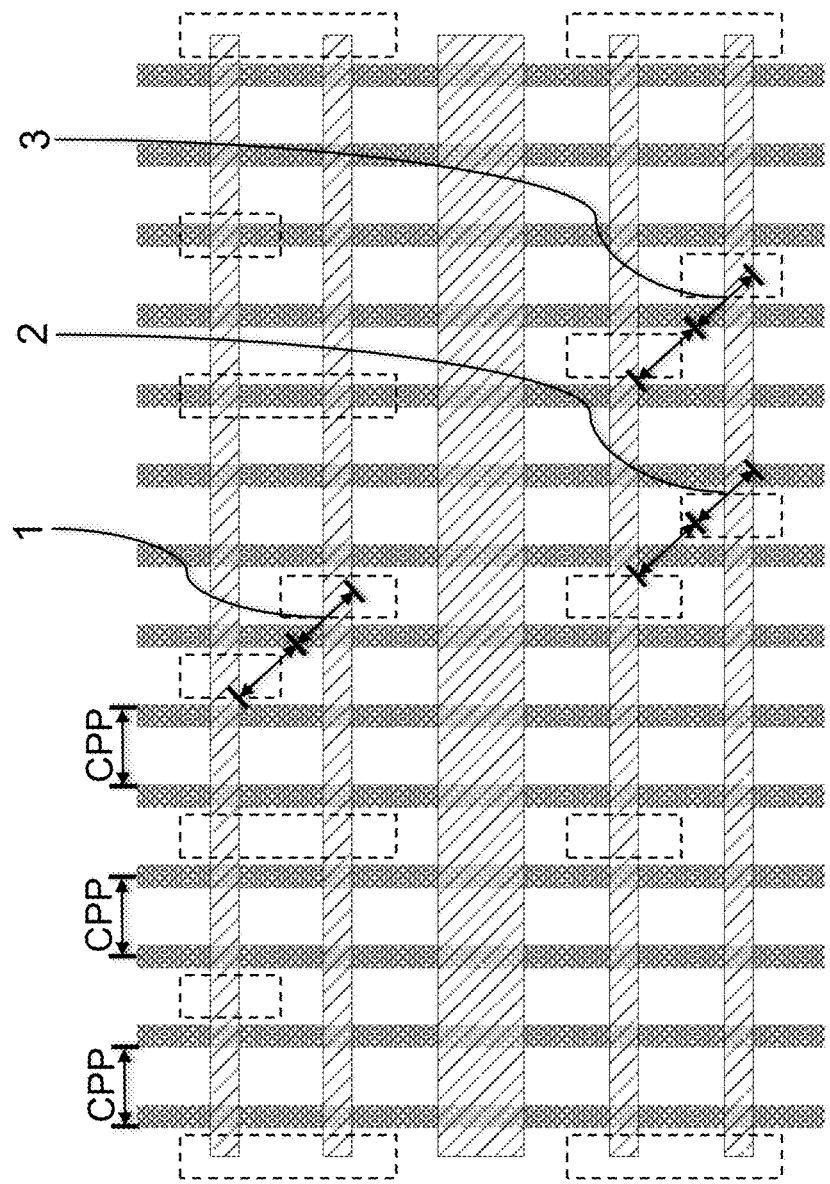

Reference is now made to FIGS. 1A-C, which depict an sdffqx1_alt cell. This cell implements the logic function of a scan-enabled, D flip-flop, in drive strength 1. This cell is an example of a state-of-the-art layout that, nevertheless, does not meet the objects of the present invention. Referring first to FIG. 1B, one can see that CPP (contacted poly pitch) can be equivalently measured as the left-edge-to-left-edge distance, center-to-center distance, or right-edge-to-right-edge distance between adjacent gate stripes. As further depicted in FIG. 1B, this cell contains several undesirable configurations in the first-exposure M0 layer: two instances of left-edge-to-left-edge first-exposure M0 cuts with spacing (1 and 3) of less than 2×CPP; and an instance of right-edge-to-right-edge first-exposure M0 cuts with a spacing (2) of less than 2×CPP. (Note, there may be additional violations on this layout, and others that follow in FIGS. 1C and 2B-C. The flagged examples are intended to be exemplary, not exhaustive.) Referring now to FIG. 1C, additional undesirable configurations in the second-exposure M0 layer are flagged: an instance of left-edge-to-left-edge second-exposure M0 cuts with a spacing (4) of less than 2×CPP; and an instance of right-edge-to-right-edge second-exposure M0 cuts with a spacing (5) of less than 2×CPP.

Figure 2A:
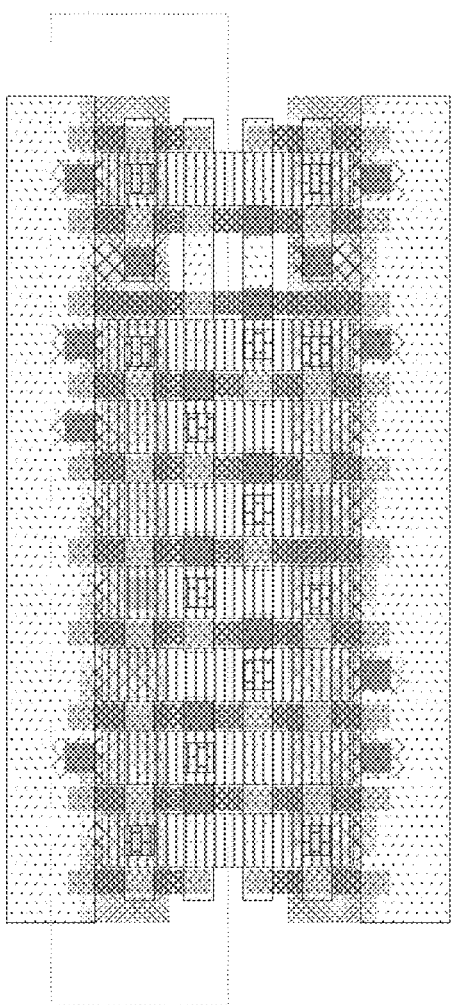
FIGS. 2A-C depict a mux2x1_alt cell.
Figure 2B:
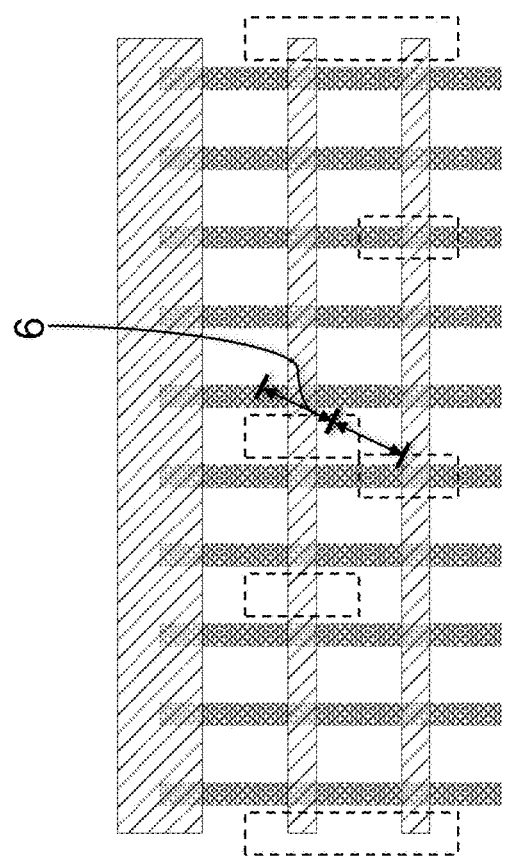
Figure 2C:
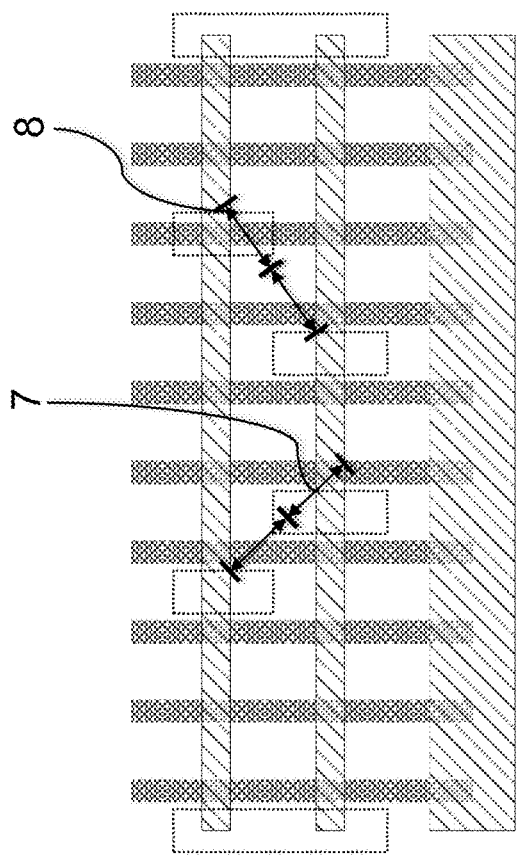

Reference is now made to FIGS. 2A-C, which depict a mux2x1_alt cell. This cell implements the logic function of a 2-input MUX, in drive strength 1. This cell is another example of a state-of-the-art layout that, nevertheless, does not meet the DFM objects of the present invention. As flagged in FIGS. 2B and 2C, this cell contains undesirable spacings between cuts in the first-exposure M0 layer (see 7 on FIG. 2B) and between cuts in the second-exposure M0 layer (see 8 and 9 in FIG. 2C).

Figure 3A:
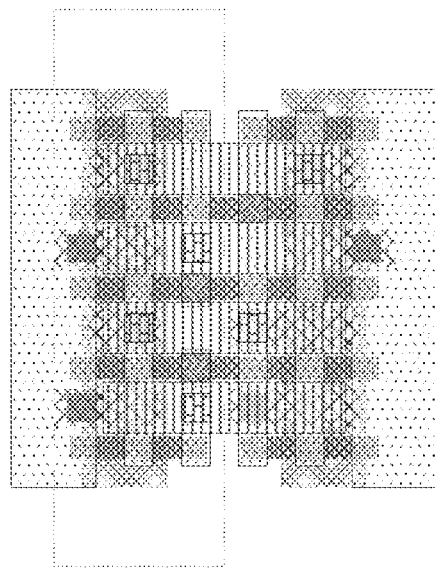
FIGS. 3A-C depict an an2x1 cell.
Figure 3B:
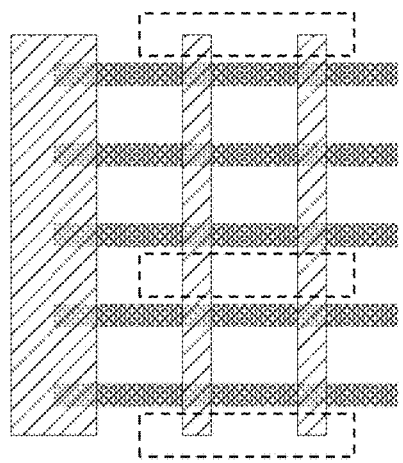
Figure 3C:
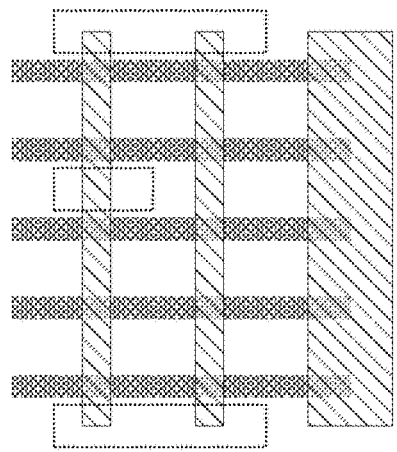

FIGS. 3A-C, et seq., as described below, contain examples of cells that meet the DFM objects of the present invention, and collectively comprise the exemplary, inventive library herein.

Reference is now made to FIGS. 3A-C, which depict an an2x1 cell. This cell implements the logic function of a 2-input AND, in drive strength 1. This cell is 4 CPP wide.

Figure 4A:
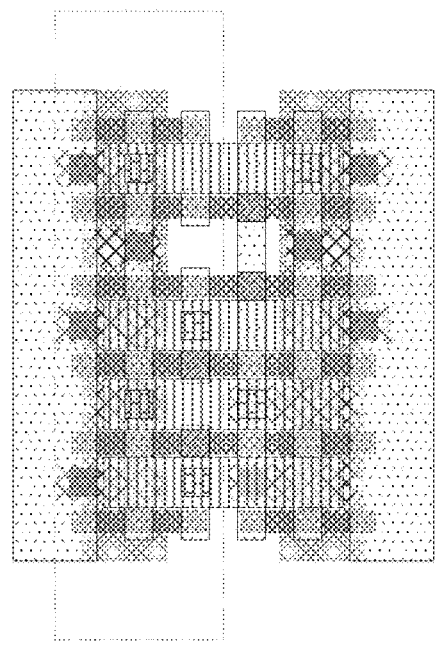
FIGS. 4A-C depict an an2x2 cell.
Figure 4B:
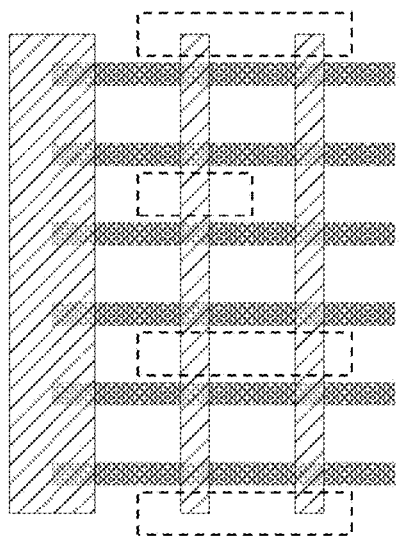
Figure 4C:
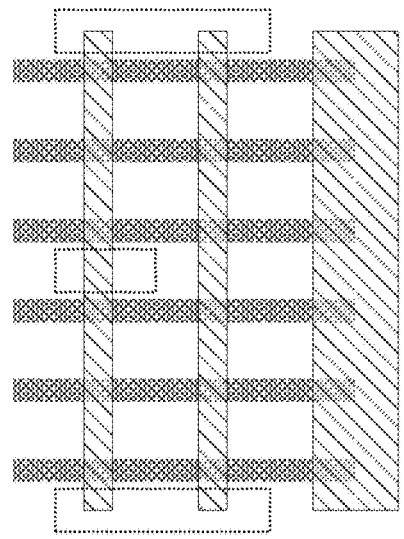

Reference is now made to FIGS. 4A-C, which depict an an2x2 cell. This cell implements the logic function of a 2-input AND, in drive strength 2. This cell is 5 CPP wide.

Figure 5A:
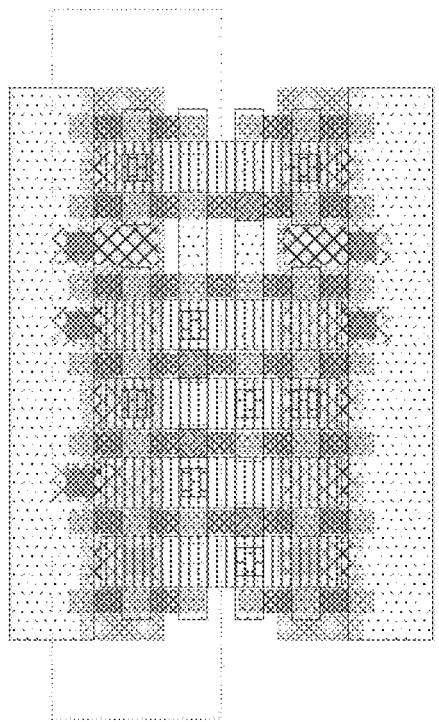
FIGS. 5A-C depict an an3x1 cell.
Figure 5B:
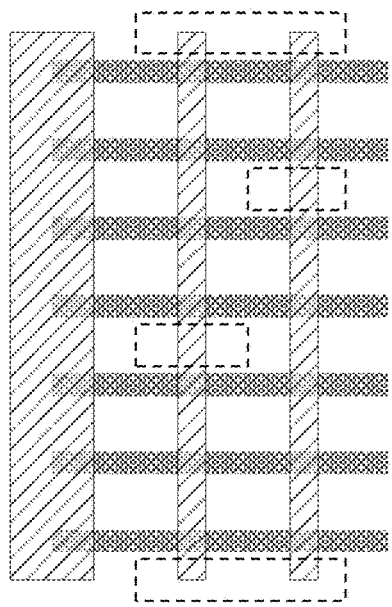
Figure 5C:
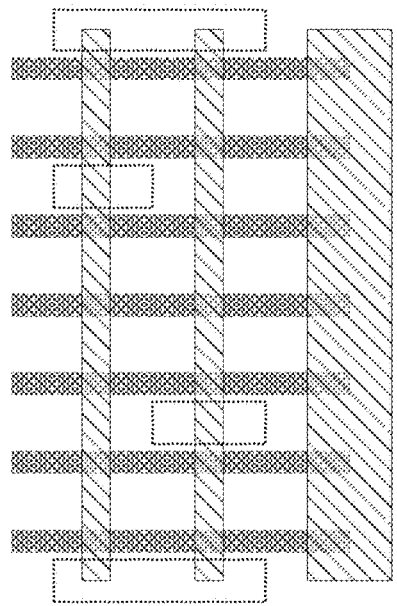

Reference is now made to FIGS. 5A-C, which depict an an3x1 cell. This cell implements the logic function of a 3-input AND, in drive strength 1. This cell is 6 CPP wide.

Figure 6A:
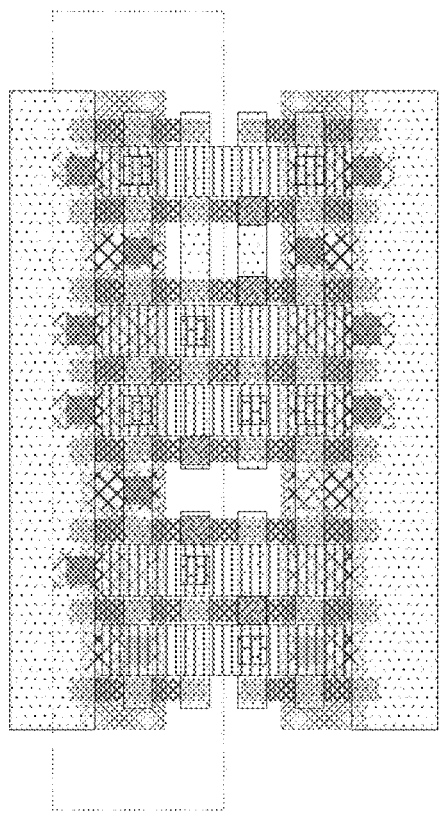
FIGS. 6A-C depict an an3x2 cell.
Figure 6B:
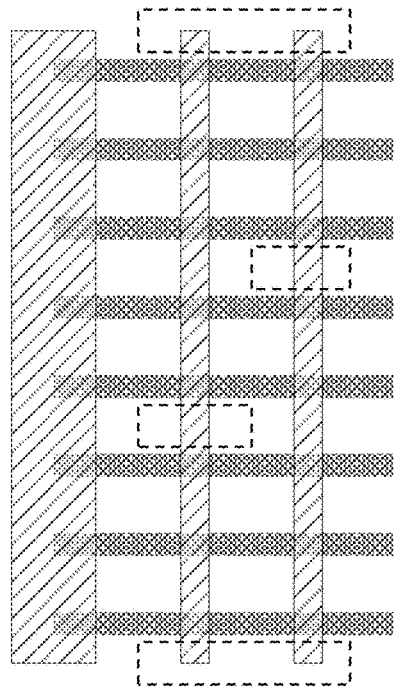
Figure 6C:
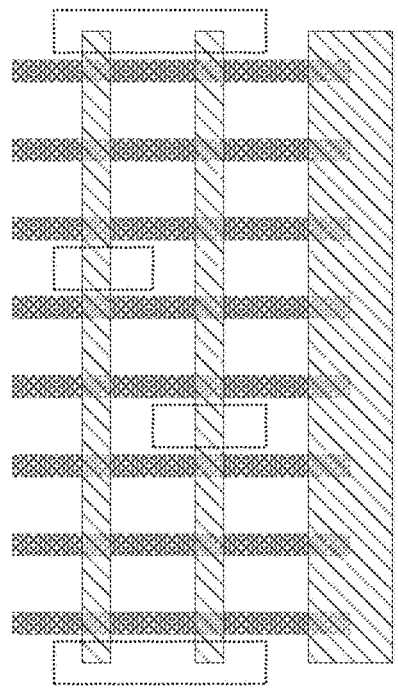

Reference is now made to FIGS. 6A-C, which depict an an3x2 cell. This cell implements the logic function of a 3-input AND, in drive strength 2. This cell is 7 CPP wide.

Figure 7A:
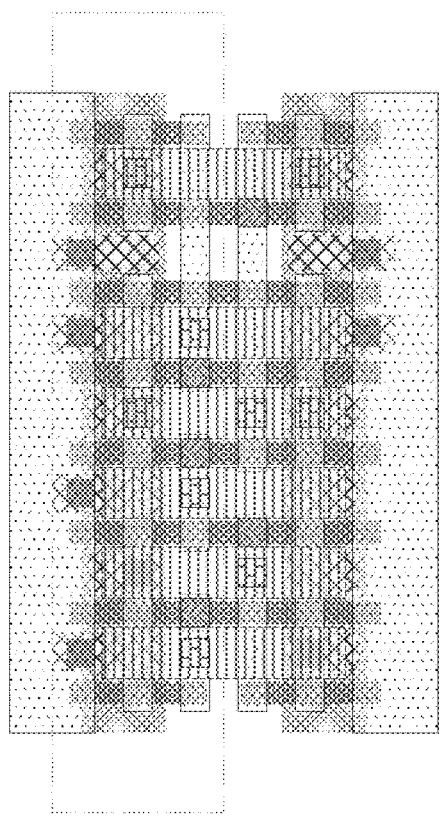
FIGS. 7A-C depict an an4x1 cell.
Figure 7B:
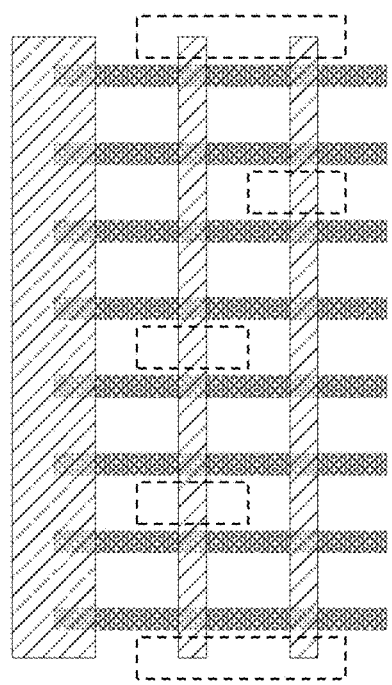
Figure 7C:
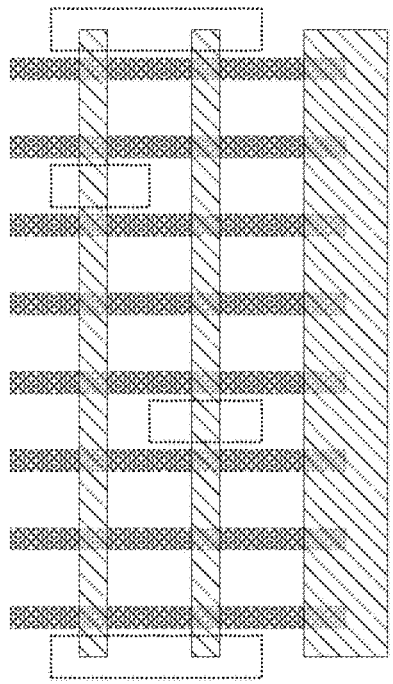

Reference is now made to FIGS. 7A-C, which depict an an4x1 cell. This cell implements the logic function of a 4-input AND, in drive strength 1. This cell is 7 CPP wide.

Figure 8A:
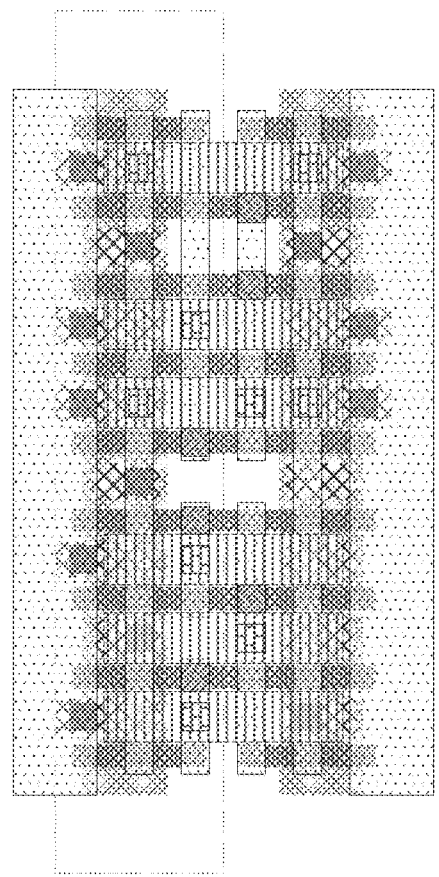
FIGS. 8A-C depict an an4x2 cell.
Figure 8B:
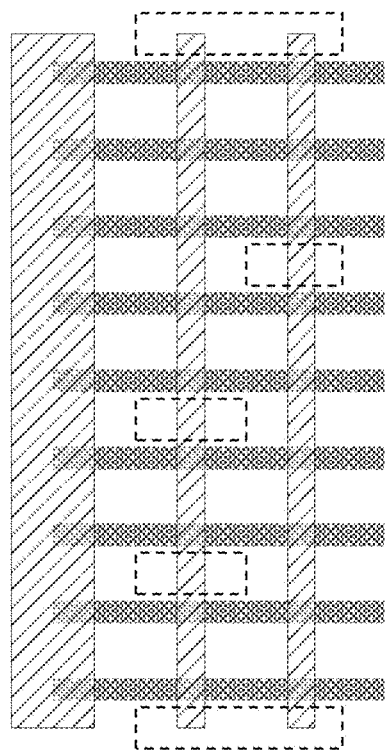
Figure 8C:
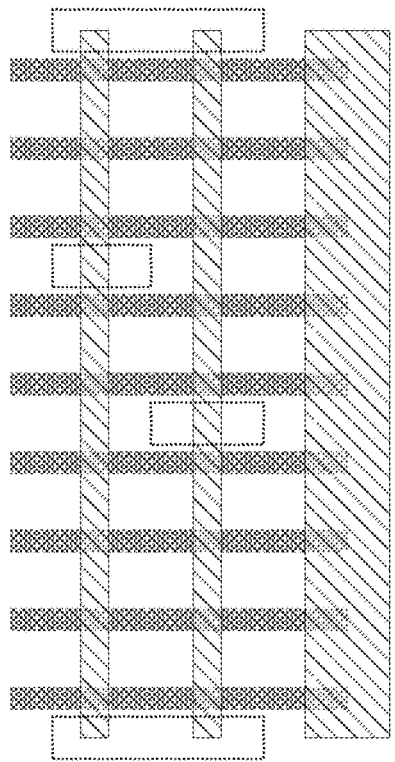

Reference is now made to FIGS. 8A-C, which depict an an4x2 cell. This cell implements the logic function of a 4-input AND, in drive strength 2. This cell is 8 CPP wide.

Figure 9A:
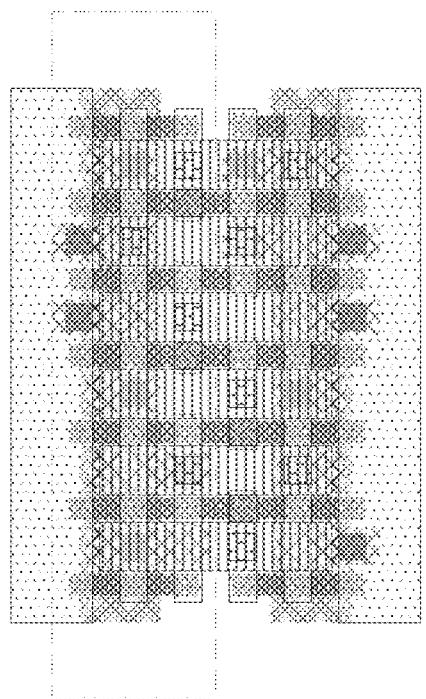
FIGS. 9A-C depict an ao21x1 cell.
Figure 9B:
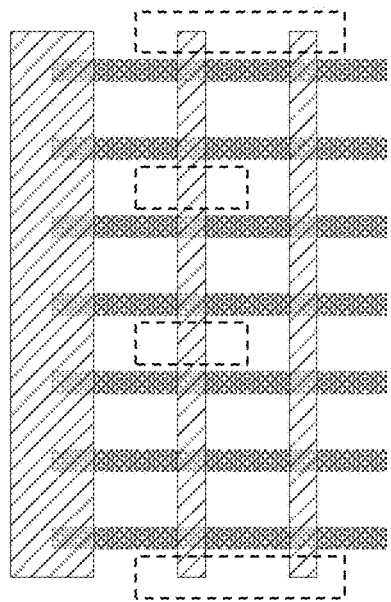
Figure 9C:
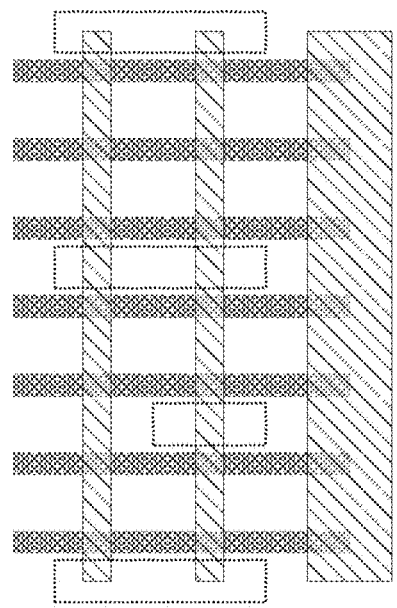

Reference is now made to FIGS. 9A-C, which depict an ao21x1 cell. This cell implements the logic function OR(AND(a,b),c), in drive strength 1. This cell is 6 CPP wide.

Figure 10A:
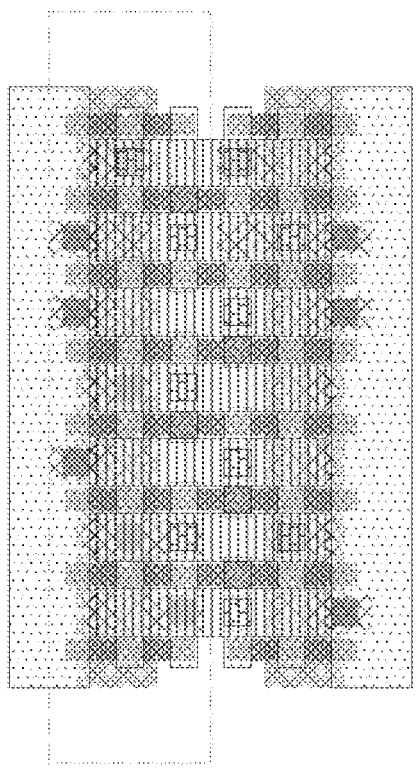
FIGS. 10A-C depict an ao31x1 cell.
Figure 10B:
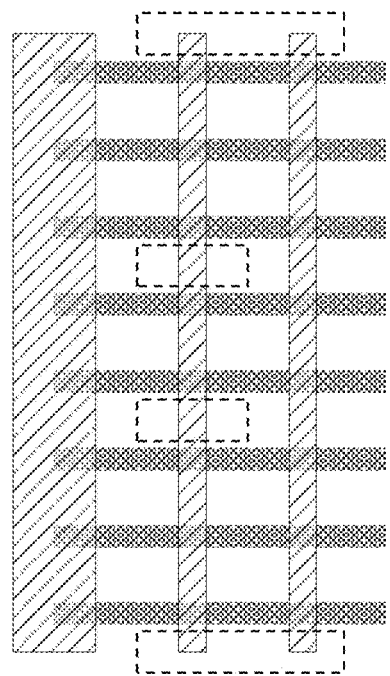
Figure 10C:
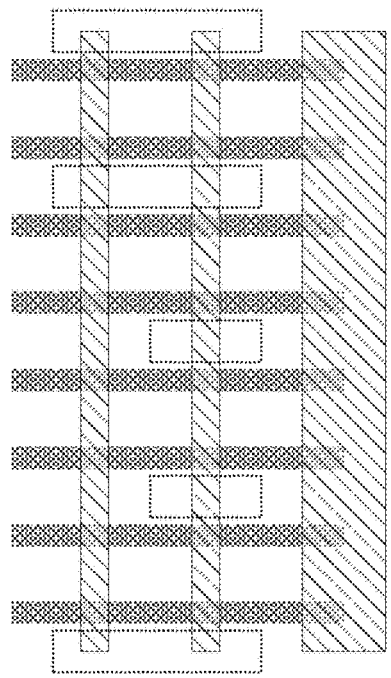

Reference is now made to FIGS. 10A-C, which depict an ao31x1 cell. This cell implements the logic function OR(AND(a,b,c),d), in drive strength 1. This cell is 7 CPP wide.

Figure 11A:
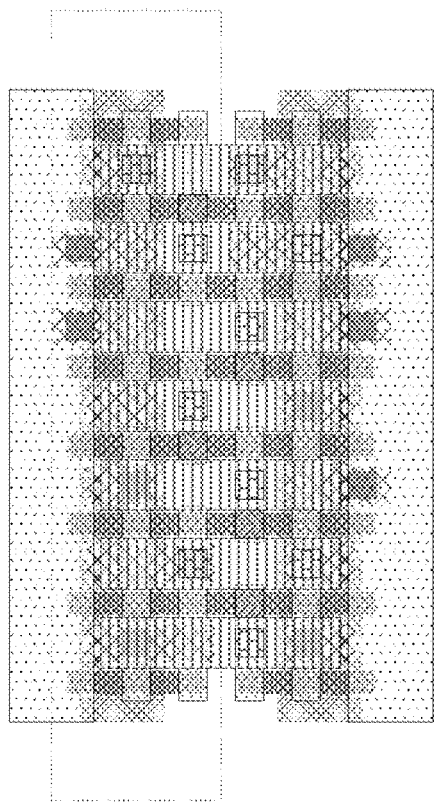
FIGS. 11A-C depict an ao211x1 cell.
Figure 11B:
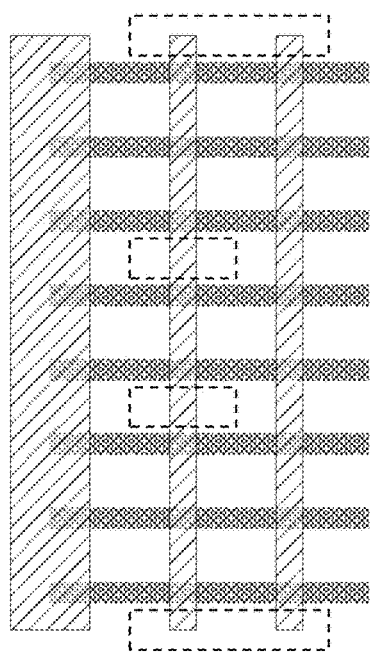
Figure 11C:
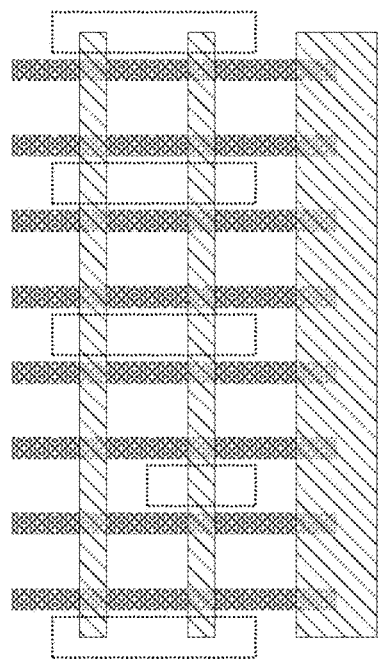

Reference is now made to FIGS. 11A-C, which depict an ao211x1 cell. This cell implements the logic function OR(AND(a,b),c,d), in drive strength 1. This cell is 7 CPP wide.

Figure 12A:
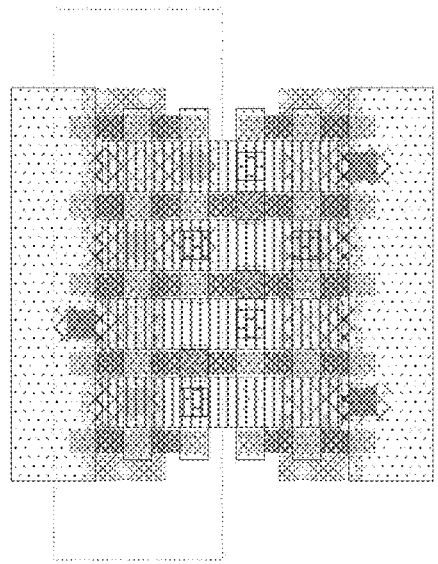
FIGS. 12A-C depict an aoi21x1 cell.
Figure 12B:
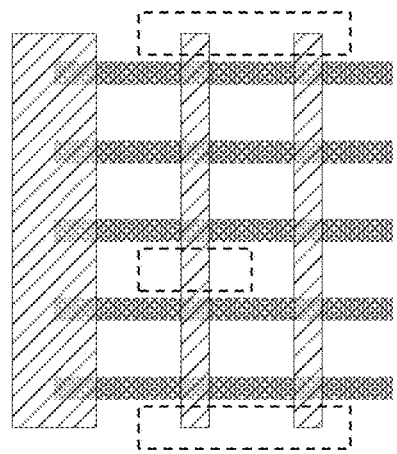
Figure 12C:
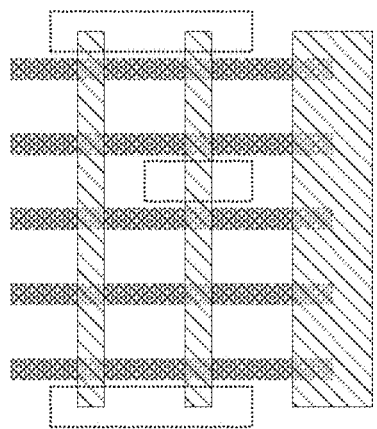

Reference is now made to FIGS. 12A-C, which depict an aoi21x1 cell. This cell implements the logic function NOT(OR(AND(a,b),c)), in drive strength 1. This cell is 4 CPP wide.

Figure 13A:
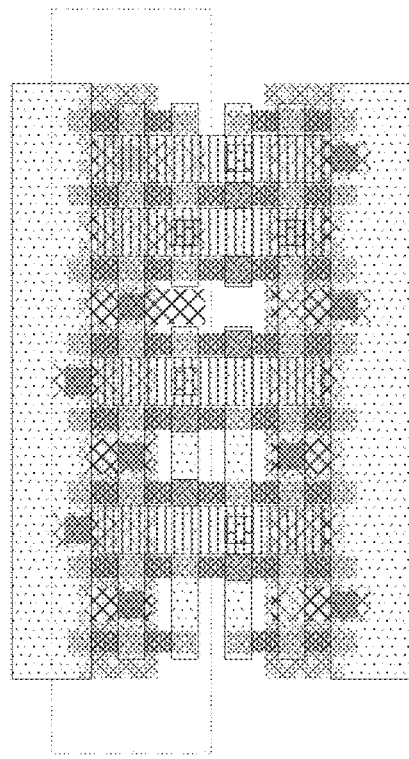
FIGS. 13A-C depict an aoi21x2 cell.
Figure 13B:
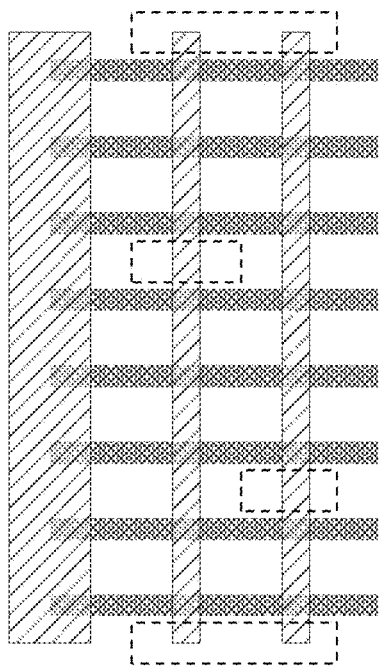
Figure 13C:
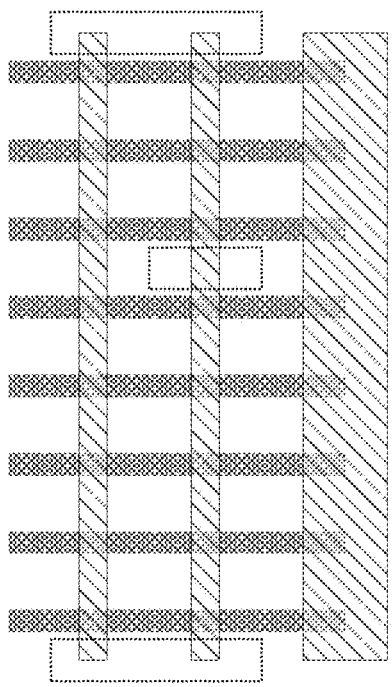

Reference is now made to FIGS. 13A-C, which depict an aoi21x2 cell. This cell implements the logic function NOT(OR(AND(a,b),c)), in drive strength 2. This cell is 7 CPP wide.

Figure 14A:
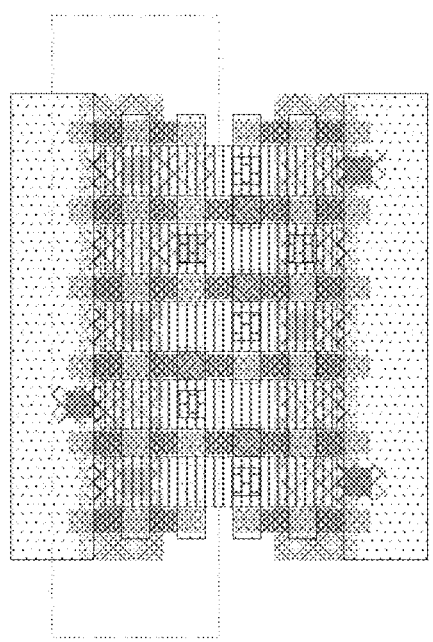
FIGS. 14A-C depict an aoi22x1 cell.
Figure 14B:
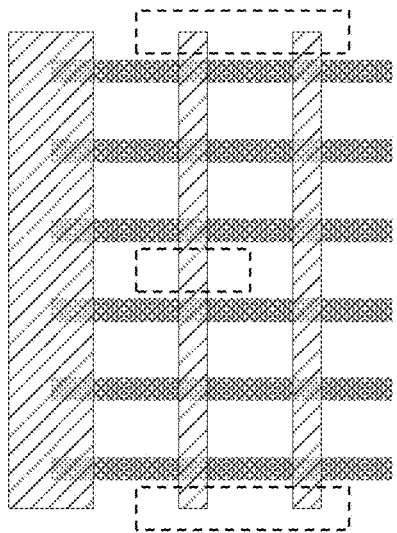
Figure 14C:
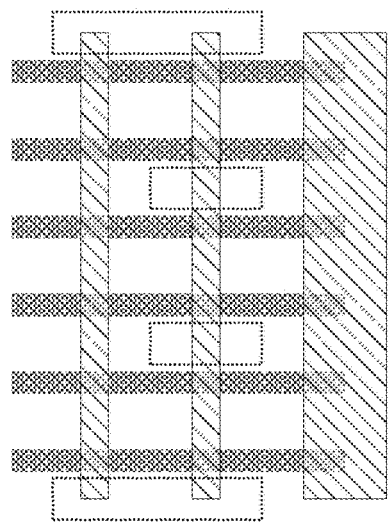

Reference is now made to FIGS. 14A-C, which depict an aoi22x1 cell. This cell implements the logic function NOT(OR(AND(a,b),AND(c,d))), in drive strength 1. This cell is 5 CPP wide.

Figure 15B:
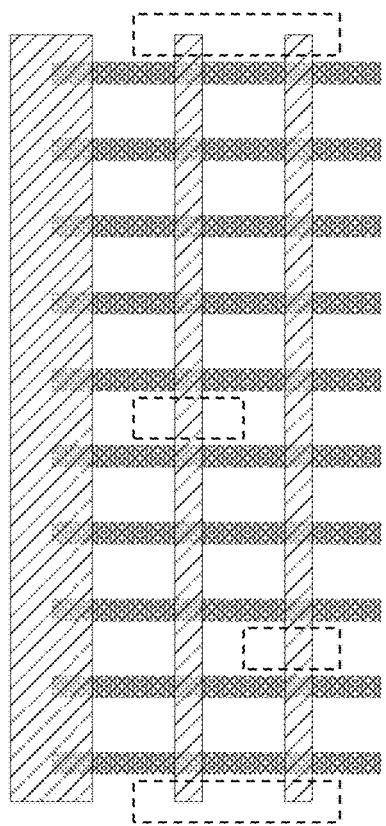
Figure 15C:
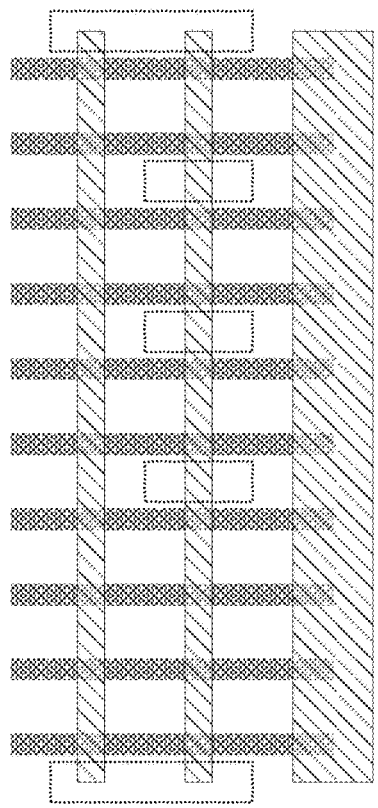

Reference is now made to FIGS. 15A-C, which depict an aoi22x2 cell. This cell implements the logic function NOT(OR(AND(a,b),AND(c,d))), in drive strength 2. This cell is 9 CPP wide.

Figure 16A:
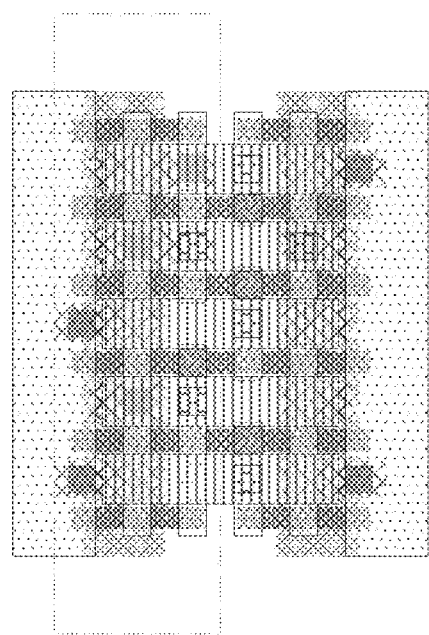
FIGS. 16A-C depict an aoi31x1 cell.
Figure 16B:
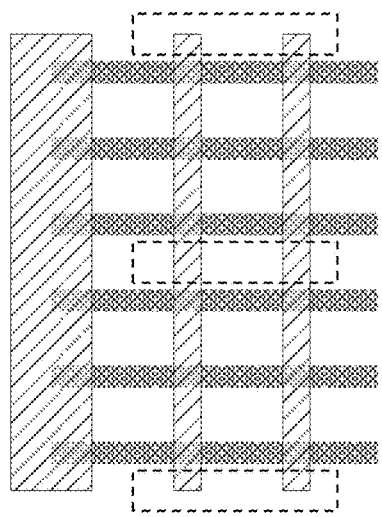
Figure 16C:
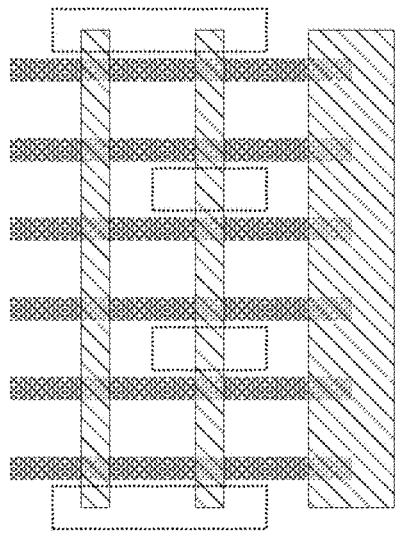

Reference is now made to FIGS. 16A-C, which depict an aoi31x1 cell. This cell implements the logic function NOT(OR(AND(a,b,c),d)), in drive strength 1. This cell is 5 CPP wide.

Figure 17A:
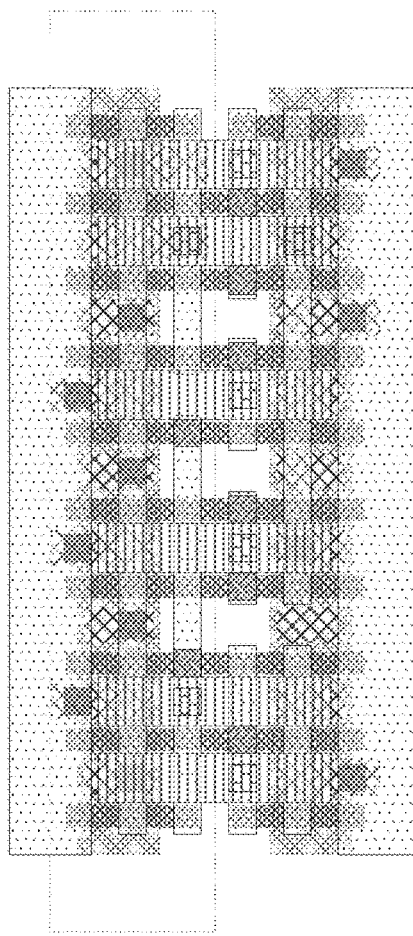
FIGS. 17A-C depict an aoi31x2 cell.
Figure 17B:
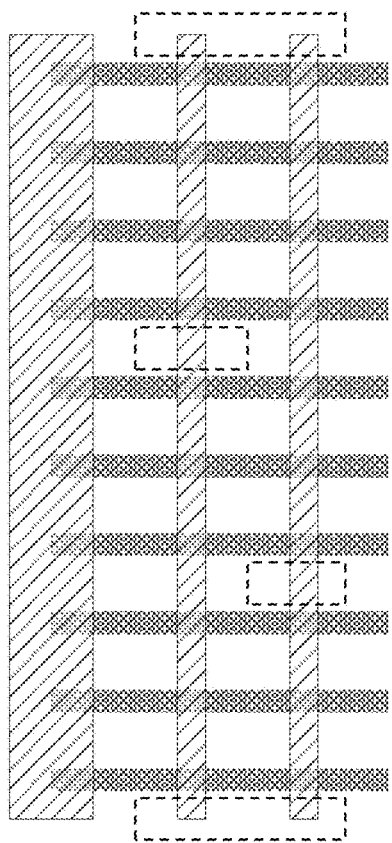
Figure 17C:
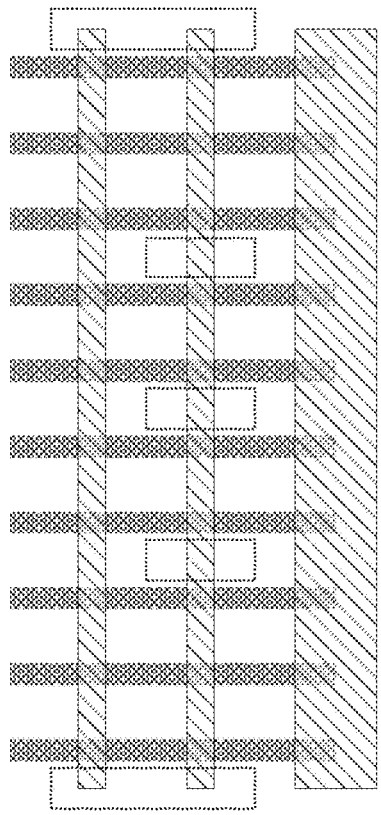

Reference is now made to FIGS. 17A-C, which depict an aoi31x2 cell. This cell implements the logic function NOT(OR(AND(a,b,c),d)), in drive strength 2. This cell is 9 CPP wide.

Figure 18A:
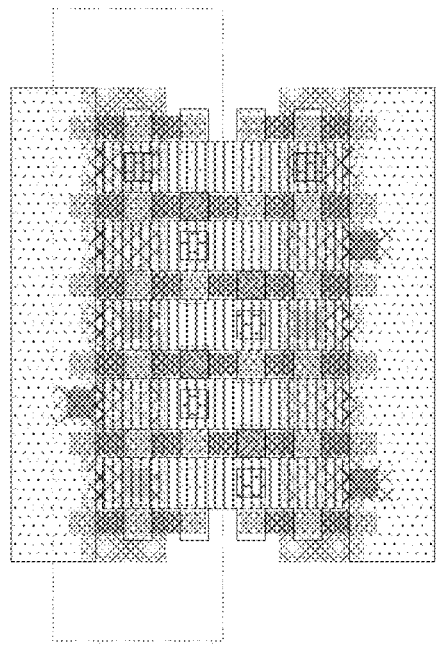
FIGS. 18A-C depict an aoi211x1 cell.
Figure 18B:
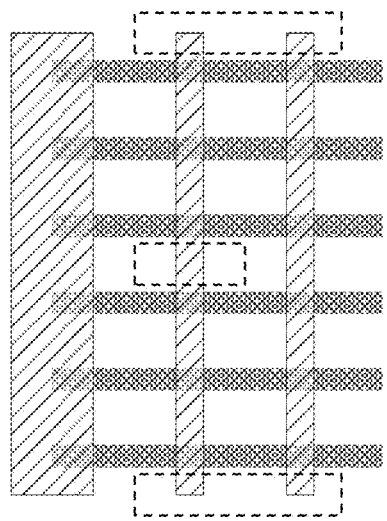
Figure 18C:
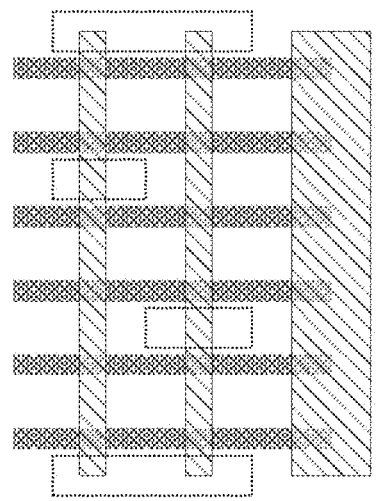

Reference is now made to FIGS. 18A-C, which depict an aoi211x1 cell. This cell implements the logic function NOT(OR(AND(a,b),c,d)), in drive strength 1. This cell is 5 CPP wide.

Figure 19A:
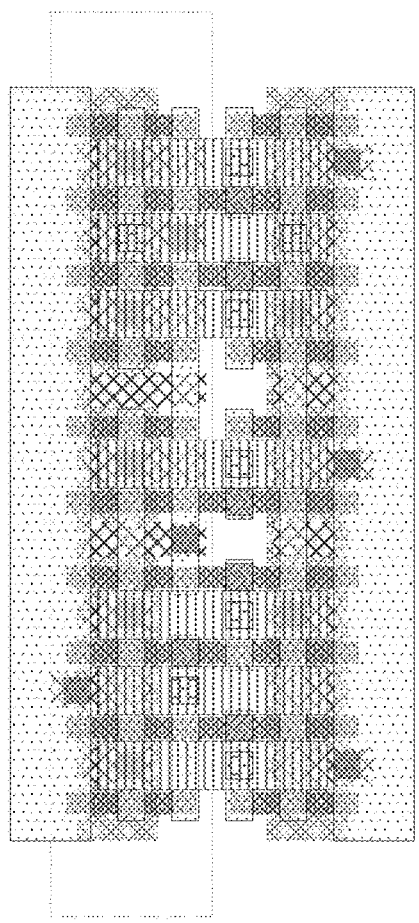
FIGS. 19A-C depict an aoi222x1 cell.
Figure 19B:
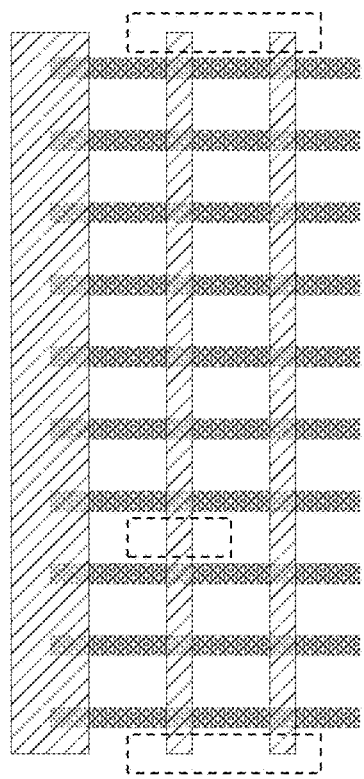
Figure 19C:
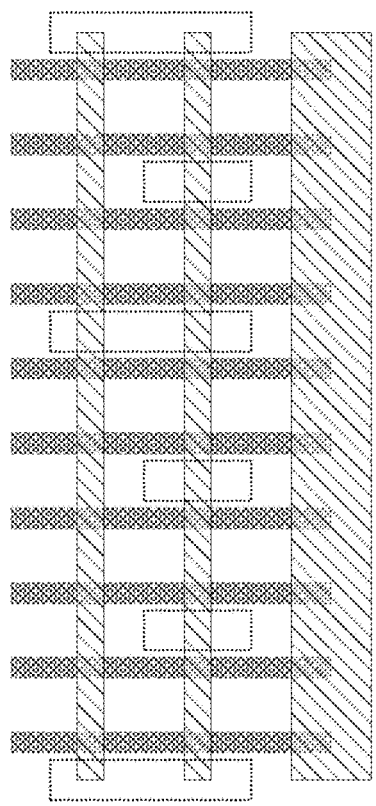

Reference is now made to FIGS. 19A-C, which depict an aoi222x1 cell. This cell implements the logic function NOT(OR(AND(a,b),AND(c,d),AND(e,f))), in drive strength 1. This cell is 9 CPP wide.

Figure 20A:
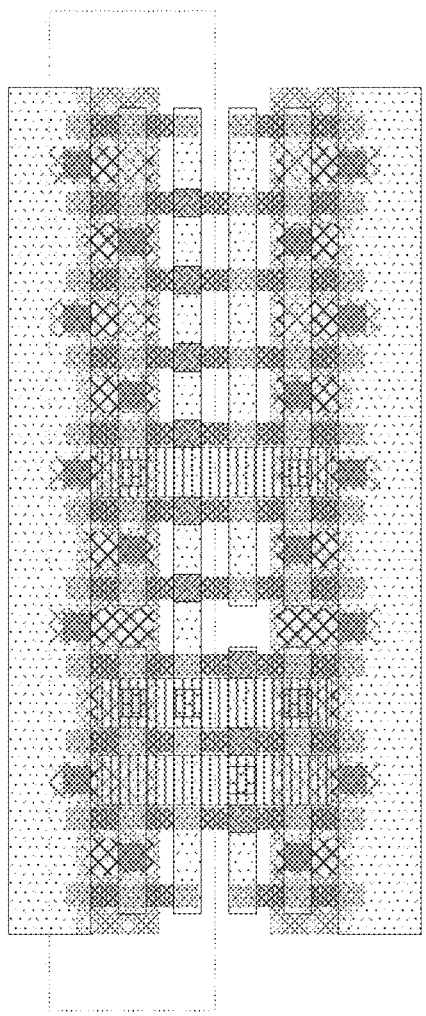
FIGS. 20A-C depict an bufhx6 cell.
Figure 20B:
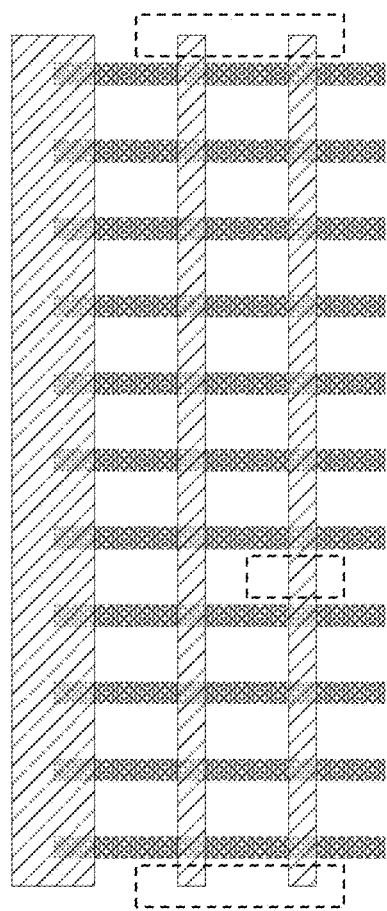
Figure 20C:
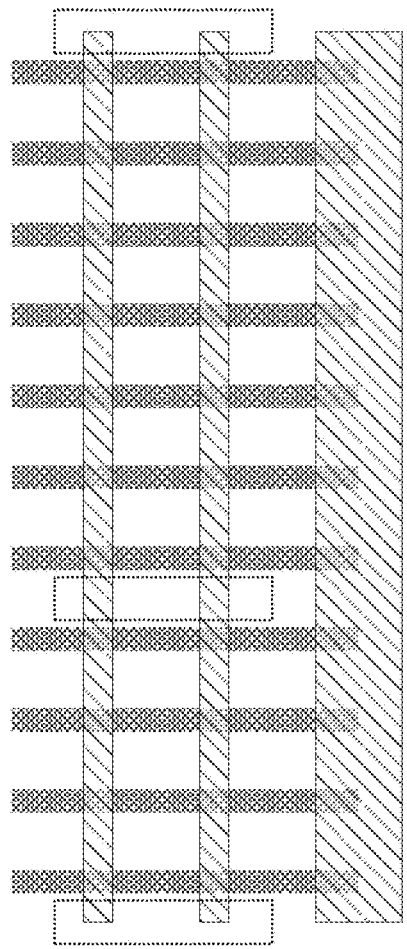

Reference is now made to FIGS. 20A-C, which depict an bufhx6 cell. This cell implements the logic function of a buffer, in drive strength 6. This cell is 10 CPP wide.

Figure 21A:
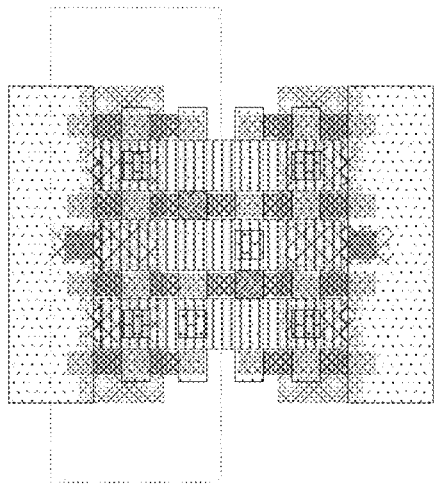
FIGS. 21A-C depict an bufx1 cell.
Figure 21B:
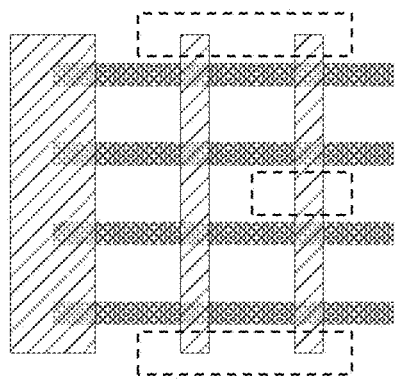
Figure 21C:
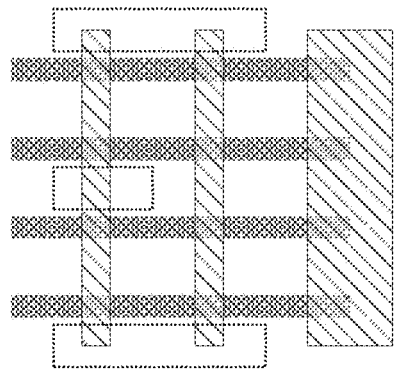

Reference is now made to FIGS. 21A-C, which depict an bufx1 cell. This cell implements the logic function of a buffer, in drive strength 1. This cell is 3 CPP wide.

Figure 22A:
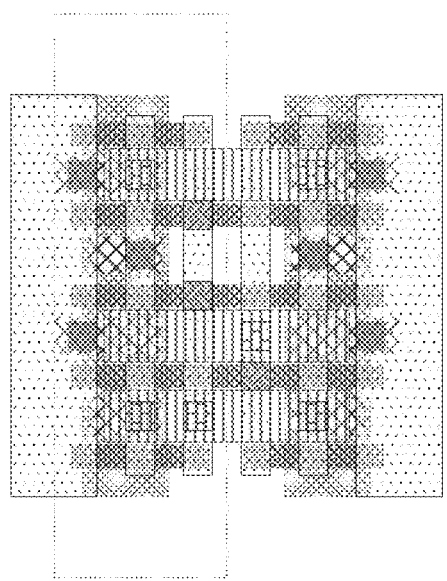
FIGS. 22A-C depict an bufx2 cell.
Figure 22B:
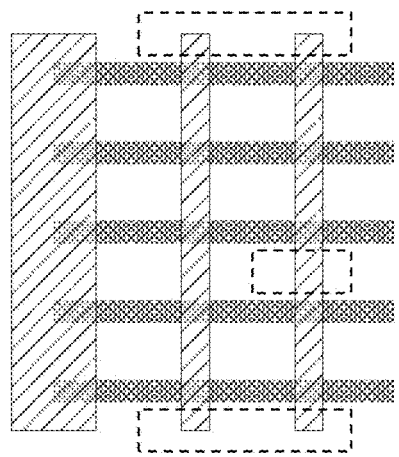
Figure 22C:
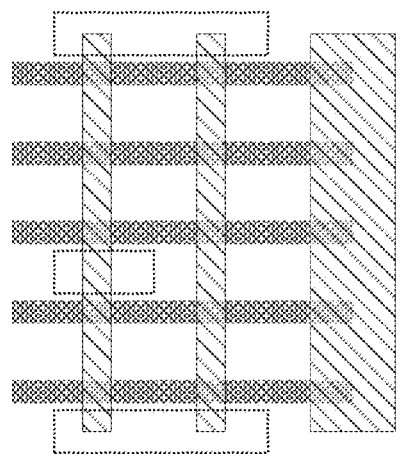

Reference is now made to FIGS. 22A-C, which depict an bufx2 cell. This cell implements the logic function of a buffer, in drive strength 2. This cell is 4 CPP wide.

Figure 23A:
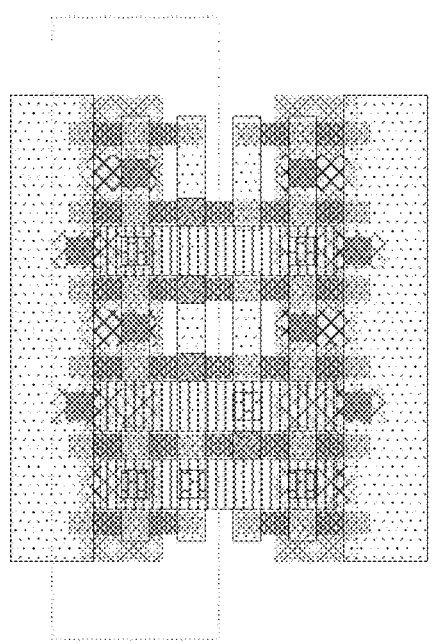
FIGS. 23A-C depict an bufx3 cell.
Figure 23B:
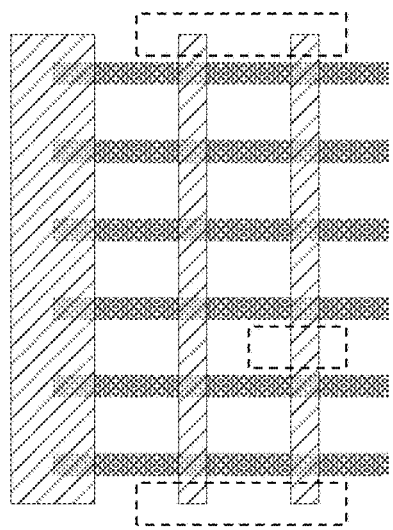
Figure 23C:
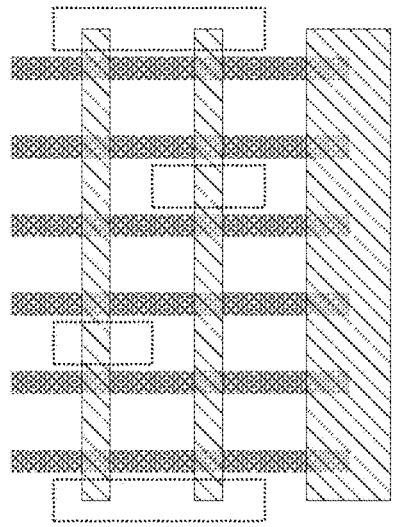

Reference is now made to FIGS. 23A-C, which depict an bufx3 cell. This cell implements the logic function of a buffer, in drive strength 3. This cell is 5 CPP wide.

Figure 24A:
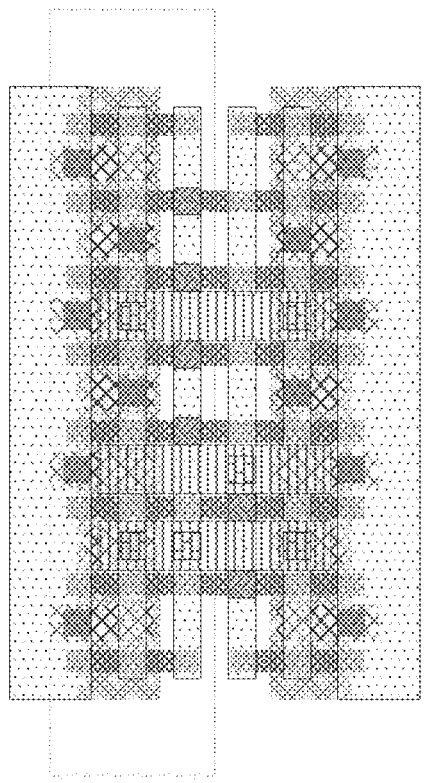
FIGS. 24A-C depict an bufx4 cell.
Figure 24B:
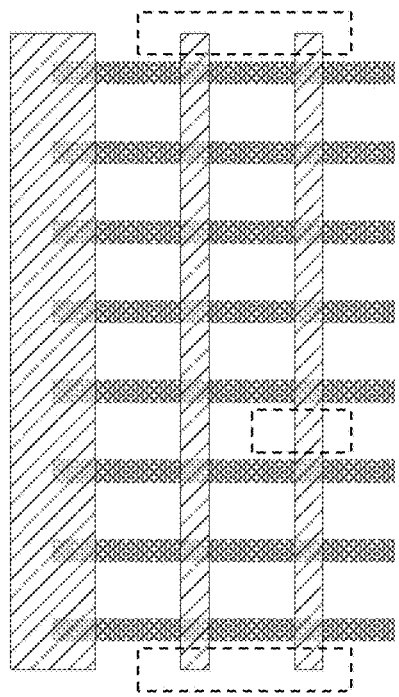
Figure 24C:
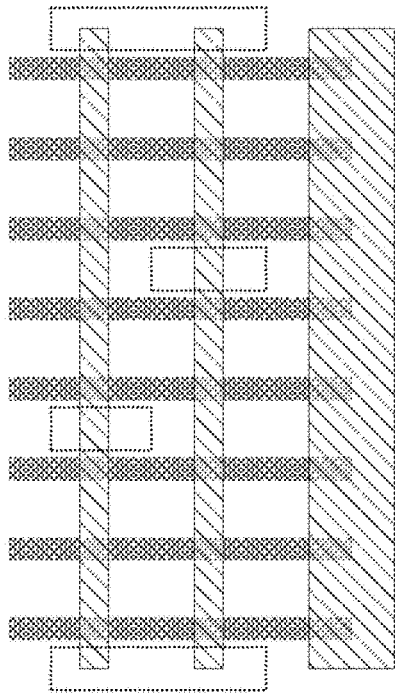

Reference is now made to FIGS. 24A-C, which depict an bufx4 cell. This cell implements the logic function of a buffer, in drive strength 4. This cell is 7 CPP wide.

Figure 25A:
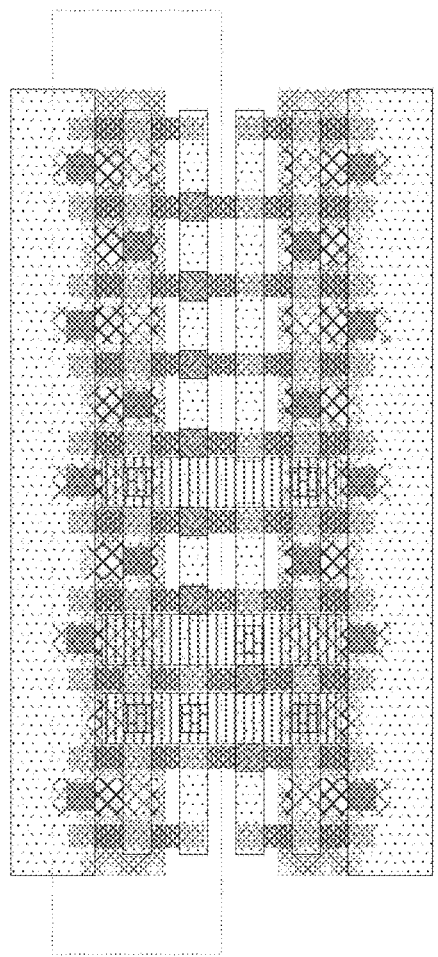
FIGS. 25A-C depict an bufx6 cell.
Figure 25B:
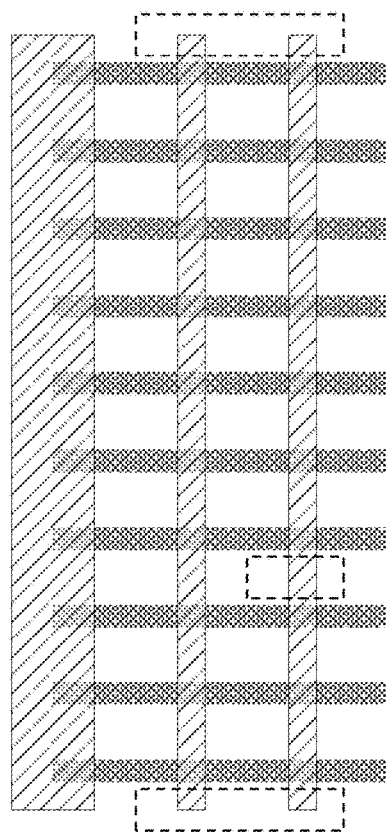
Figure 25C:
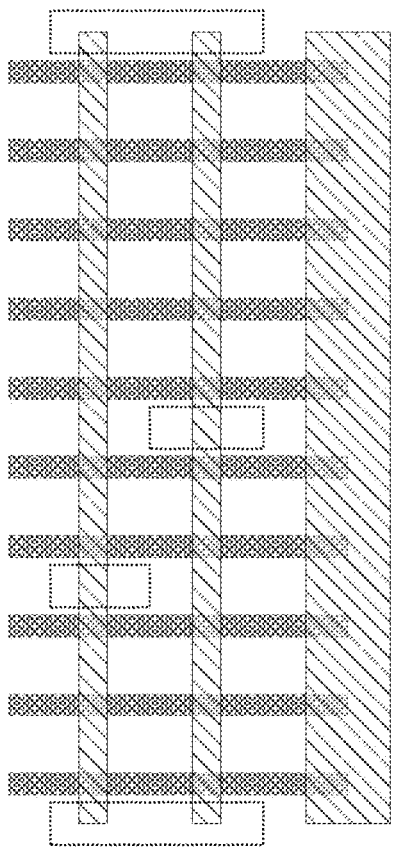

Reference is now made to FIGS. 25A-C, which depict an bufx6 cell. This cell implements the logic function of a buffer, in drive strength 6. This cell is 9 CPP wide.

Figure 26A:
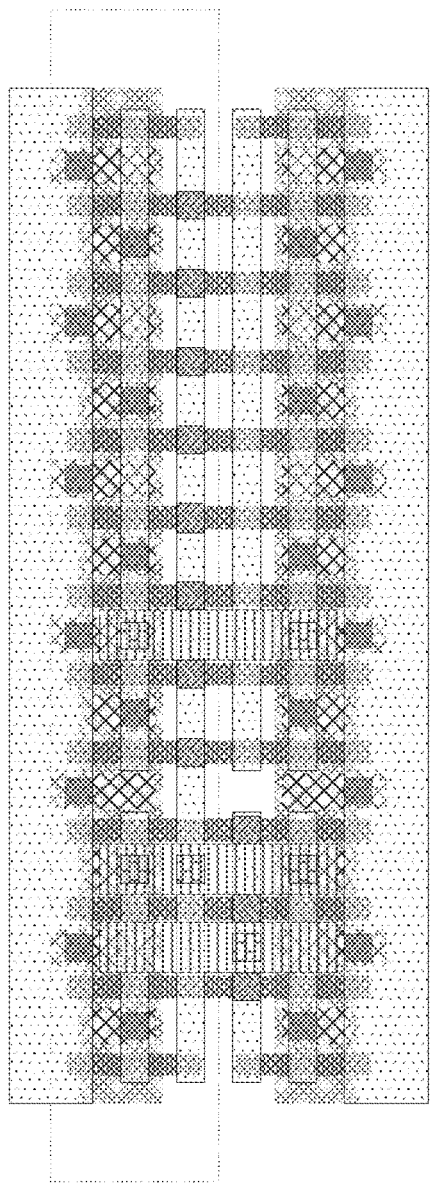
FIGS. 26A-C depict an bufx8 cell.
Figure 26B:
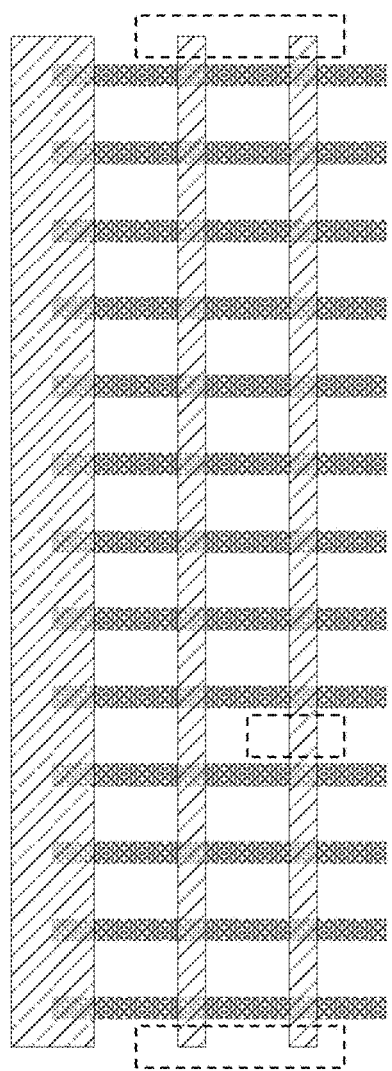
Figure 26C:
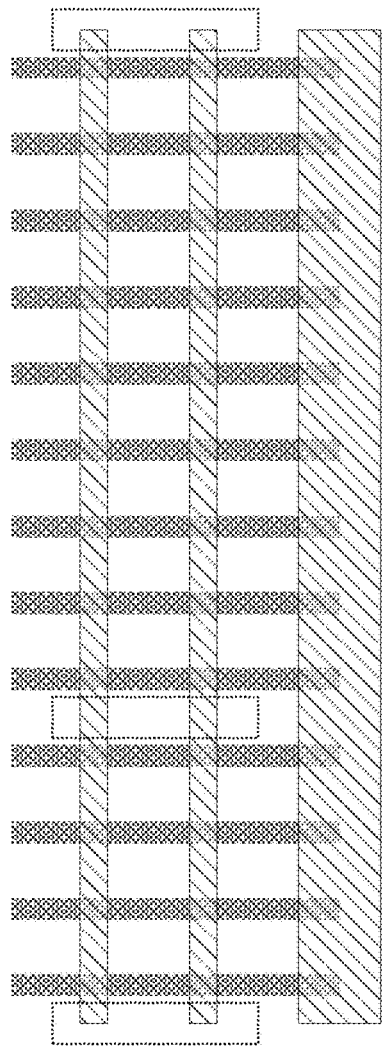

Reference is now made to FIGS. 26A-C, which depict an bufx8 cell. This cell implements the logic function of a buffer, in drive strength 8. This cell is 12 CPP wide.

Figure 27A:
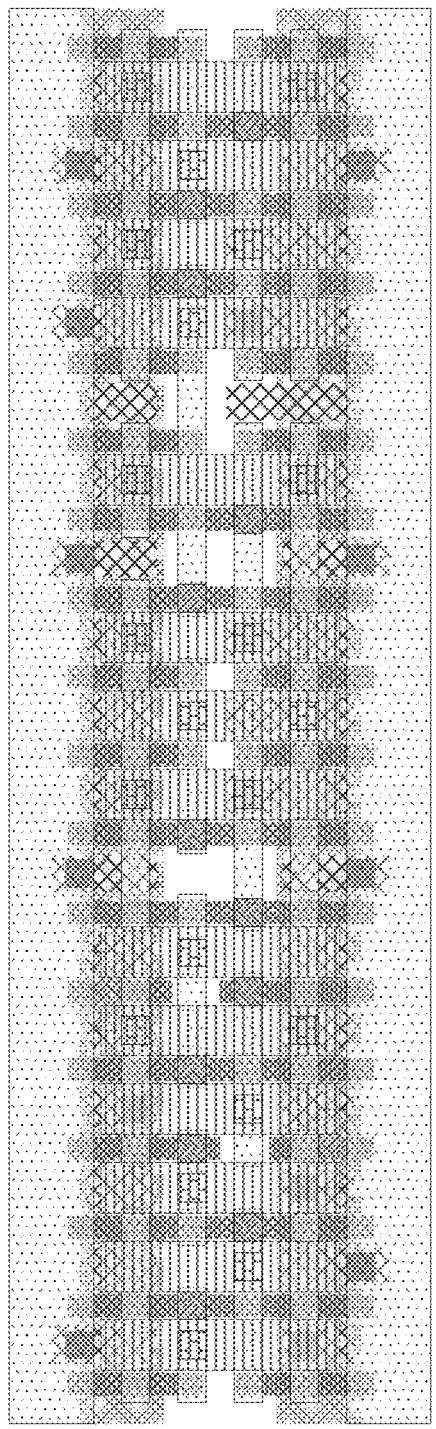
FIGS. 27A-C depict an ckor21ban2x1 cell.
Figure 27B:
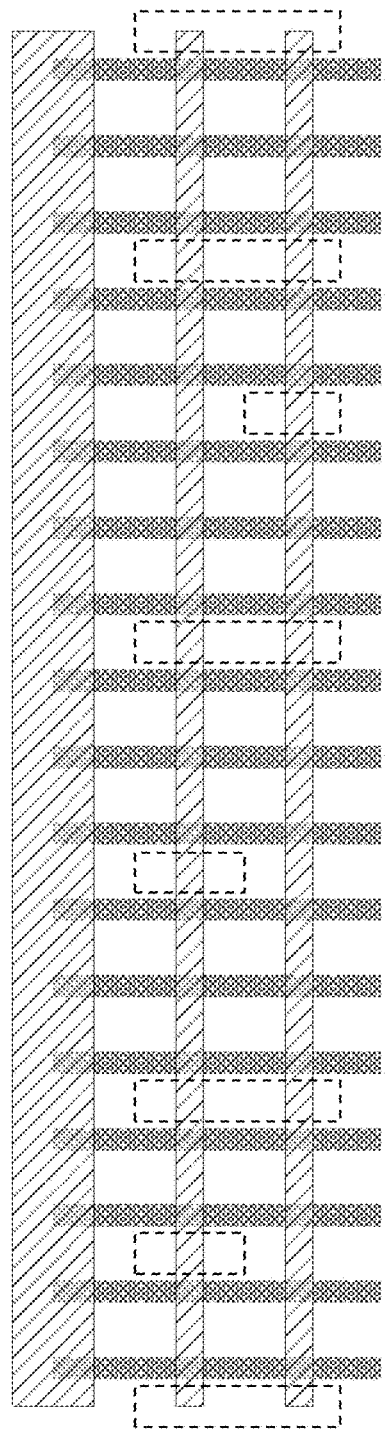
Figure 27C:
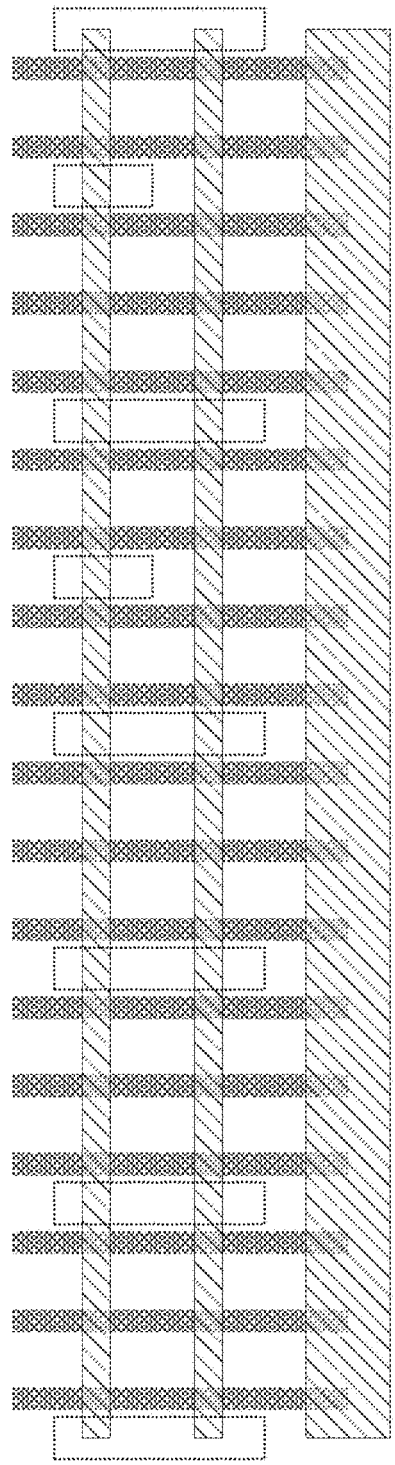

Reference is now made to FIGS. 27A-C, which depict an ckor21ban2x1 cell. This cell implements the logic function of a clock-gating latch, in drive strength 1. This cell is 17 CPP wide.

Figure 28A:
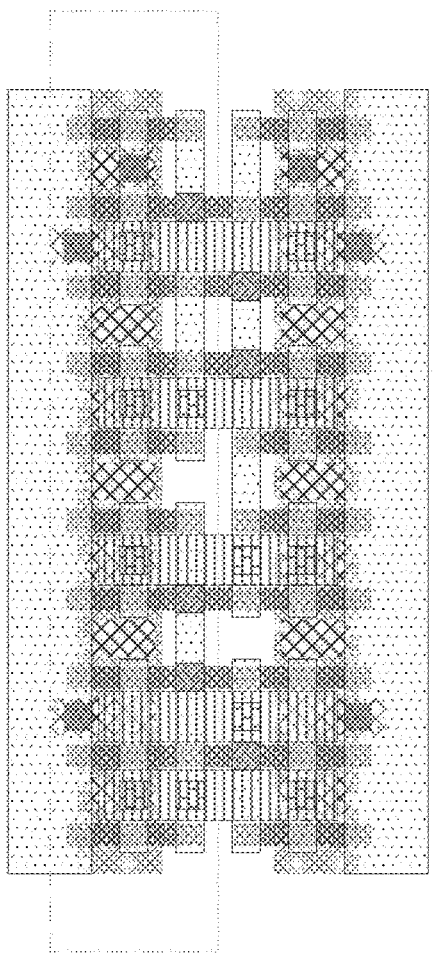
FIGS. 28A-C depict an dlyx1 cell.
Figure 28B:
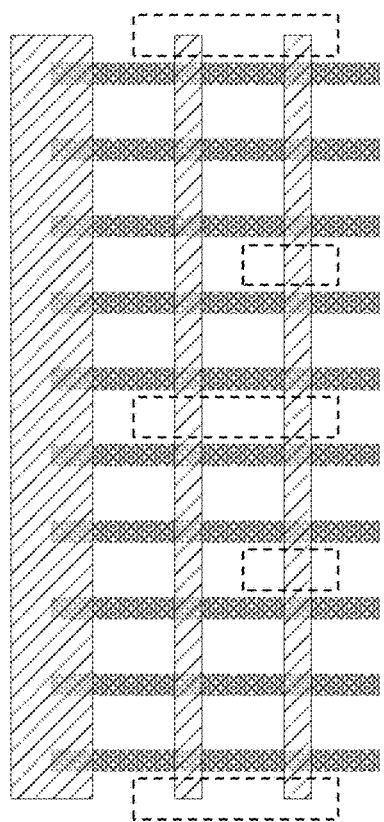
Figure 28C:
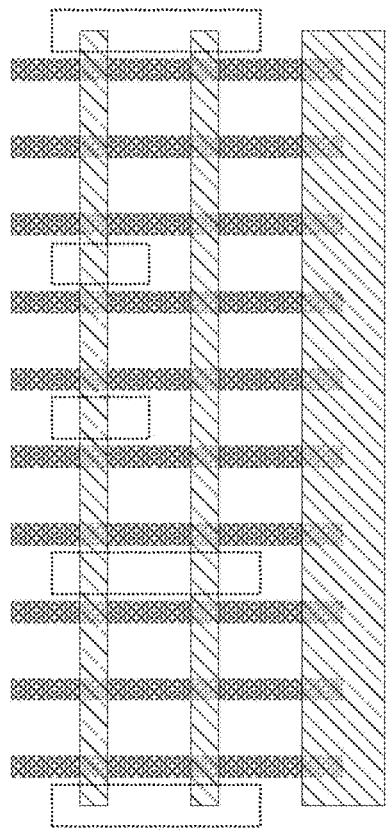

Reference is now made to FIGS. 28A-C, which depict an dlyx1 cell. This cell implements the logic function of a delay gate, in drive strength 1. This cell is 9 CPP wide.

Figure 29A:
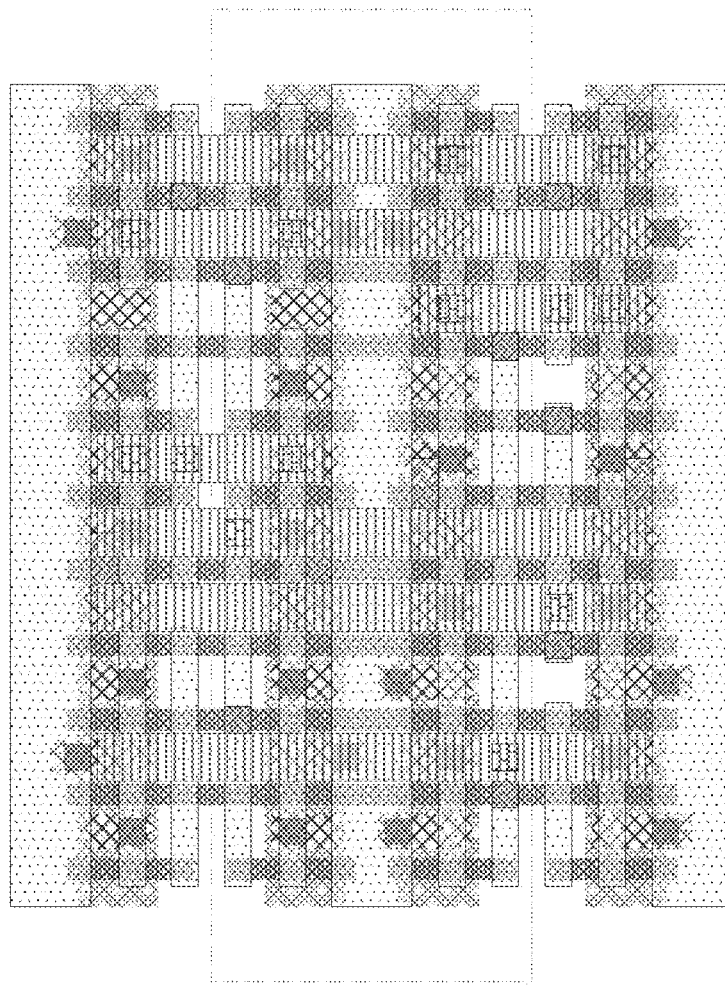
FIGS. 29A-C depict an fax1 cell.
Figure 29B:
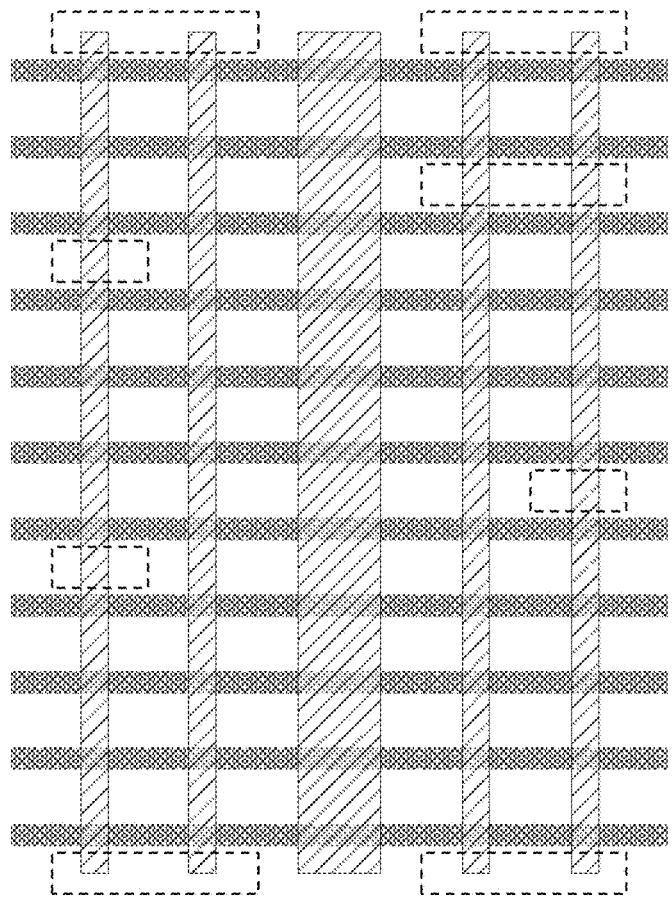
Figure 29C:
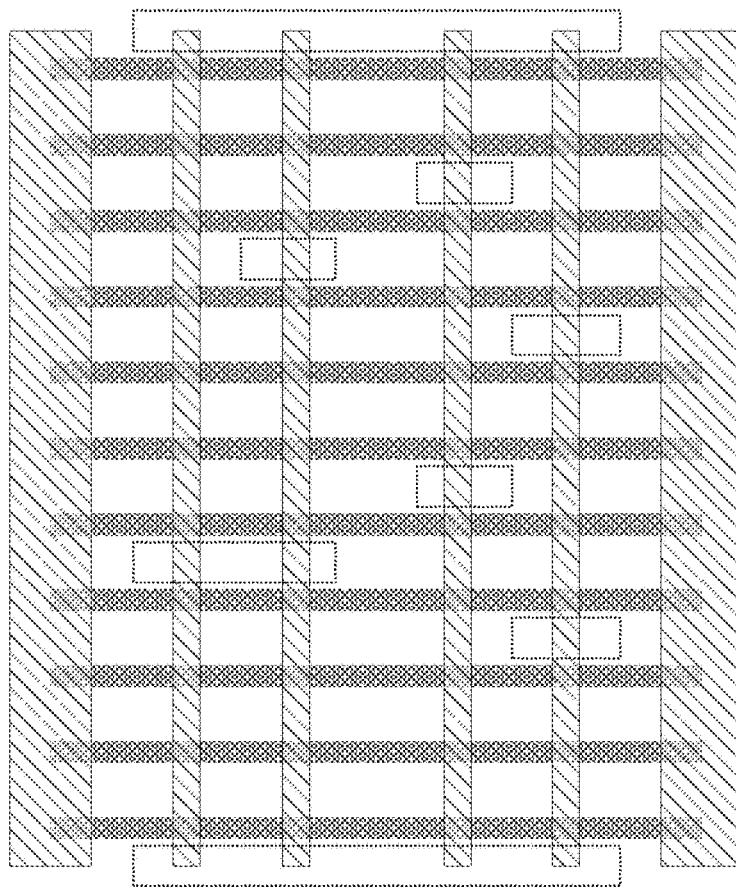

Reference is now made to FIGS. 29A-C, which depict an fax1 cell. This cell implements the logic function of a full adder, in drive strength 1. This double-height cell is 10 CPP wide.

Figure 30A:
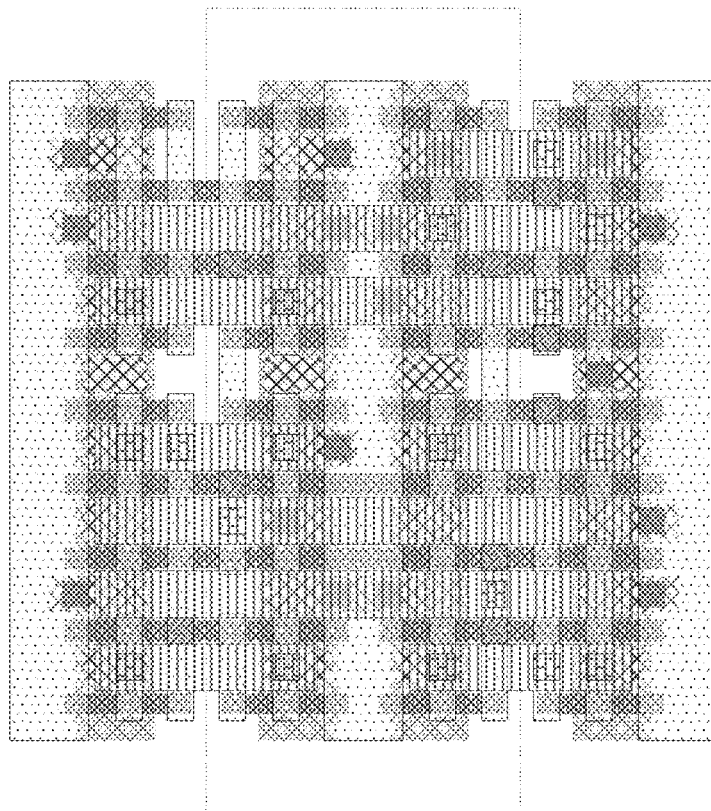
FIGS. 30A-C depict an hax1 cell.
Figure 30B:
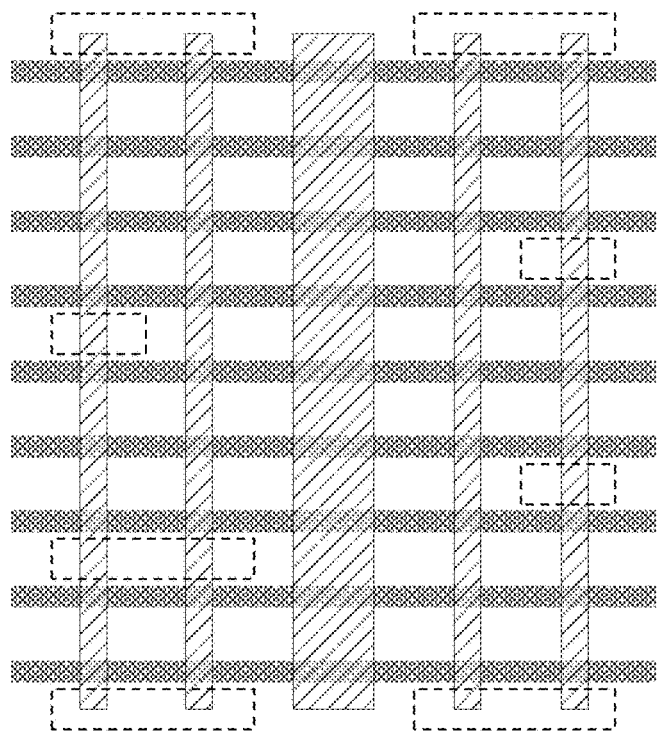
Figure 30C:
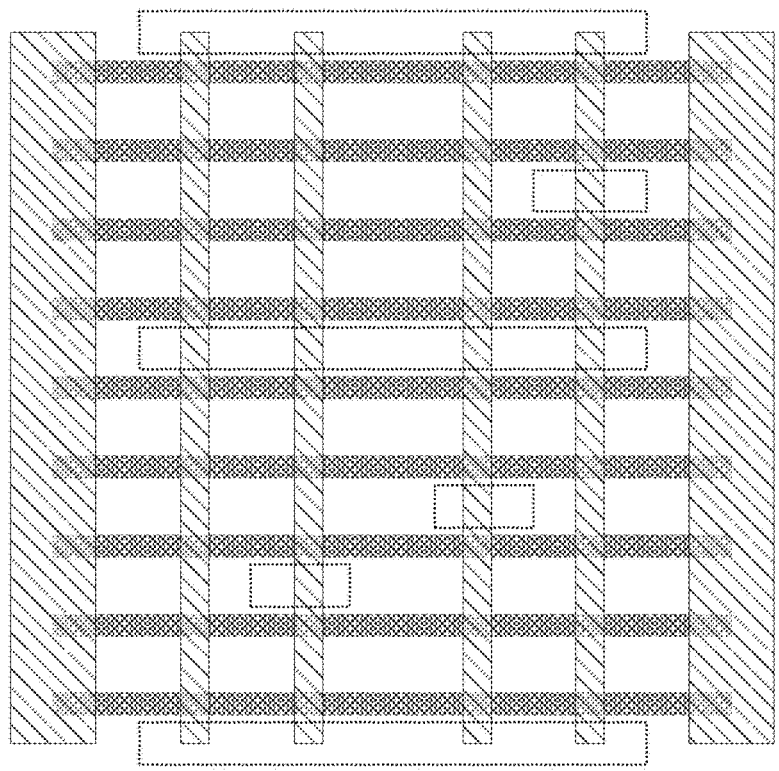

Reference is now made to FIGS. 30A-C, which depict an hax1 cell. This cell implements the logic function of a half adder, in drive strength 1. This double-height cell is 8 CPP wide.

Figure 31A:
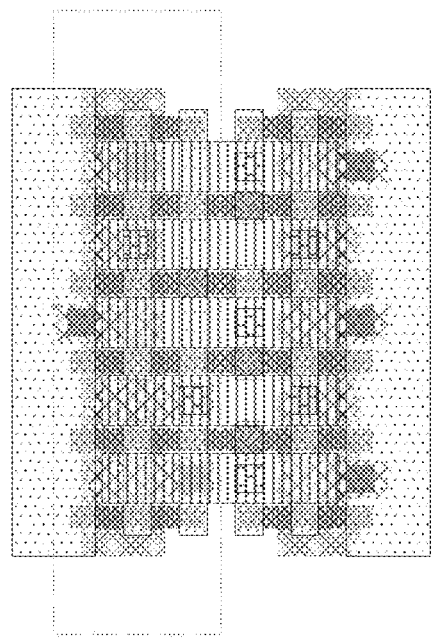
FIGS. 31A-C depict an iaoi21x1 cell.
Figure 31B:
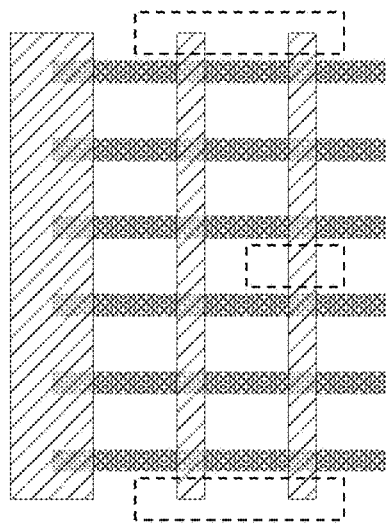
Figure 31C:
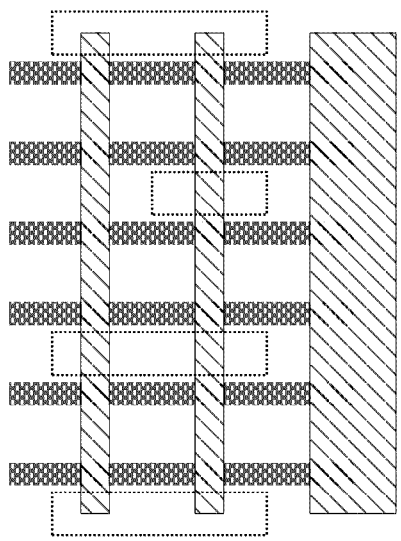

Reference is now made to FIGS. 31A-C, which depict an iaoi21x1 cell. This cell implements the logic function NOT(OR(AND(a,b),c)), with one of the inputs inverted, in drive strength 1. This cell is 5 CPP wide.

Figure 32A:
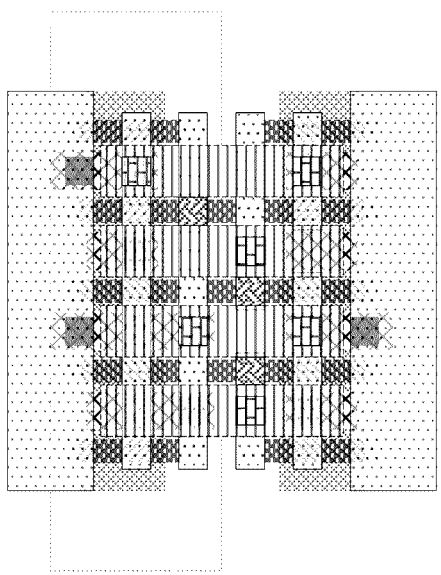
FIGS. 32A-C depict an ind2x1 cell.
Figure 32B:
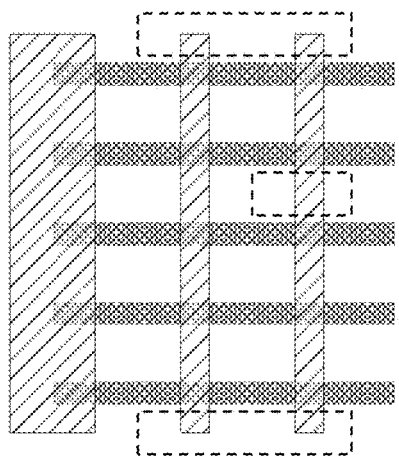
Figure 32C:
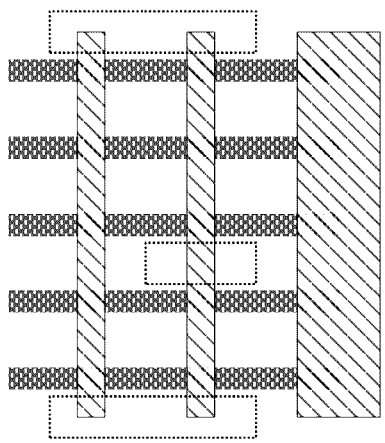

Reference is now made to FIGS. 32A-C, which depict an ind2x1 cell. This cell implements the logic function of a 2-input NAND, with one of the inputs inverted, in drive strength 1. This cell is 4 CPP wide.

Figure 33A:
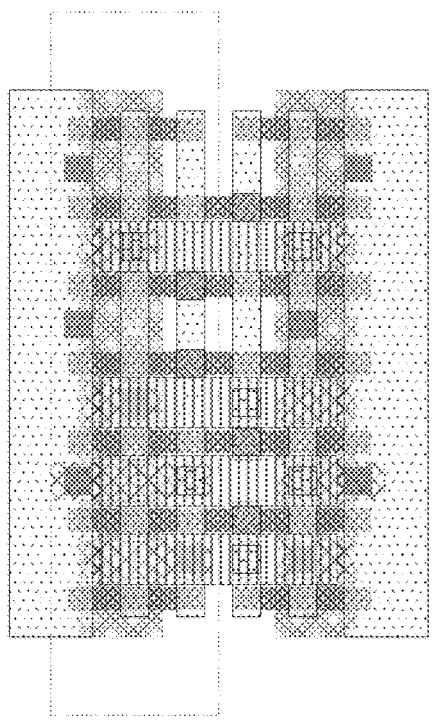
FIGS. 33A-C depict an ind2x2 cell.
Figure 33B:
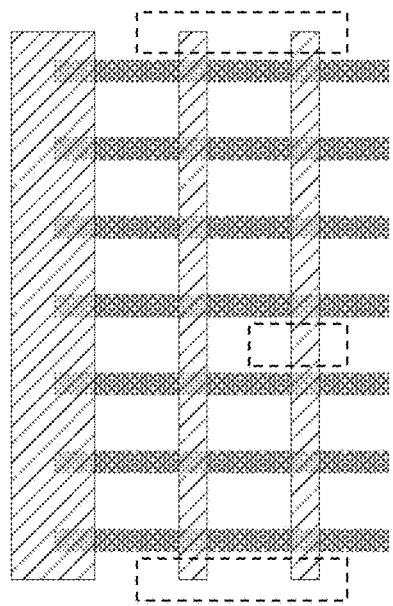
Figure 33C:
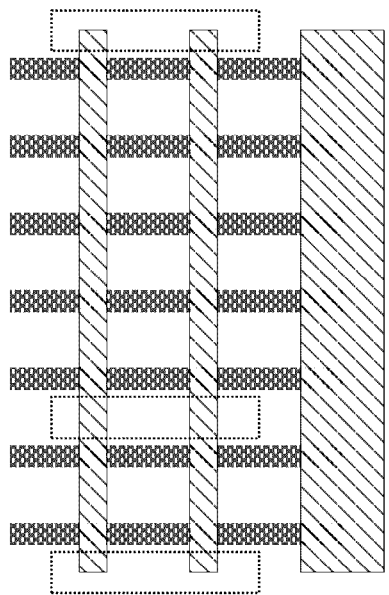

Reference is now made to FIGS. 33A-C, which depict an ind2x2 cell. This cell implements the logic function of a 2-input NAND, with one of the inputs inverted, in drive strength 2. This cell is 6 CPP wide.

Figure 34A:
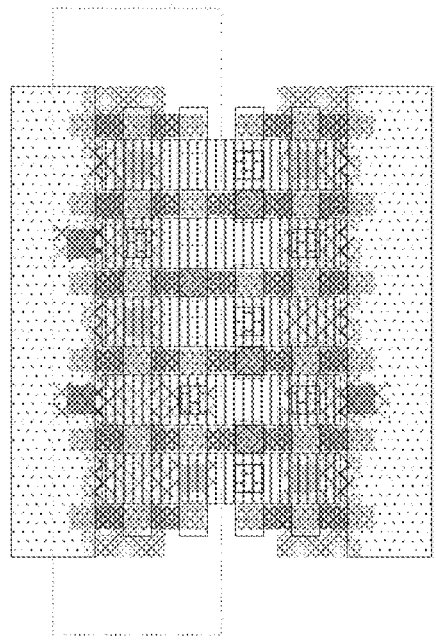
FIGS. 34A-C depict an ind3x1 cell.
Figure 34B:
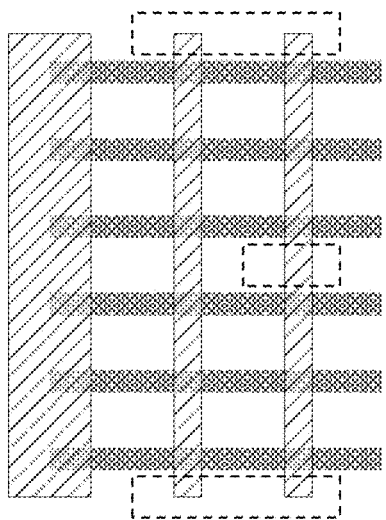
Figure 34C:
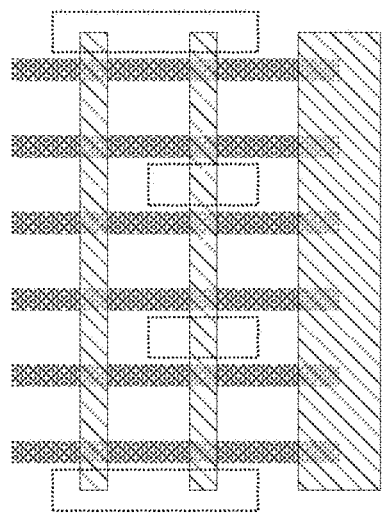

Reference is now made to FIGS. 34A-C, which depict an ind3x1 cell. This cell implements the logic function of a 3-input NAND, with one of the inputs inverted, in drive strength 1. This cell is 5 CPP wide.

Figure 35A:
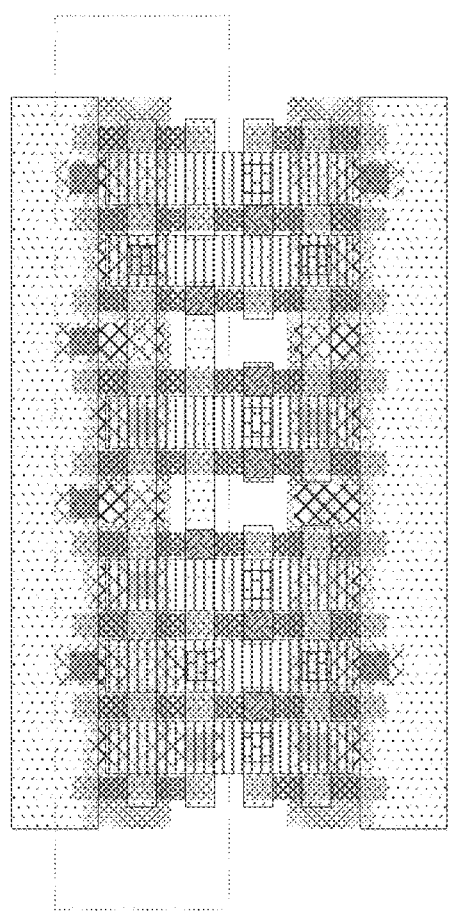
FIGS. 35A-C depict an ind3x2 cell.
Figure 35B:
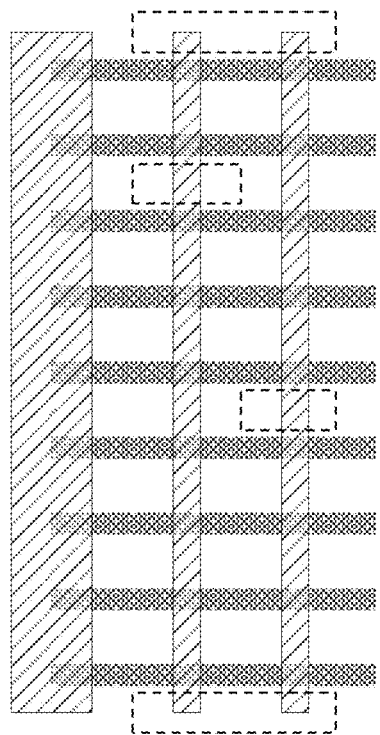
Figure 35C:
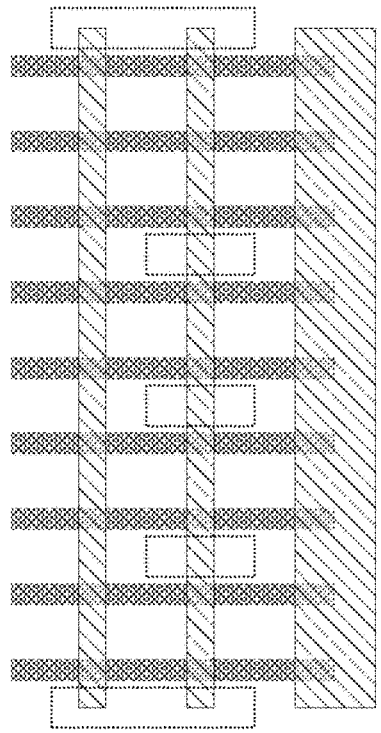

Reference is now made to FIGS. 35A-C, which depict an ind3x2 cell. This cell implements the logic function of a 3-input NAND, with one of the inputs inverted, in drive strength 2. This cell is 8 CPP wide.

Figure 36A:
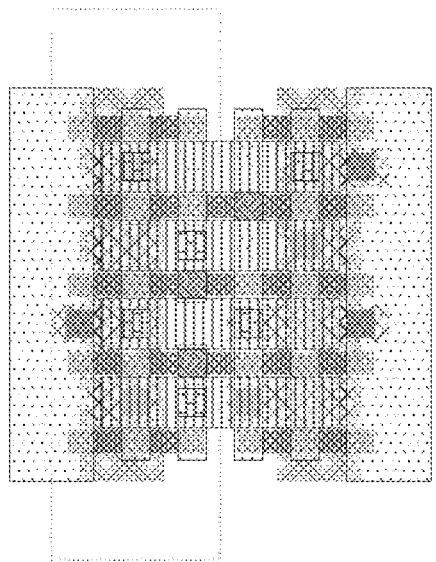
FIGS. 36A-C depict an inr2x1 cell.
Figure 36B:
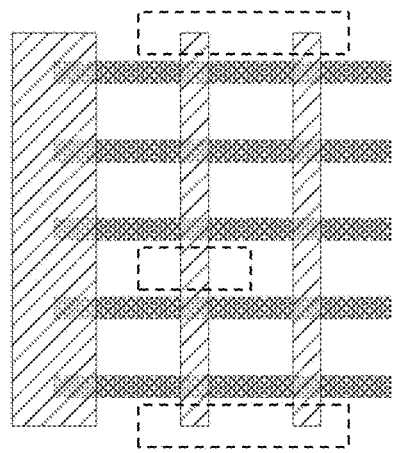
Figure 36C:
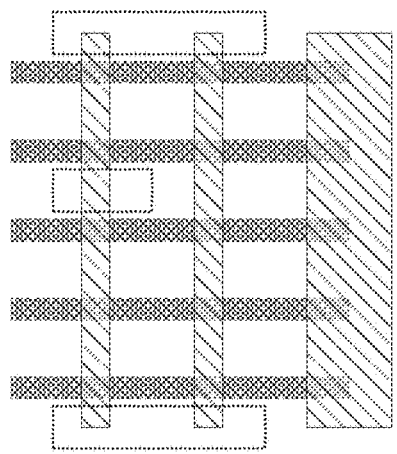

Reference is now made to FIGS. 36A-C, which depict an inr2x1 cell. This cell implements the logic function of a 2-input NOR, with one of the inputs inverted, in drive strength 1. This cell is 4 CPP wide.

Figure 37A:
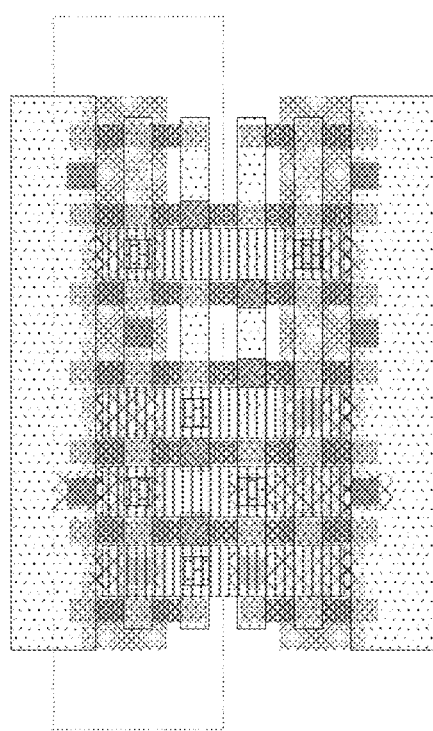
Figure 37B:
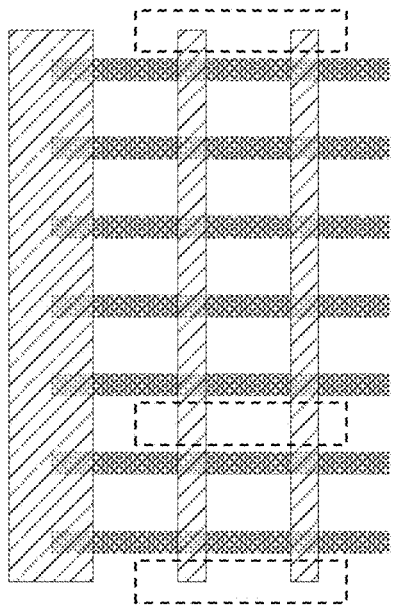

Reference is now made to FIGS. 37A-C, which depict an inr2x2 cell. This cell implements the logic function of a 2-input NOR, with one of the inputs inverted, in drive strength 2. This cell is 6 CPP wide.

Figure 38A:
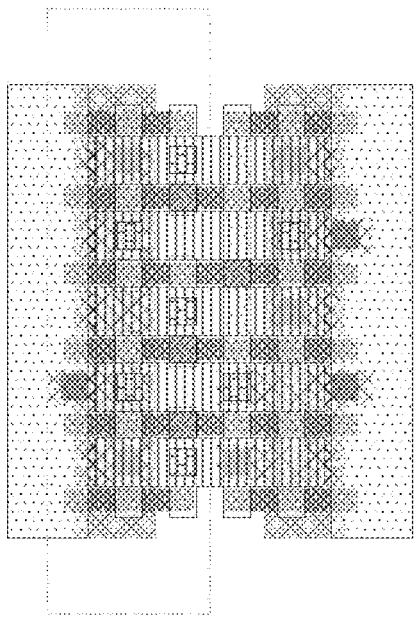
FIGS. 38A-C depict an inr3x1 cell.
Figure 38B:
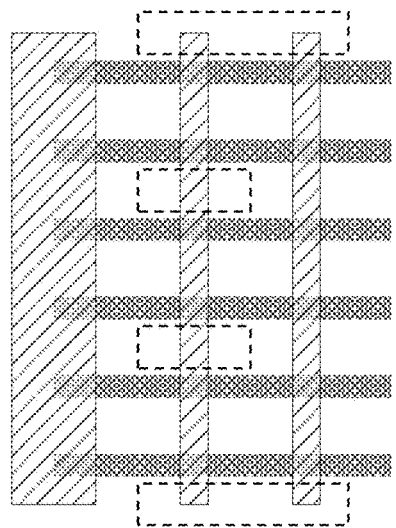
Figure 38C:
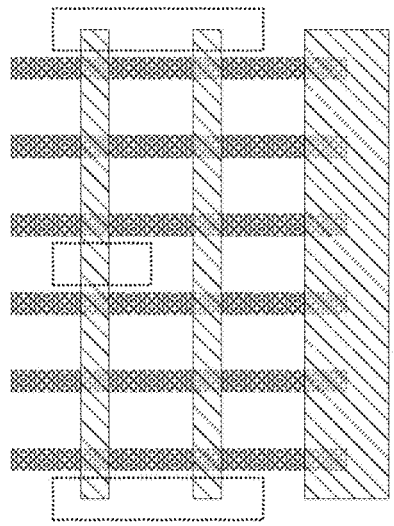

Reference is now made to FIGS. 38A-C, which depict an inr3x1 cell. This cell implements the logic function of a 3-input NOR, with one of the inputs inverted, in drive strength 1. This cell is 5 CPP wide.

Figure 39A:
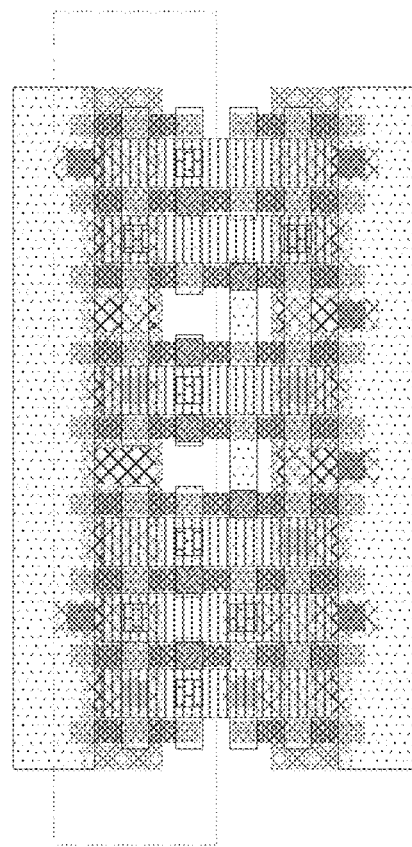
FIGS. 39A-C depict an inr3x2 cell.
Figure 39B:
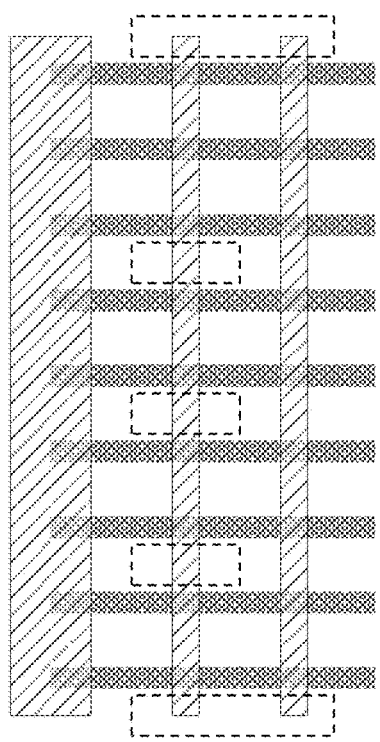
Figure 39C:
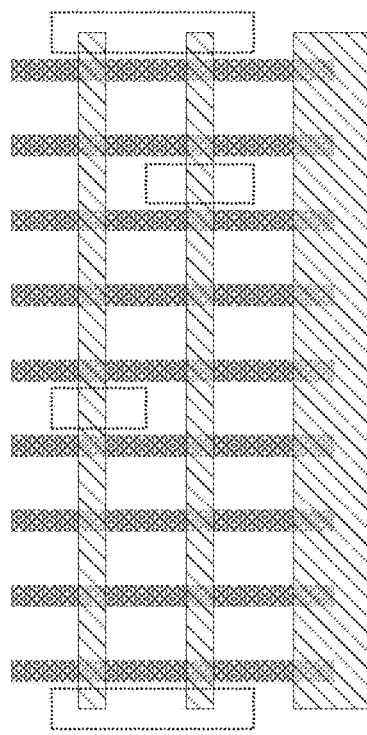

Reference is now made to FIGS. 39A-C, which depict an inr3x2 cell. This cell implements the logic function of a 3-input NOR, with one of the inputs inverted, in drive strength 2. This cell is 8 CPP wide.

Figure 40A:
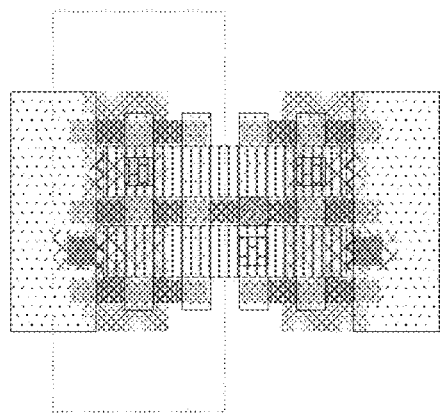
FIGS. 40A-C depict an invx1 cell.
Figure 40B:
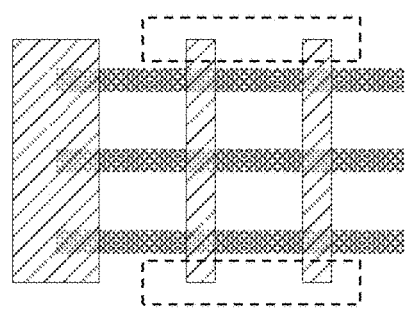
Figure 40C:
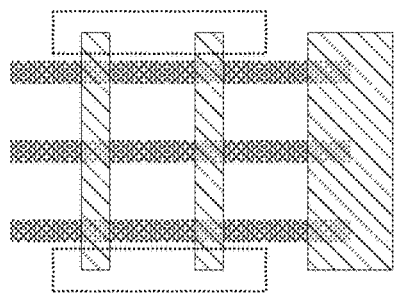

Reference is now made to FIGS. 40A-C, which depict an invx1 cell. This cell implements the logic function of an inverter, in drive strength 1. This cell is 2 CPP wide.

Figure 41A:
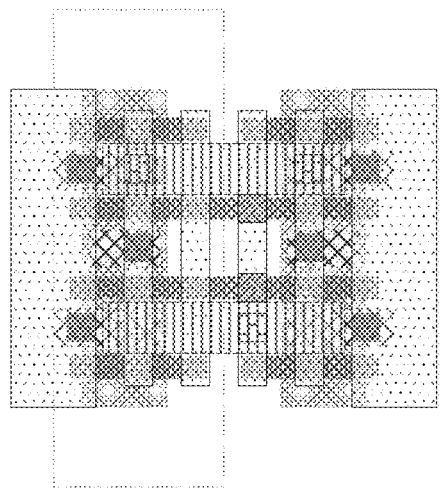
FIGS. 41A-C depict an invx2 cell.
Figure 41B:
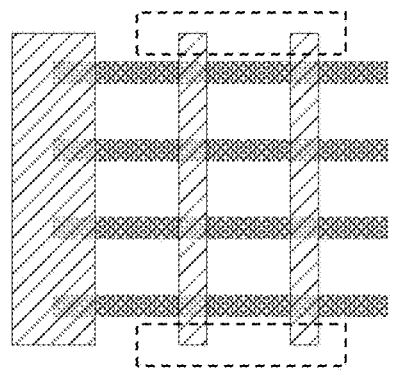
Figure 41C:
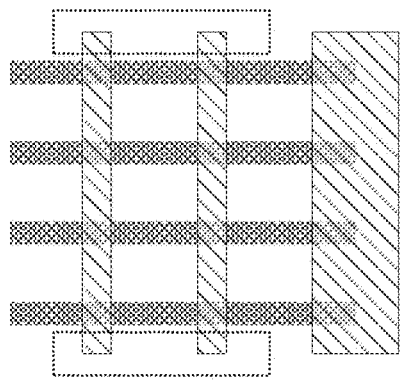

Reference is now made to FIGS. 41A-C, which depict an invx2 cell. This cell implements the logic function of an inverter, in drive strength 2. This cell is 3 CPP wide.

Figure 42A:
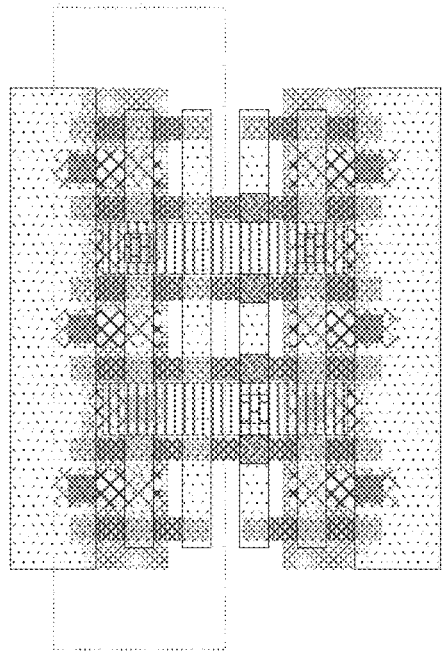
FIGS. 42A-C depict an invx4 cell.
Figure 42B:
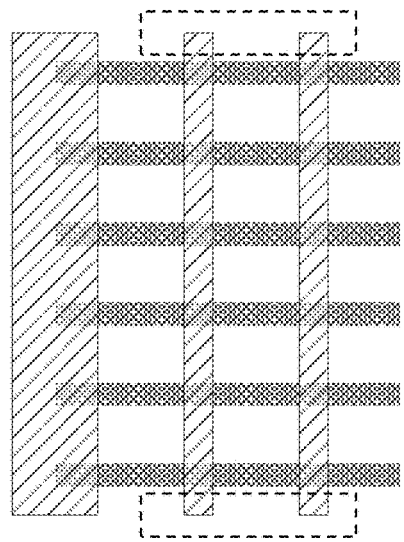
Figure 42C:
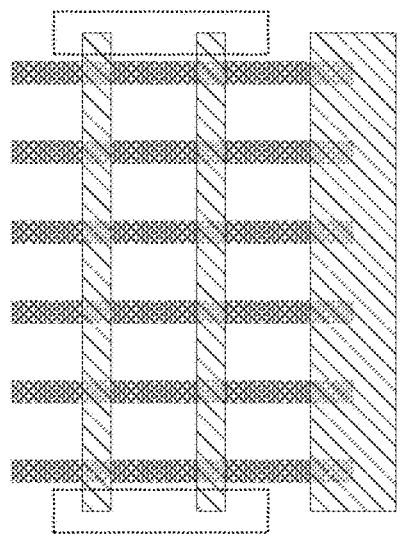

Reference is now made to FIGS. 42A-C, which depict an invx4 cell. This cell implements the logic function of an inverter, in drive strength 4. This cell is 5 CPP wide.

Figure 43A:
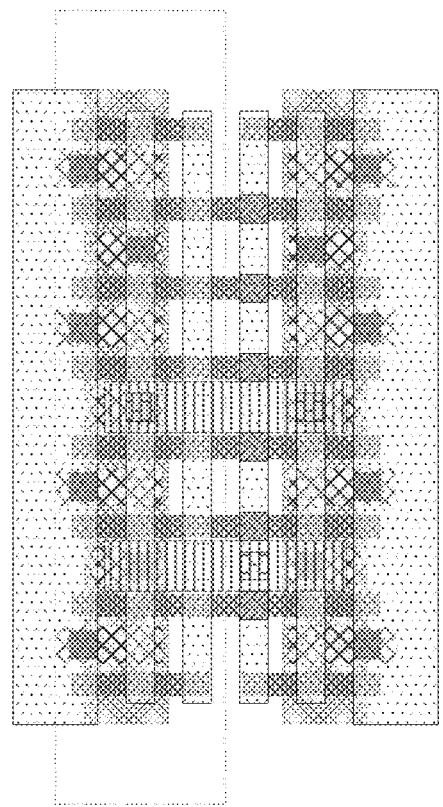
FIGS. 43A-C depict an invx6 cell.
Figure 43B:
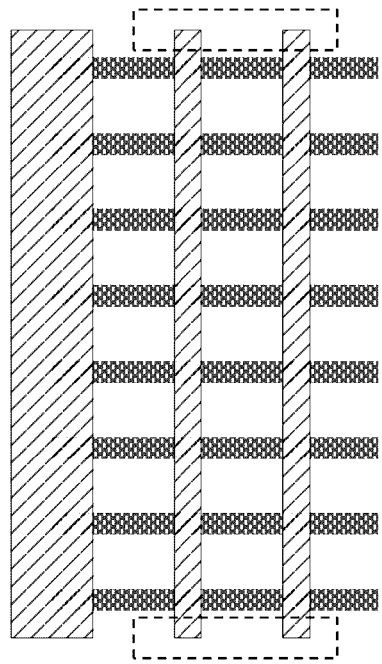
Figure 43C:
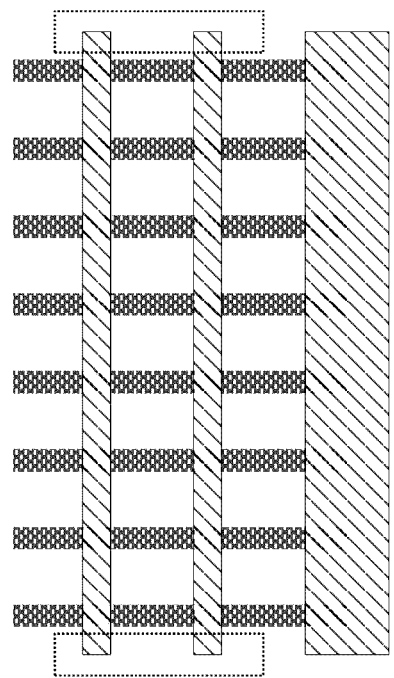

Reference is now made to FIGS. 43A-C, which depict an invx6 cell. This cell implements the logic function of an inverter, in drive strength 6. This cell is 7 CPP wide.

Figure 44A:
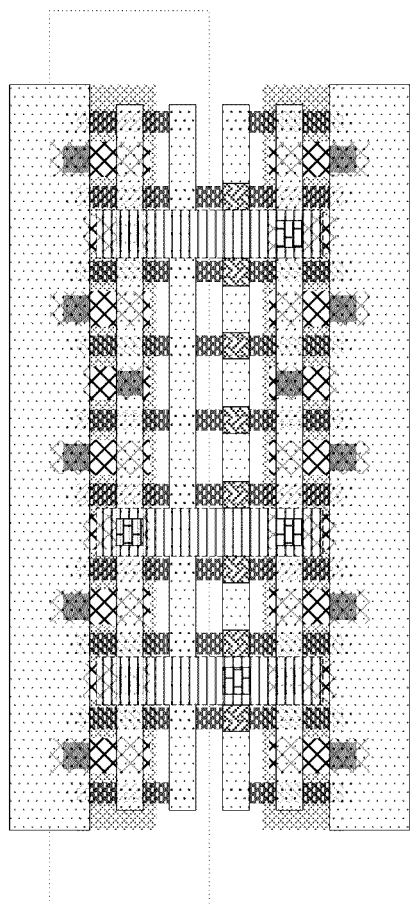
FIGS. 44A-C depict an invx8 cell.
Figure 44B:
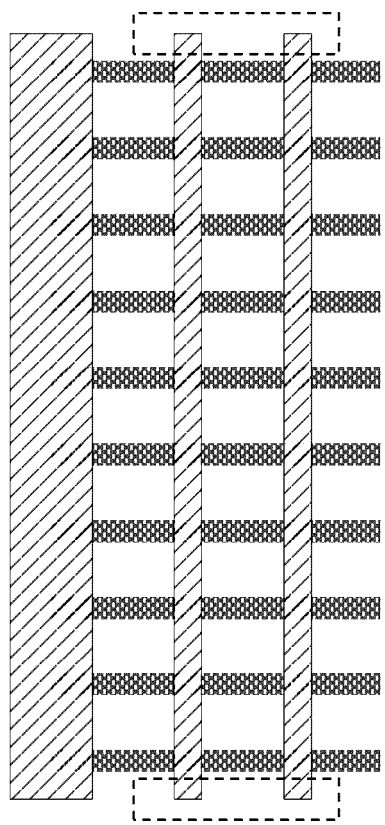
Figure 44C:
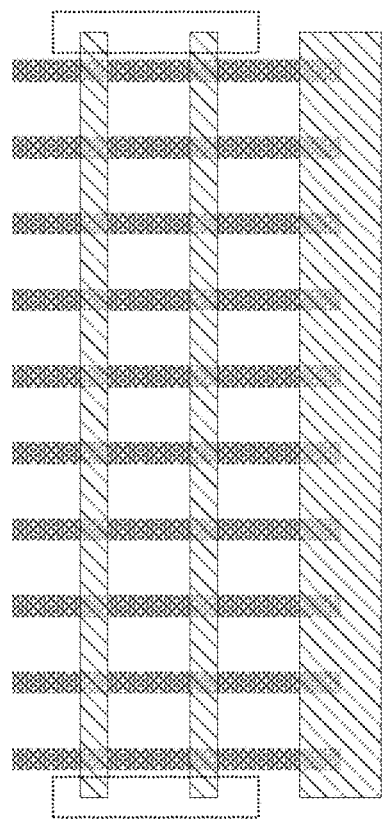

Reference is now made to FIGS. 44A-C, which depict an invx8 cell. This cell implements the logic function of an inverter, in drive strength 8. This cell is 9 CPP wide.

Figure 45A:
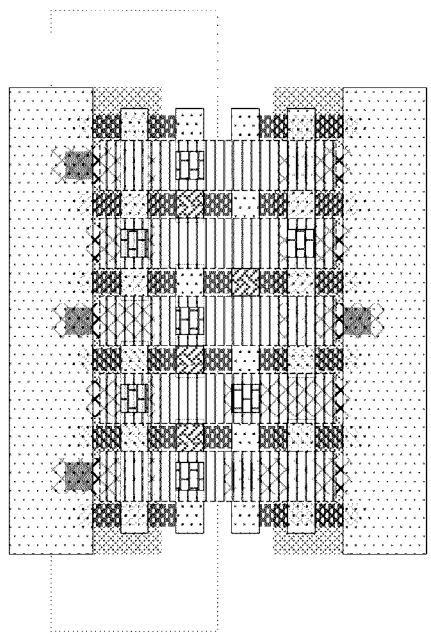
FIGS. 45A-C depict an ioai21x1 cell.
Figure 45B:
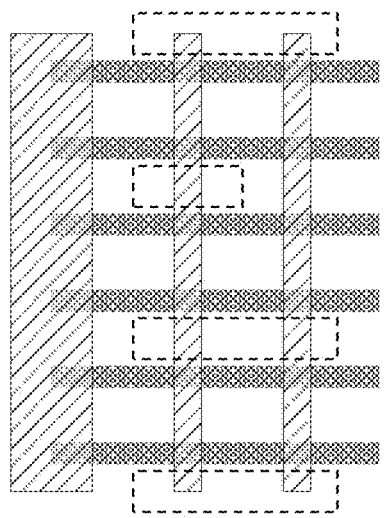
Figure 45C:
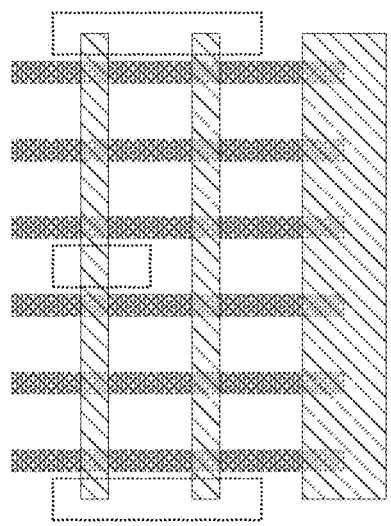

Reference is now made to FIGS. 45A-C, which depict an ioai21x1 cell. This cell implements the logic function NOT (AND(OR(a,b),c)), with one of the inputs inverted, in drive strength 1. This cell is 5 CPP wide.

Figure 46A:
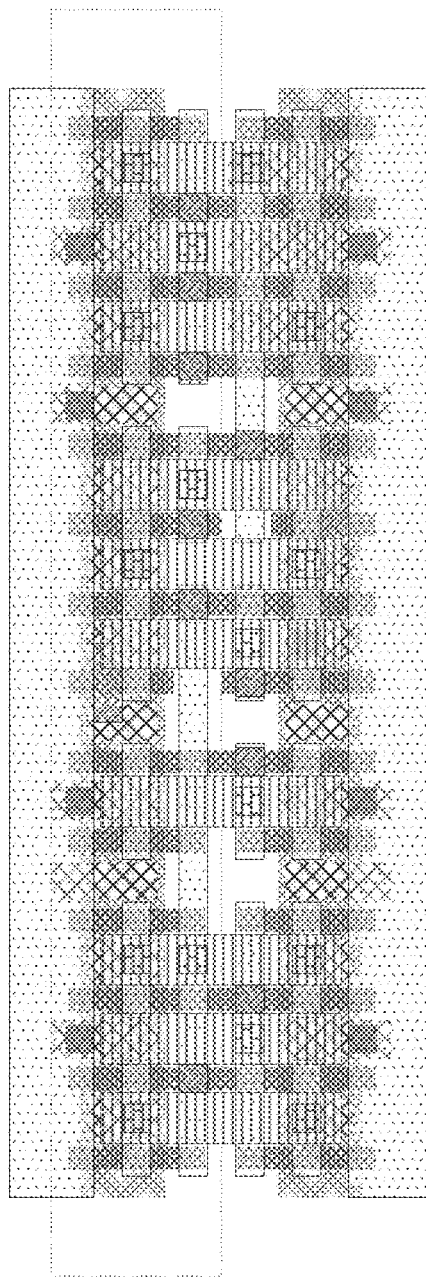
FIGS. 46A-C depict an latqx1 cell.
Figure 46B:
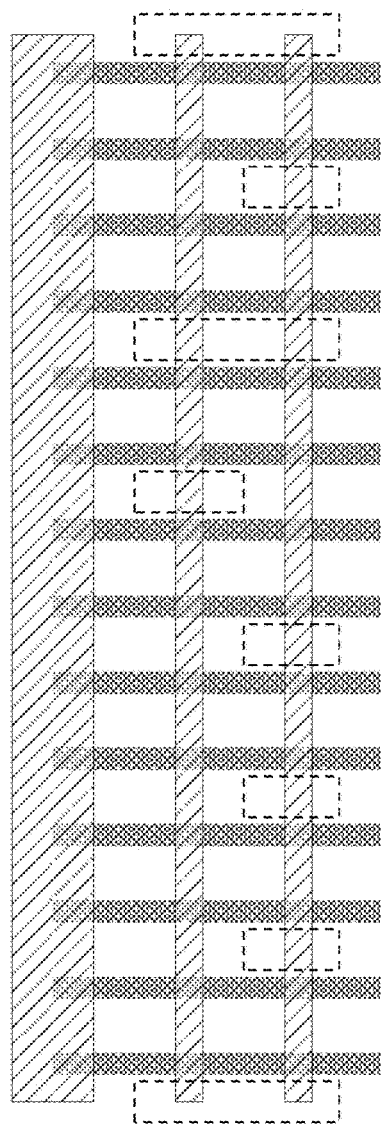
Figure 46C:
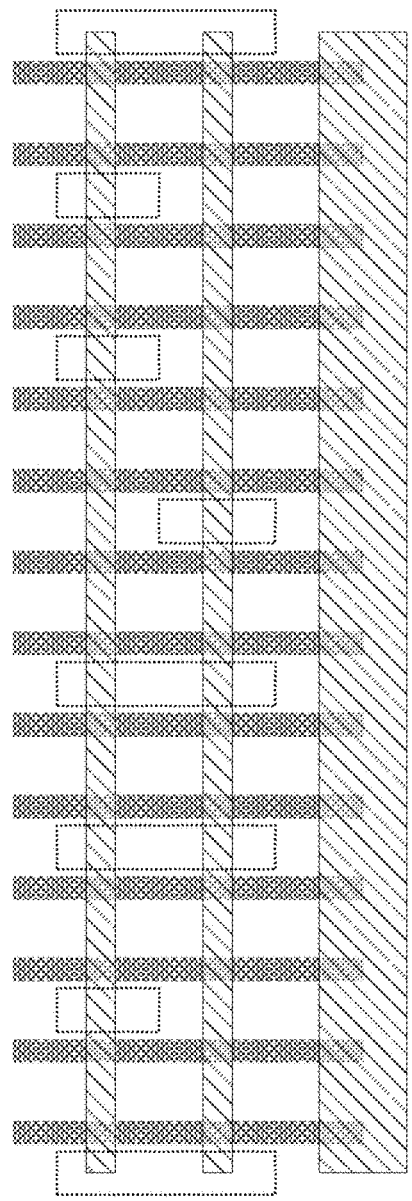

Reference is now made to FIGS. 46A-C, which depict an latqx1 cell. This cell implements the logic function of a latch, in drive strength 1. This cell is 13 CPP wide.

Figure 47A:
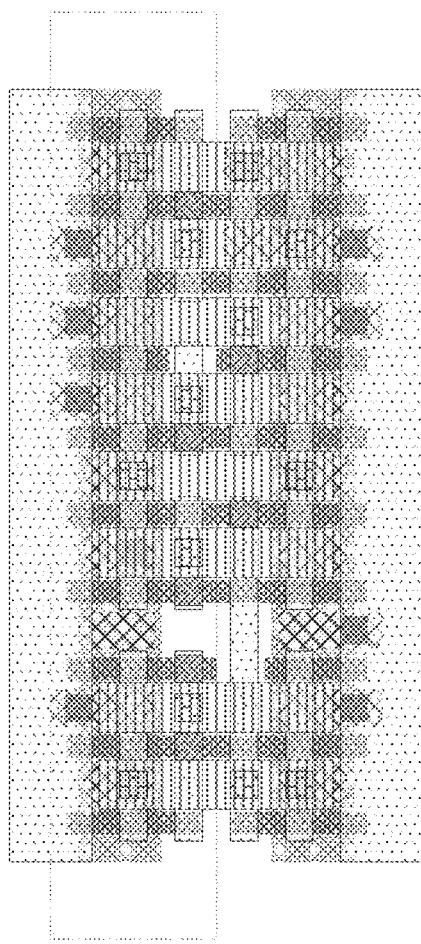
FIGS. 47A-C depict an mux2x1 cell.
Figure 47B:
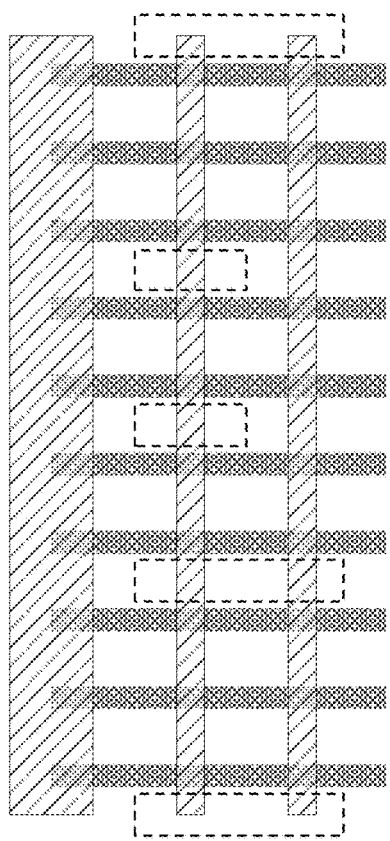
Figure 47C:
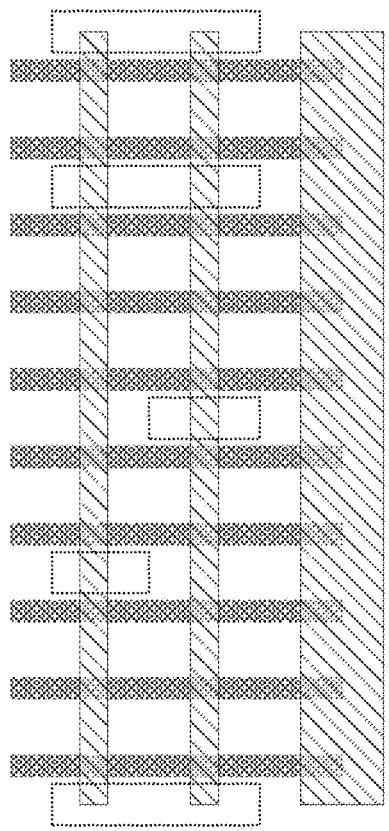

Reference is now made to FIGS. 47A-C, which depict a mux2x1 cell. This cell implements the logic function of a 2-input MUX, in drive strength 1. This cell is 9 CPP wide.

Figure 48A:
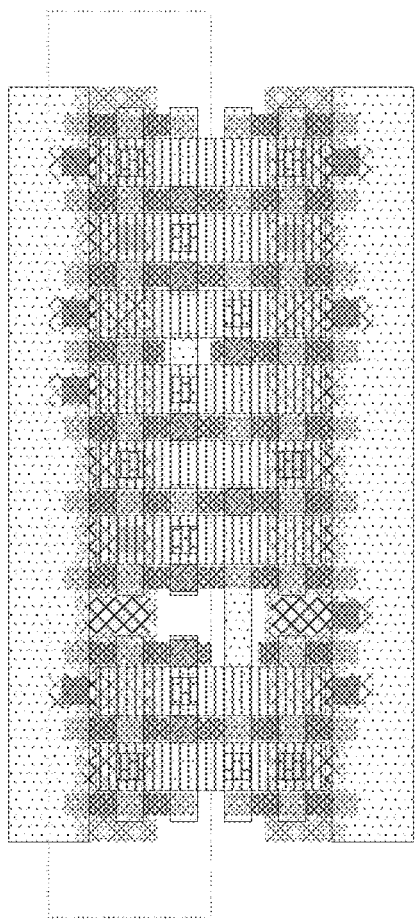
FIGS. 48A-C depict an mux2x2 cell.
Figure 48B:
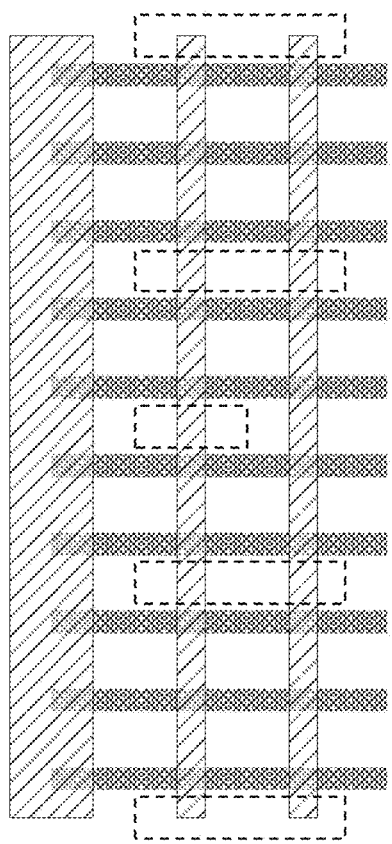
Figure 48C:
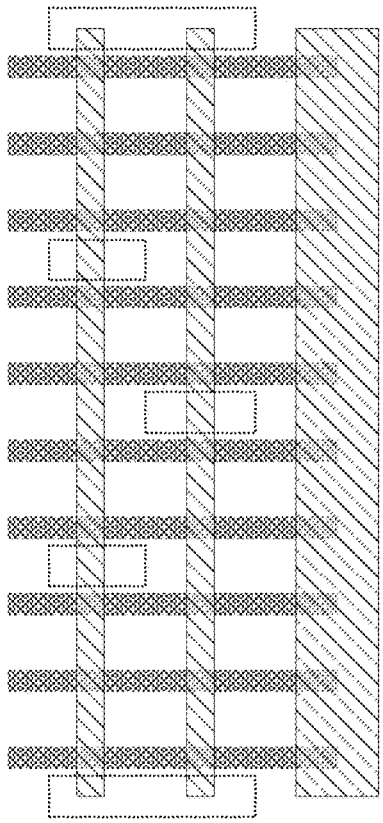

Reference is now made to FIGS. 48A-C, which depict an mux2x2 cell. This cell implements the logic function of a 2-input MUX, in drive strength 2. This cell is 9 CPP wide.

Figure 49A:
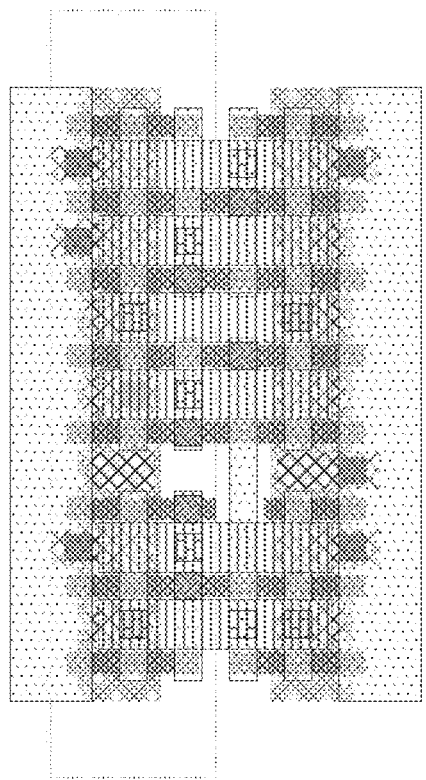
FIGS. 49A-C depict an muxi2x1 cell.
Figure 49B:
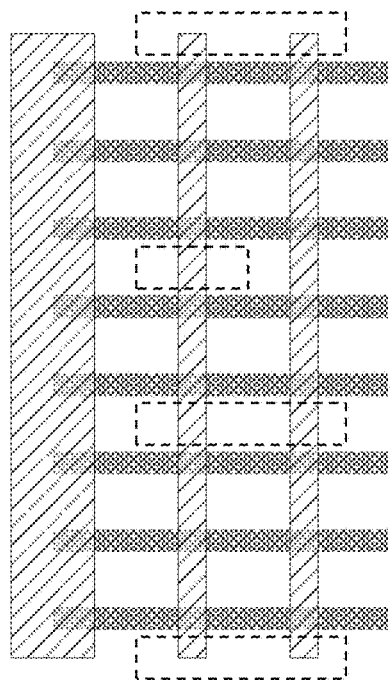
Figure 49C:
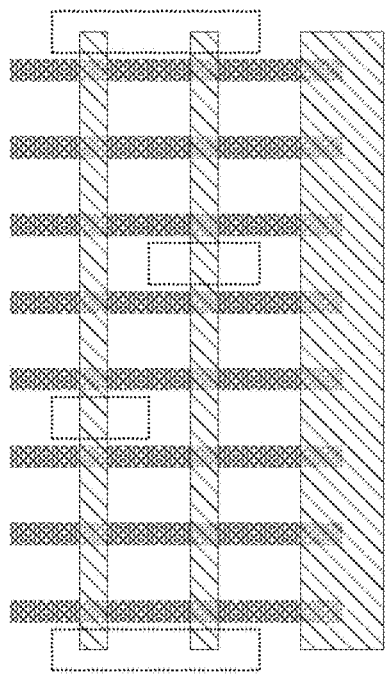

Reference is now made to FIGS. 49A-C, which depict an muxi2x1 cell. This cell implements the logic function of a 2-input MUX, with one of its inputs inverted, in drive strength 1. This cell is 7 CPP wide.

Figure 50A:
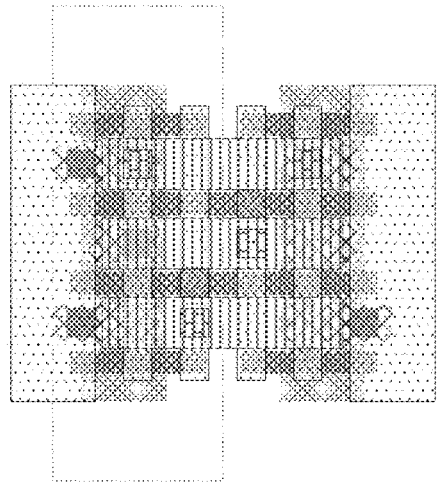
FIGS. 50A-C depict an nd2x1 cell.
Figure 50B:
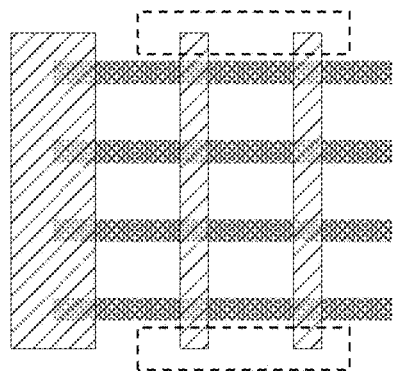
Figure 50C:
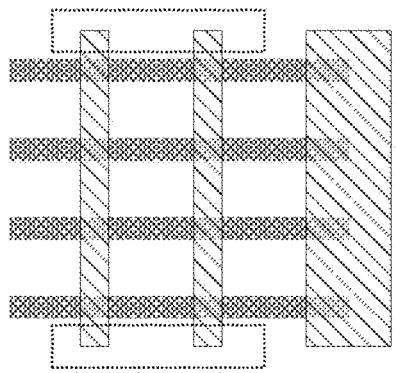

Reference is now made to FIGS. 50A-C, which depict an nd2x1 cell. This cell implements the logic function of a 2-input NAND, in drive strength 1. This cell is 3 CPP wide.

Figure 51A:
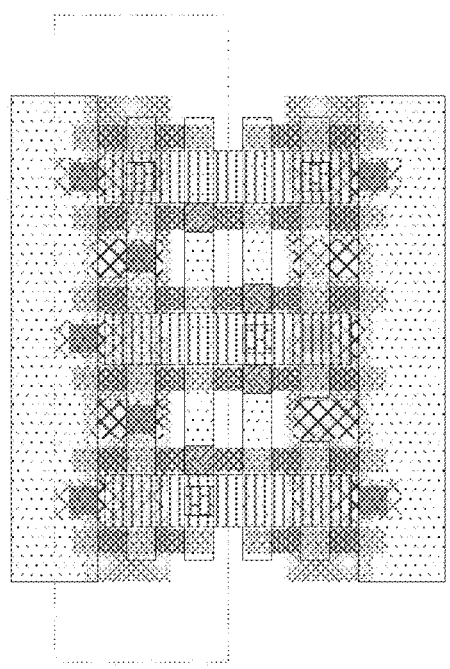
FIGS. 51A-C depict an nd2x2 cell.
Figure 51B:
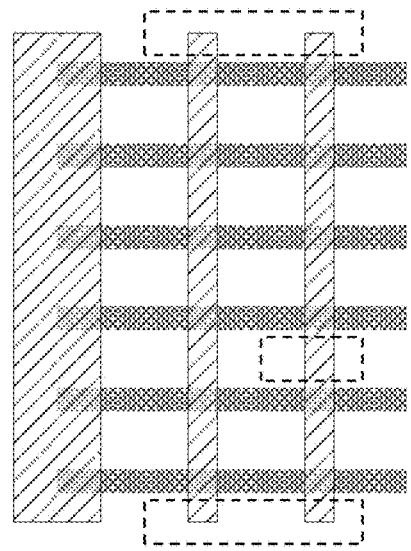
Figure 51C:
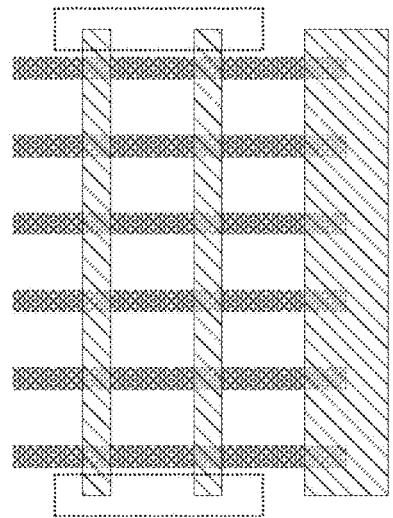

Reference is now made to FIGS. 51A-C, which depict an nd2x2 cell. This cell implements the logic function of a 2-input NAND, in drive strength 2. This cell is 5 CPP wide.

Figure 52A:
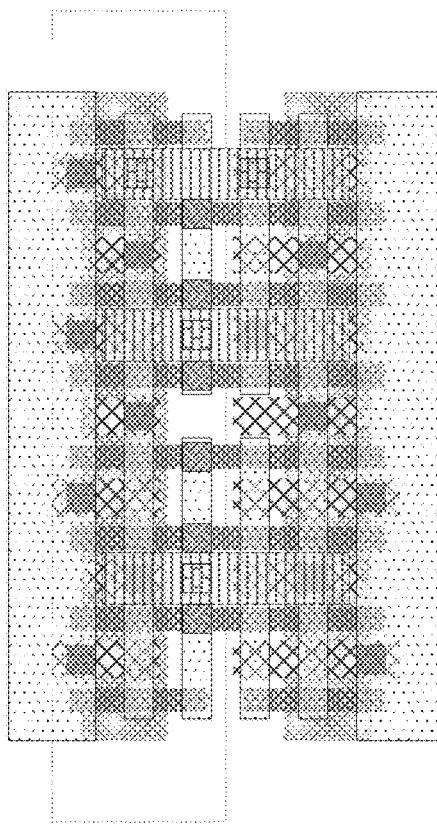
FIGS. 52A-C depict an nd2x3 cell.
Figure 52B:
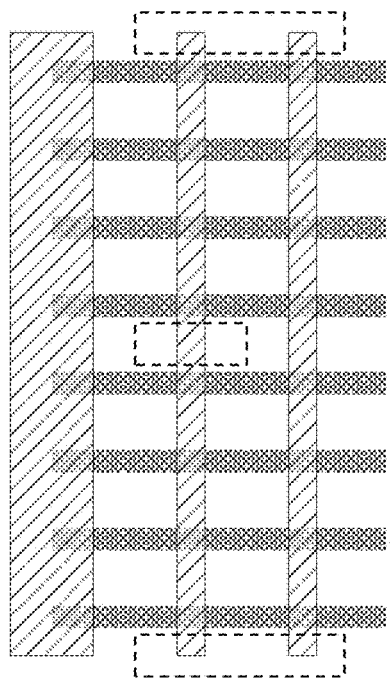
Figure 52C:
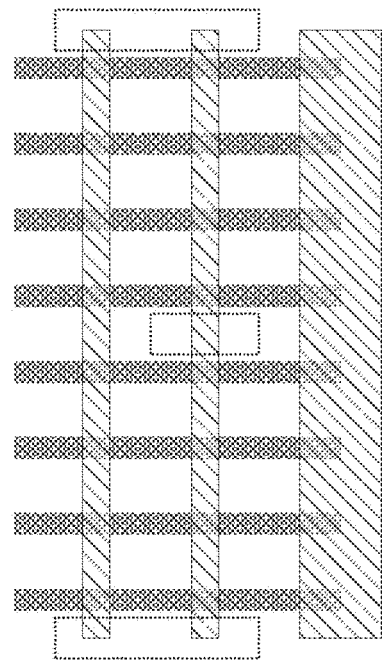

Reference is now made to FIGS. 52A-C, which depict an nd2x3 cell. This cell implements the logic function of a 2-input NAND, in drive strength 3. This cell is 7 CPP wide.

Figure 53A:
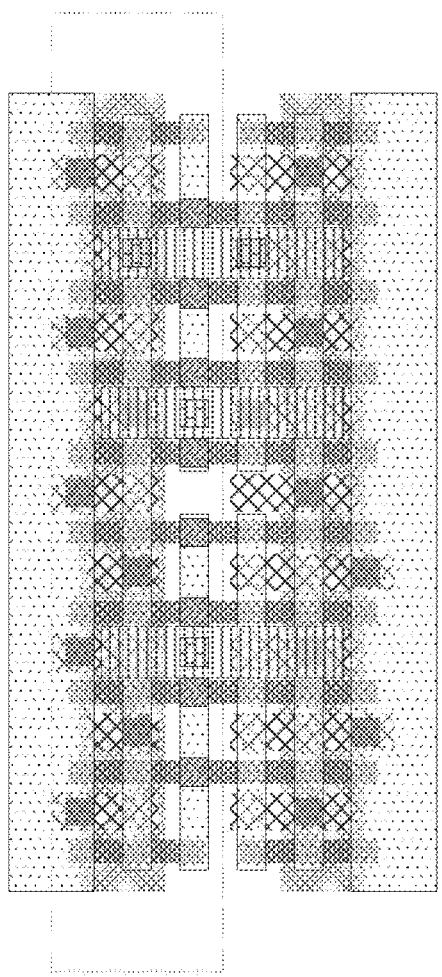
FIGS. 53A-C depict an nd2x4 cell.
Figure 53B:
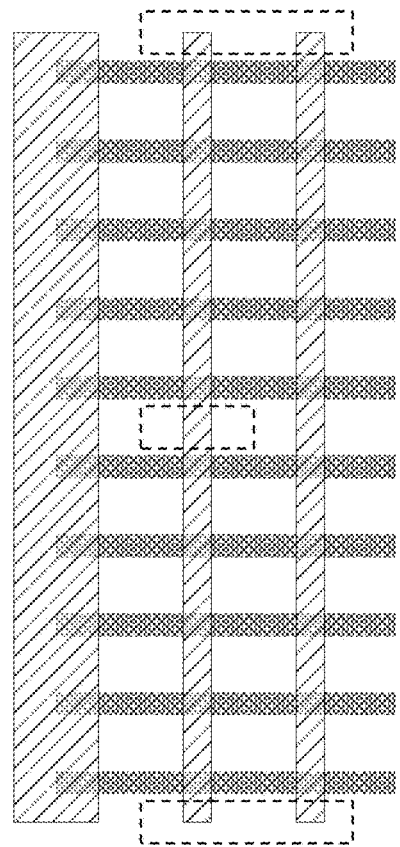
Figure 53C:
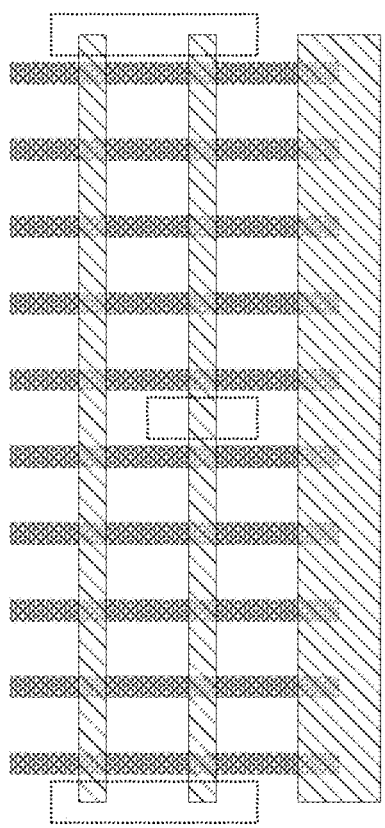

Reference is now made to FIGS. 53A-C, which depict an nd2x4 cell. This cell implements the logic function of a 2-input NAND, in drive strength 4. This cell is 9 CPP wide.

Figure 54A:
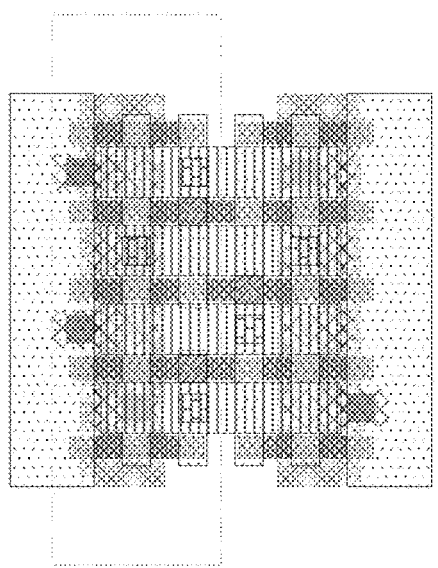
FIGS. 54A-C depict an nd3x1 cell.
Figure 54B:
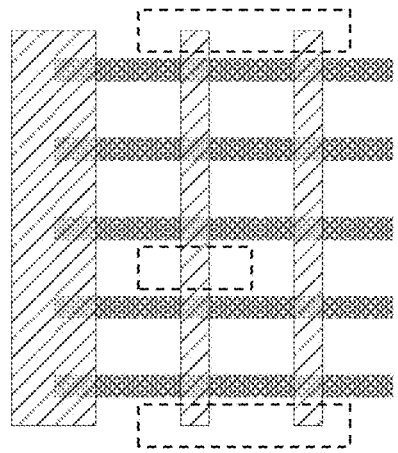
Figure 54C:
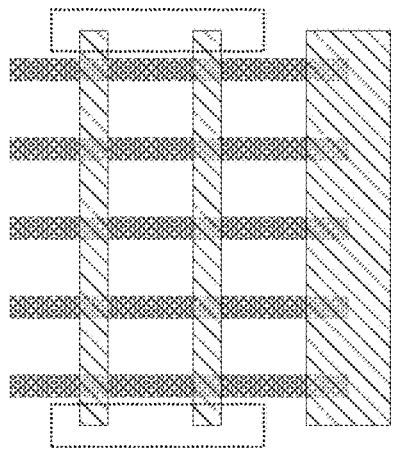

Reference is now made to FIGS. 54A-C, which depict an nd3x1 cell. This cell implements the logic function of a 3-input NAND, in drive strength 1. This cell is 4 CPP wide.

Figure 55A:
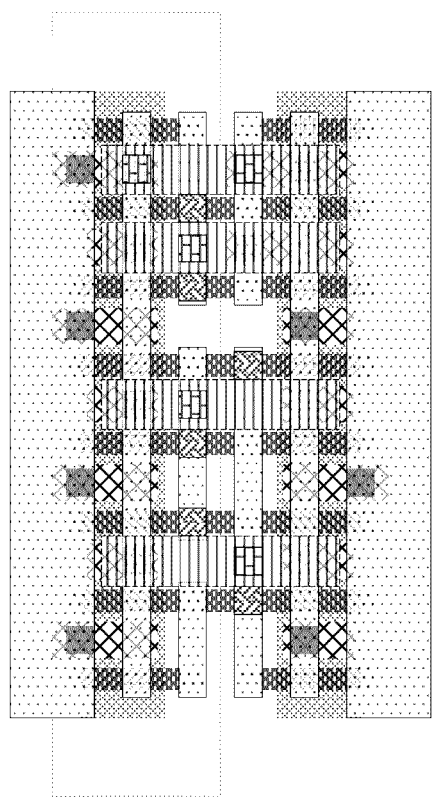
FIGS. 55A-C depict an nd3x2 cell.
Figure 55B:
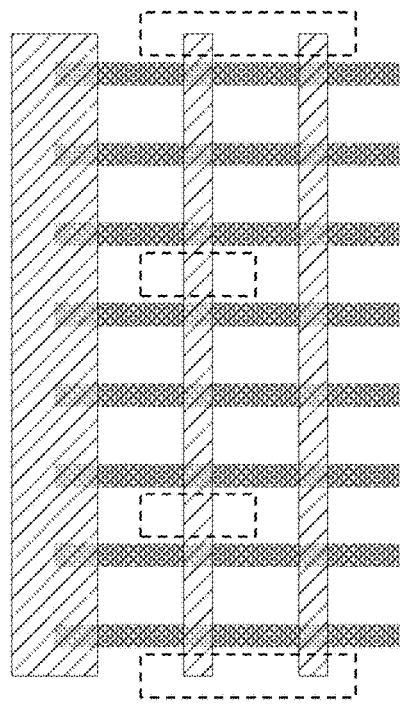
Figure 55C:
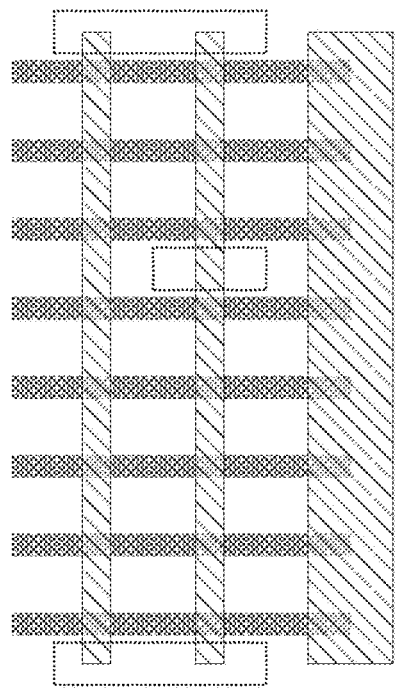

Reference is now made to FIGS. 55A-C, which depict an nd3x2 cell. This cell implements the logic function of a 3-input NAND, in drive strength 2. This cell is 7 CPP wide.

Figure 56A:
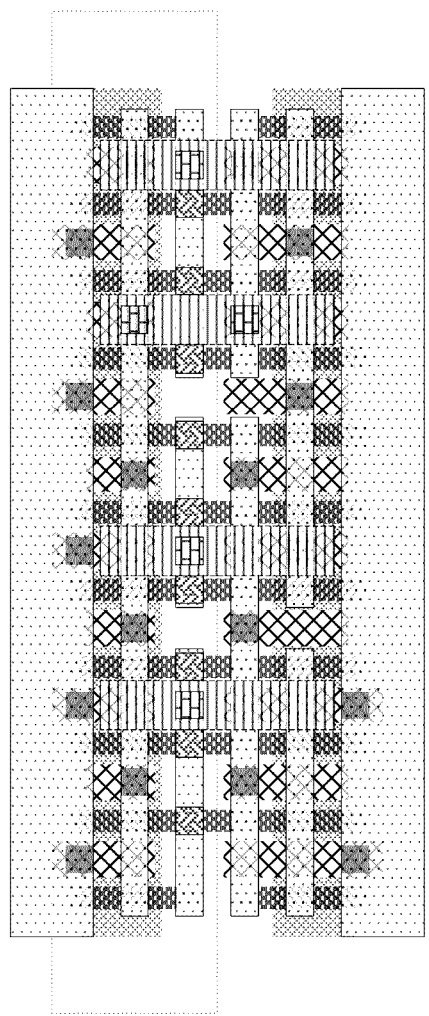
FIGS. 56A-C depict an nd3x3 cell.
Figure 56B:
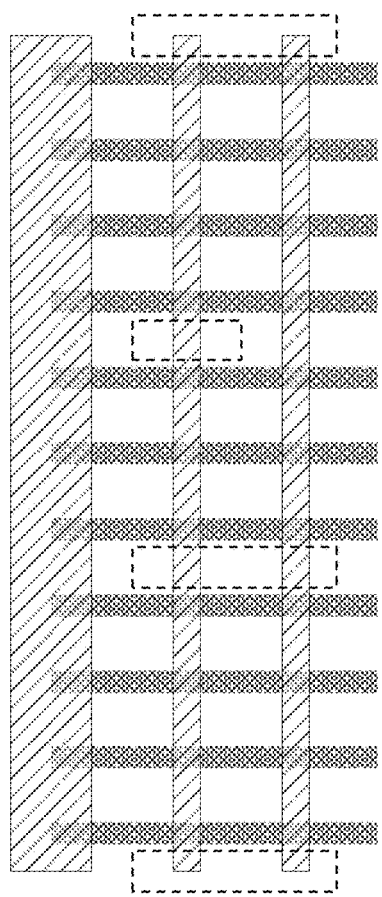
Figure 56C:
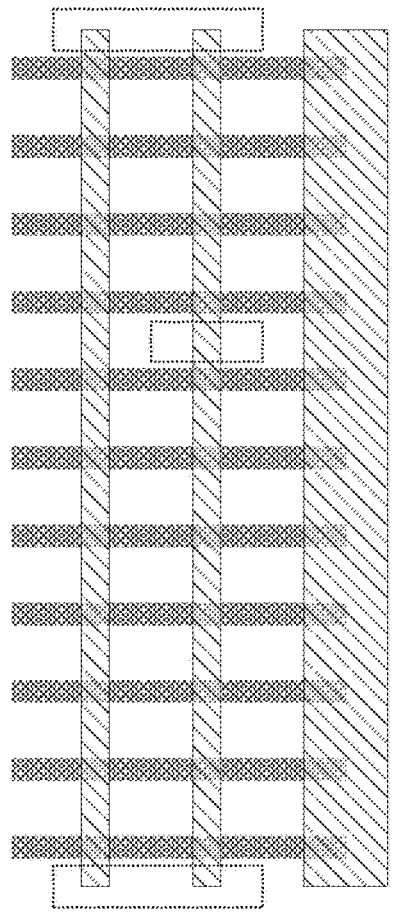

Reference is now made to FIGS. 56A-C, which depict an nd3x3 cell. This cell implements the logic function of a 3-input NAND, in drive strength 3. This cell is 10 CPP wide.

Figure 57A:
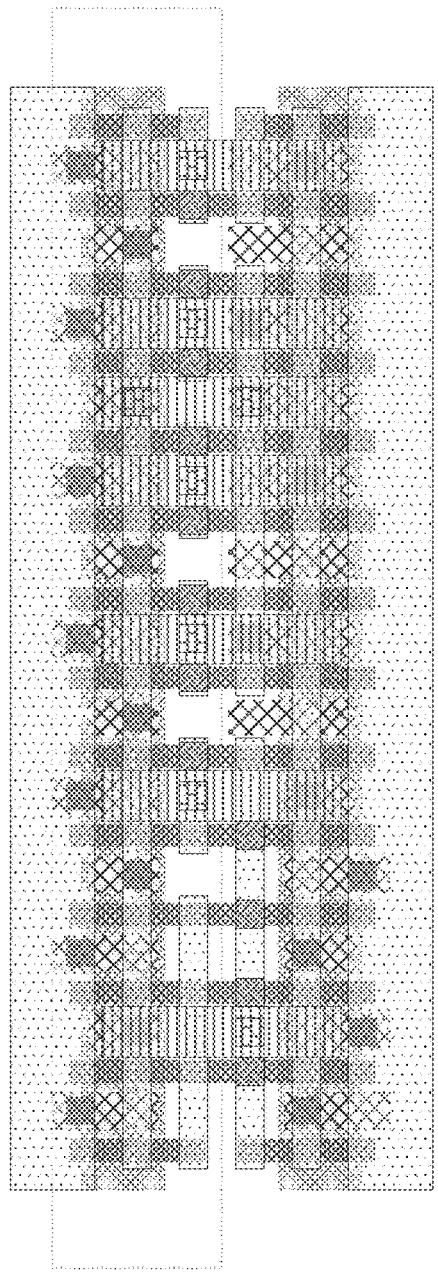
FIGS. 57A-C depict an nd3x4 cell.
Figure 57B:
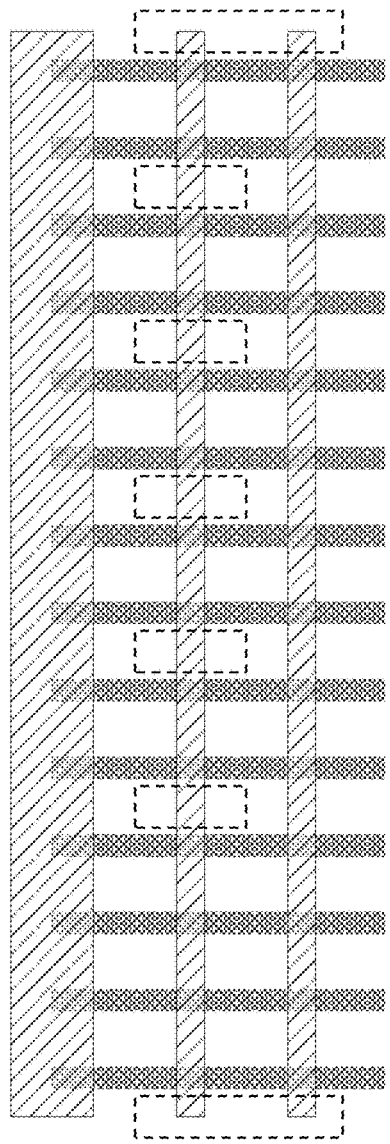
Figure 57C:
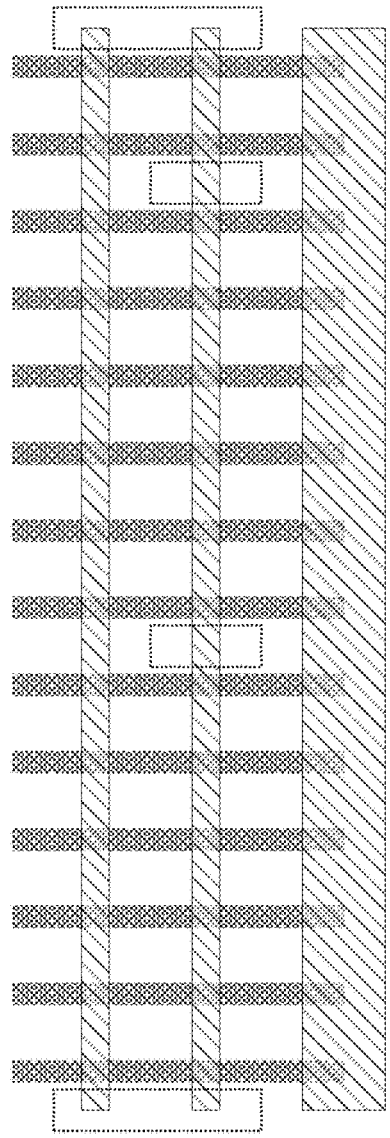

Reference is now made to FIGS. 57A-C, which depict an nd3x4 cell. This cell implements the logic function of a 3-input NAND, in drive strength 4. This cell is 13 CPP wide.

Figure 58A:
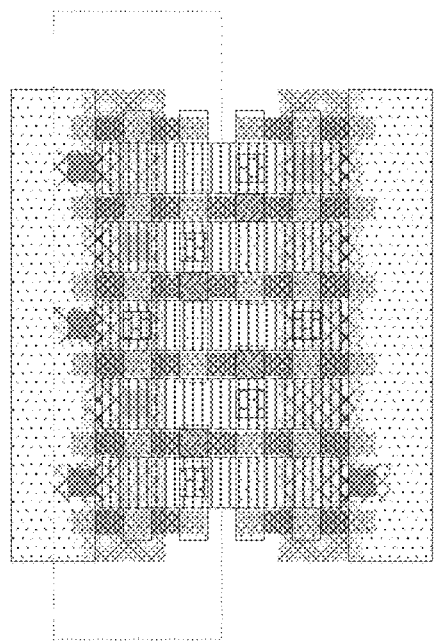
FIGS. 58A-C depict an nd4x1 cell.
Figure 58B:
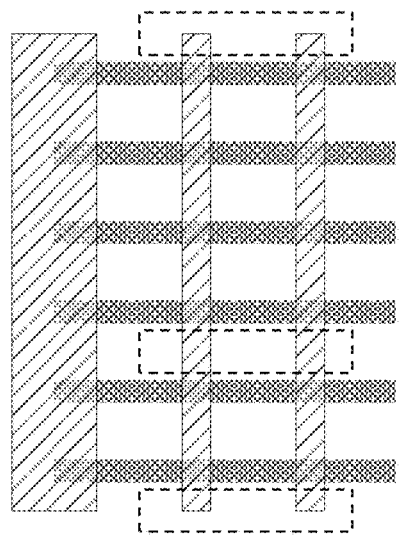
Figure 58C:
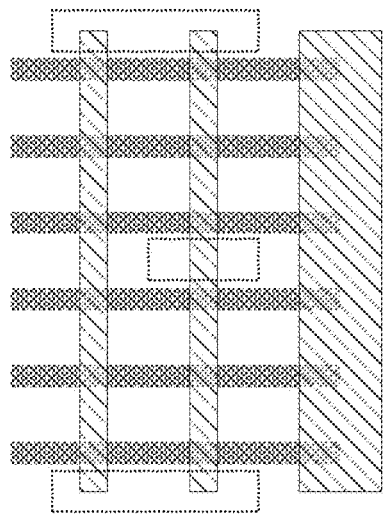

Reference is now made to FIGS. 58A-C, which depict an nd4x1 cell. This cell implements the logic function of a 4-input NAND, in drive strength 1. This cell is 5 CPP wide.

Figure 59A:
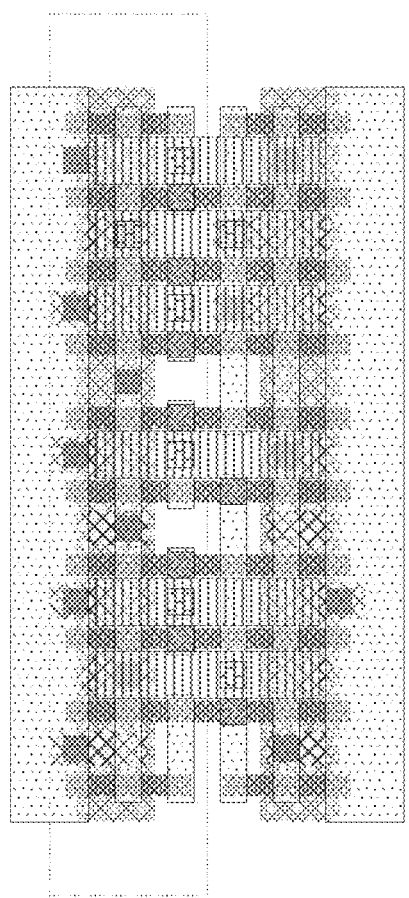
FIGS. 59A-C depict an nd4x2 cell.
Figure 59B:
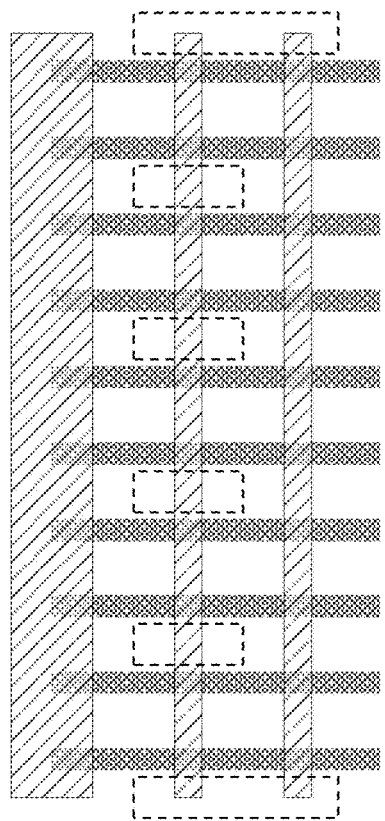
Figure 59C:
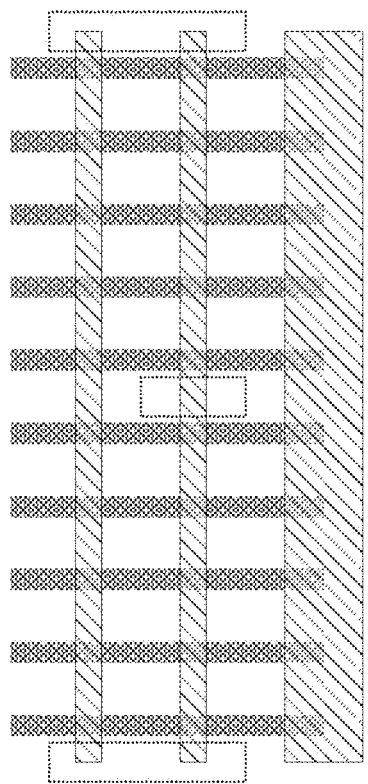

Reference is now made to FIGS. 59A-C, which depict an nd4x2 cell. This cell implements the logic function of a 4-input NAND, in drive strength 2. This cell is 9 CPP wide.

Figure 60A:
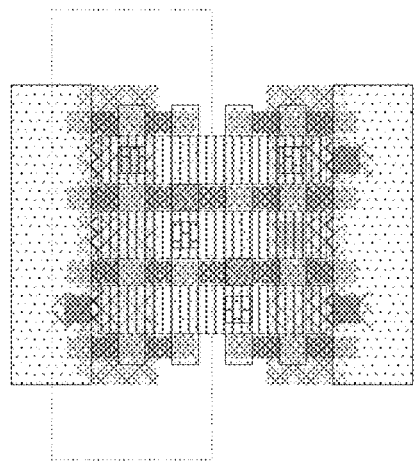
FIGS. 60A-C depict an nr2x1 cell.
Figure 60B:
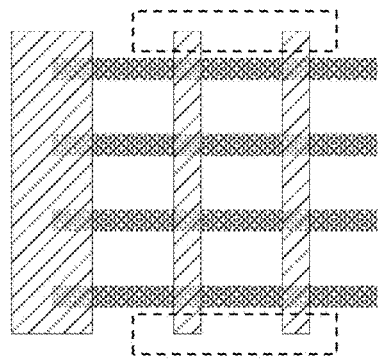
Figure 60C:
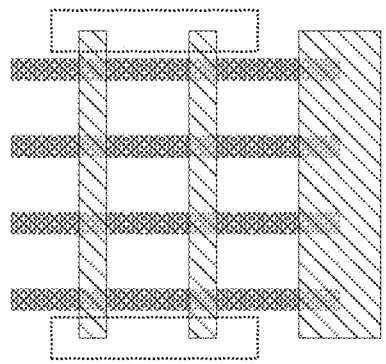

Reference is now made to FIGS. 60A-C, which depict an nr2x1 cell. This cell implements the logic function of a 2-input NOR, in drive strength 1. This cell is 3 CPP wide.

Figure 61A:
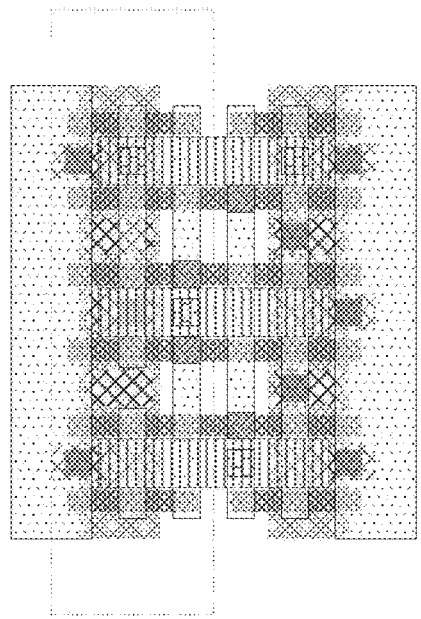
FIGS. 61A-C depict an nr2x2 cell.
Figure 61B:
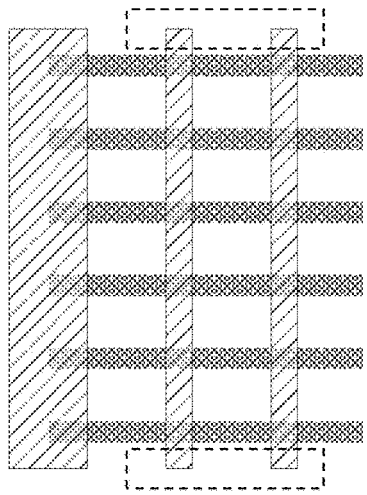
Figure 61C:
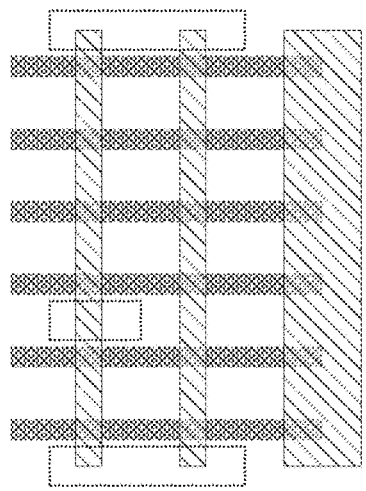

Reference is now made to FIGS. 61A-C, which depict an nr2x2 cell. This cell implements the logic function of a 2-input NOR, in drive strength 2. This cell is 5 CPP wide.

Reference is now made to FIGS. 61.1A-C, which depict an nr2x3 cell. This cell implements the logic function of a 2-input NOR, in drive strength 3. This cell is 7 CPP wide.

Figure 62A:
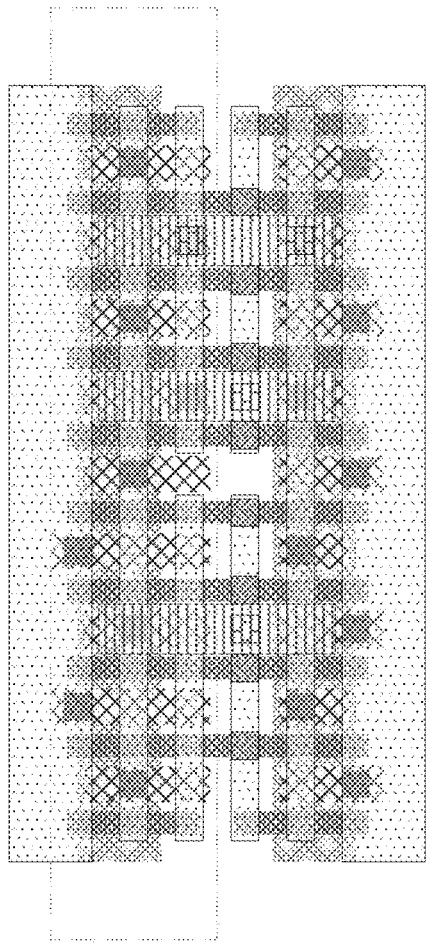
FIGS. 62A-C depict an nr2x4 cell.
Figure 62B:
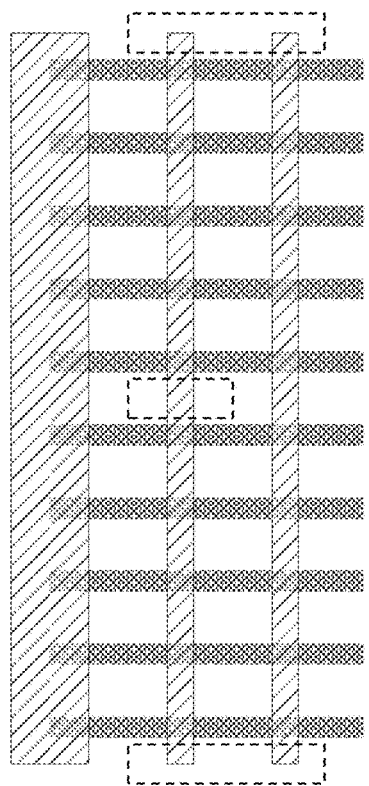
Figure 62C:
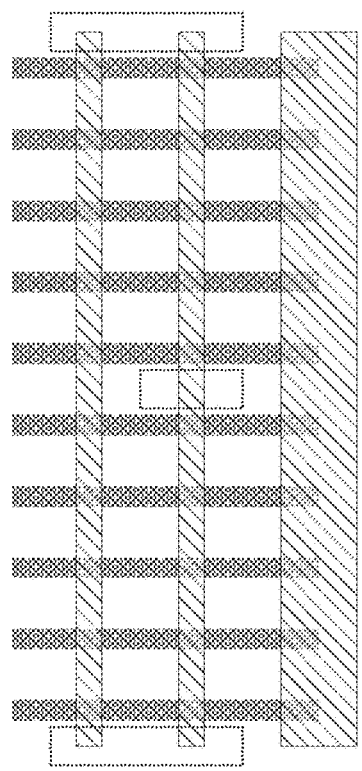

Reference is now made to FIGS. 62A-C, which depict an nr2x4 cell. This cell implements the logic function of a 2-input NOR, in drive strength 4. This cell is 9 CPP wide.

Figure 63A:
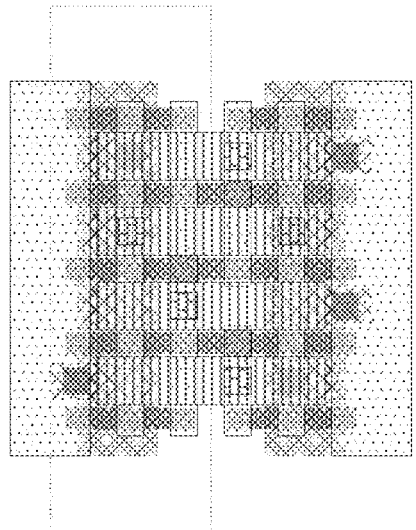
FIGS. 63A-C depict an nr3x1 cell.
Figure 63B:
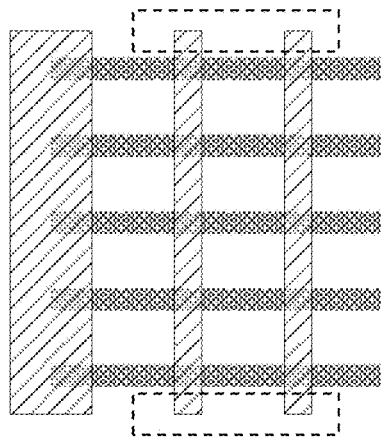
Figure 63C:
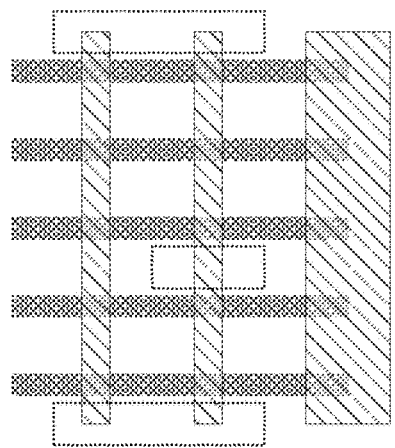

Reference is now made to FIGS. 63A-C, which depict an nr3x1 cell. This cell implements the logic function of a 3-input NOR, in drive strength 1. This cell is 4 CPP wide.

Figure 64A:
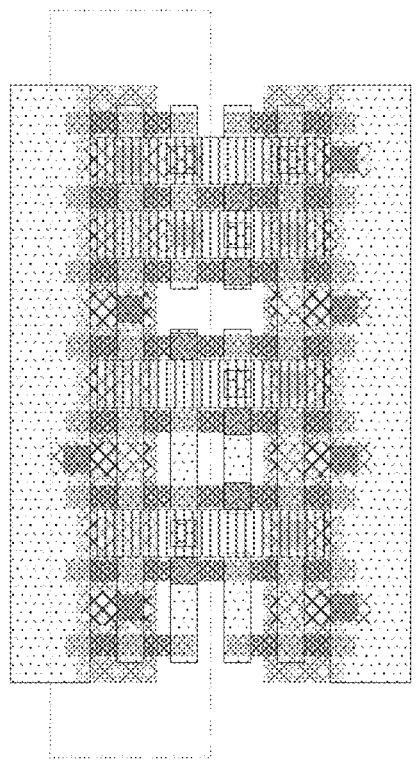
FIGS. 64A-C depict an nr3x2 cell.
Figure 64B:
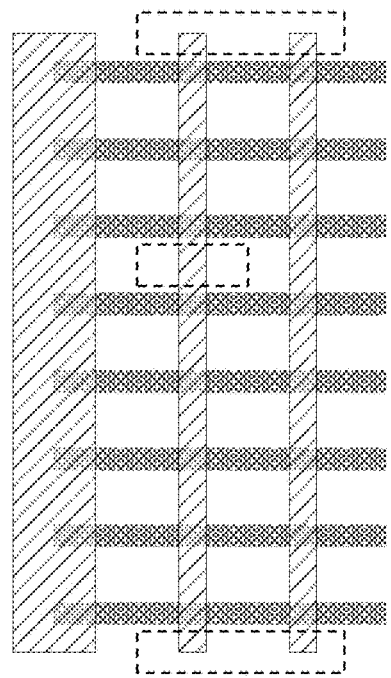
Figure 64C:
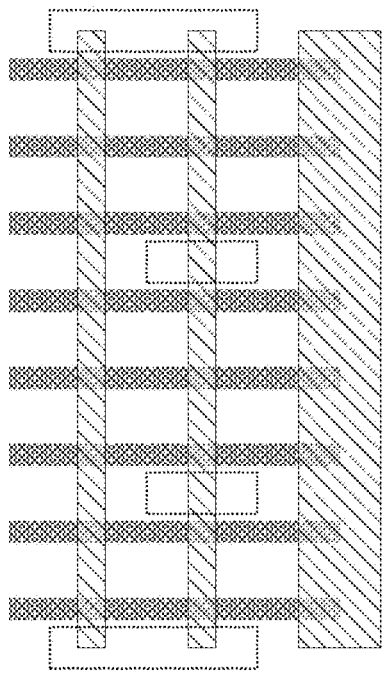

Reference is now made to FIGS. 64A-C, which depict an nr3x2 cell. This cell implements the logic function of a 3-input NOR, in drive strength 2. This cell is 7 CPP wide.

Figure 65A:
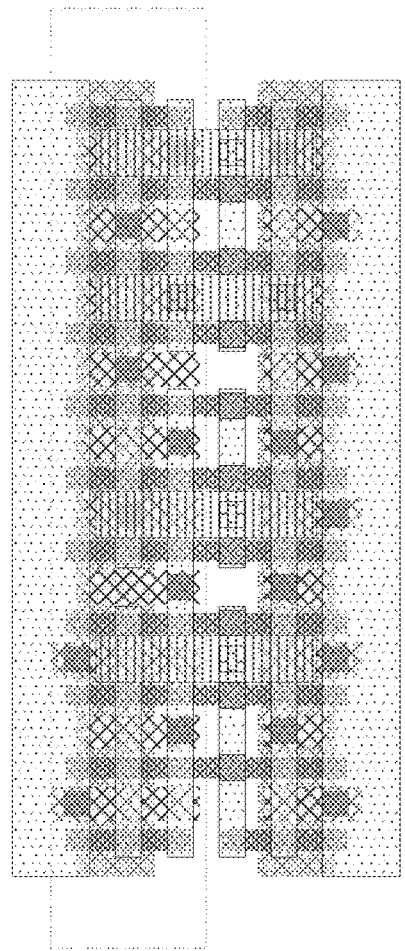
FIGS. 65A-C depict an nr3x3 cell.
Figure 65B:
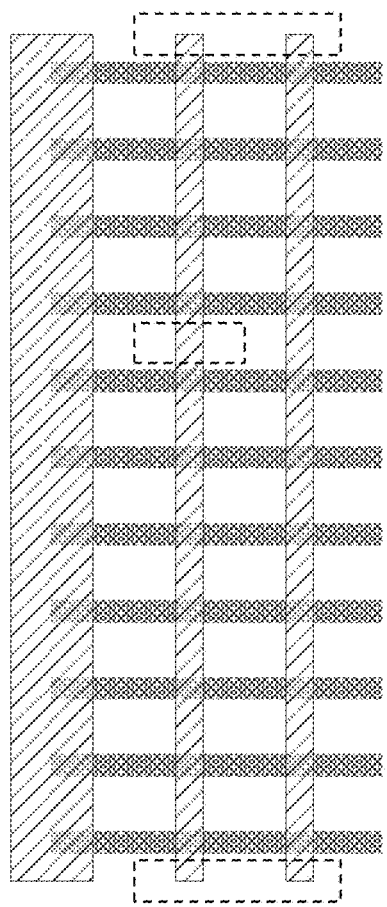
Figure 65C:
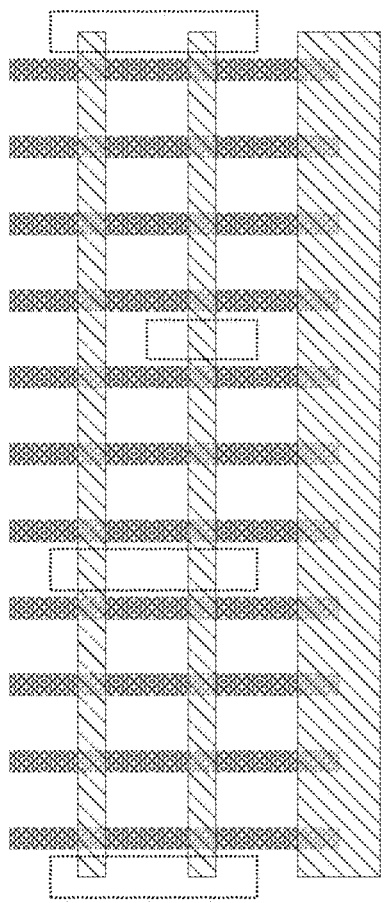

Reference is now made to FIGS. 65A-C, which depict an nr3x3 cell. This cell implements the logic function of a 3-input NOR, in drive strength 3. This cell is 10 CPP wide.

Figure 66A:
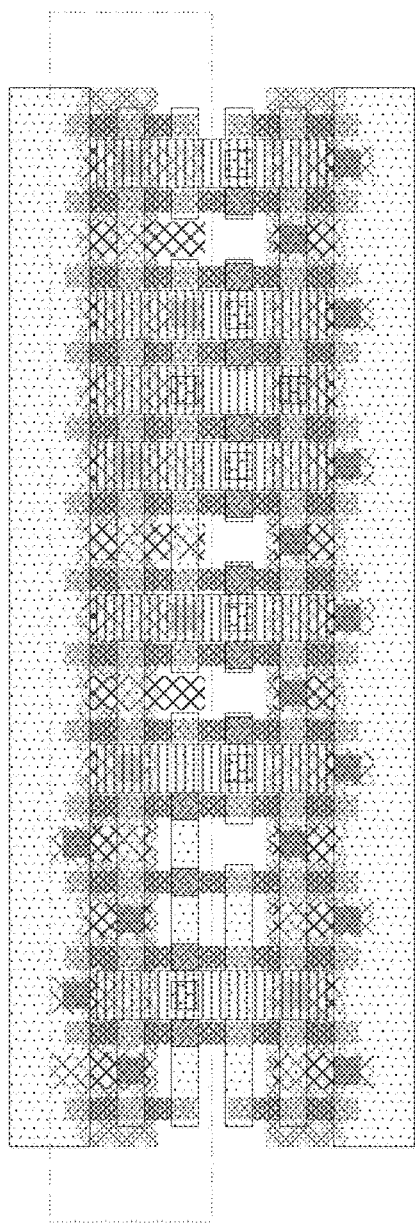
FIGS. 66A-C depict an nr3x4 cell.
Figure 66B:
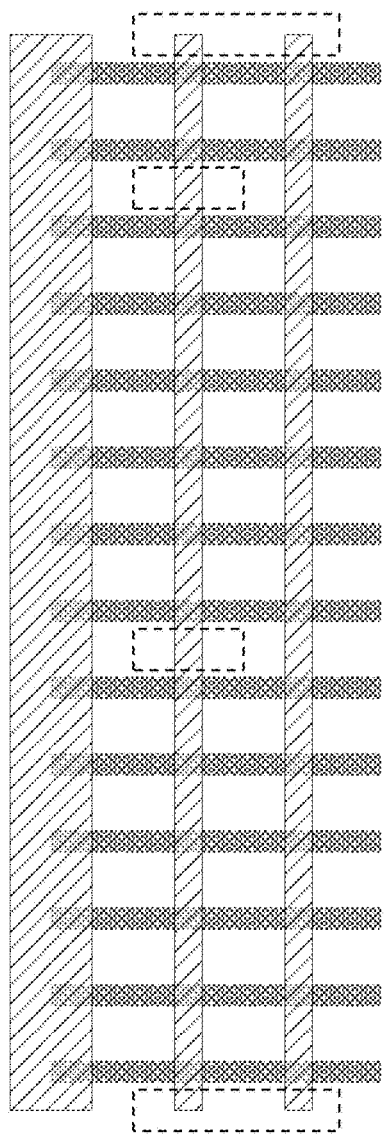
Figure 66C:
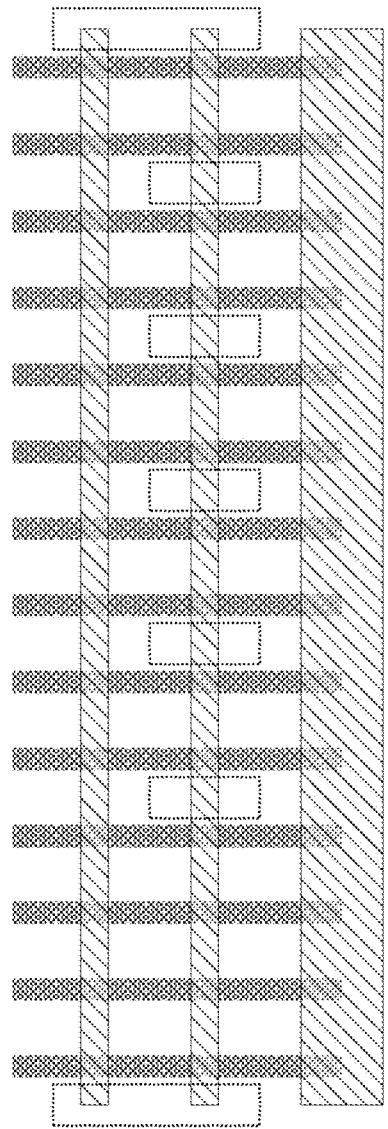

Reference is now made to FIGS. 66A-C, which depict an nr3x4 cell. This cell implements the logic function of a 3-input NOR, in drive strength 4. This cell is 13 CPP wide.

Figure 67A:
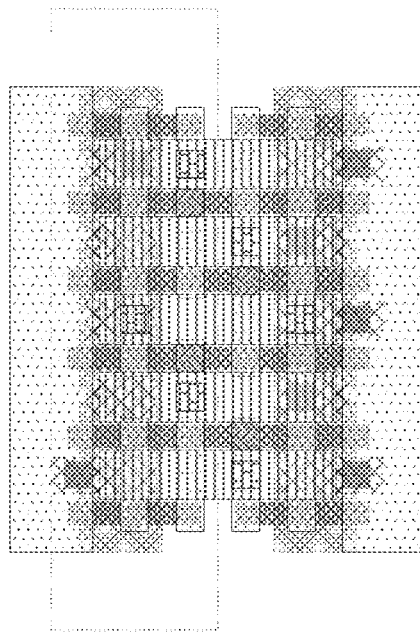
FIGS. 67A-C depict an nr4x1 cell.
Figure 67B:
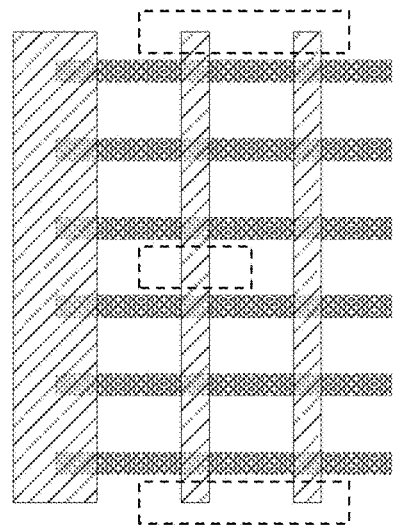
Figure 67C:
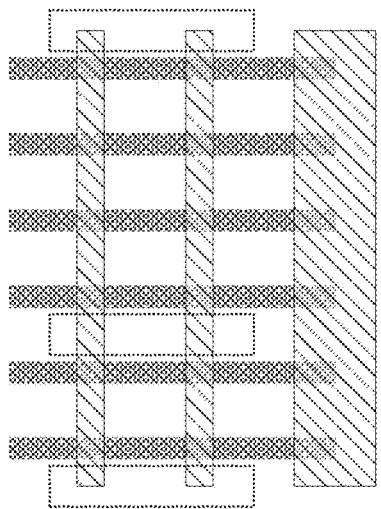

Reference is now made to FIGS. 67A-C, which depict an nr4x1 cell. This cell implements the logic function of a 4-input NOR, in drive strength 1. This cell is 5 CPP wide.

Figure 68A:
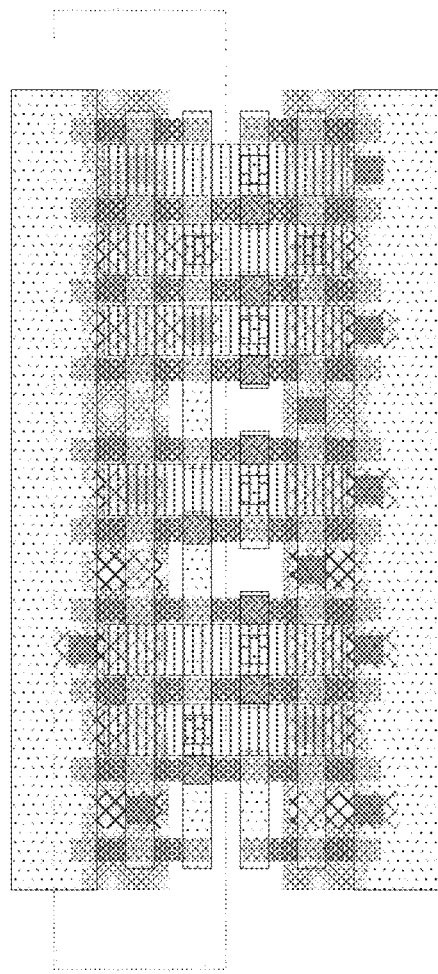
FIGS. 68A-C depict an nr4x2 cell.
Figure 68B:
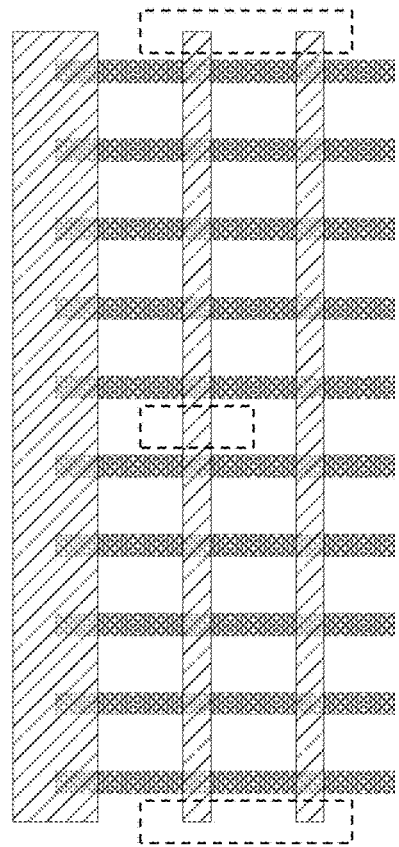
Figure 68C:
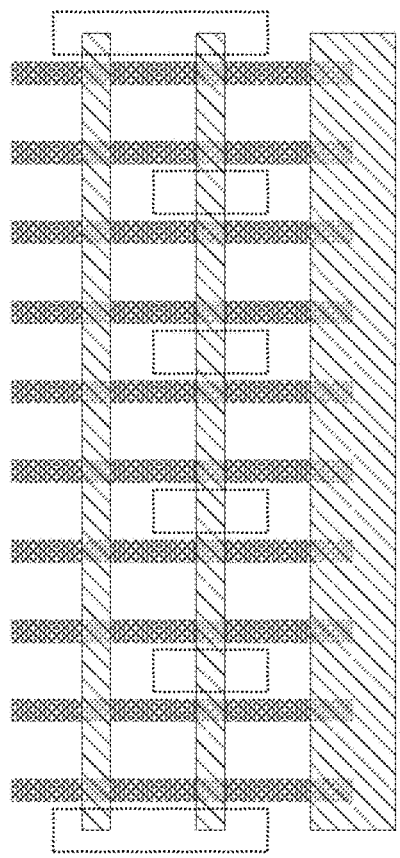

Reference is now made to FIGS. 68A-C, which depict an nr4x2 cell. This cell implements the logic function of a 4-input NOR, in drive strength 2. This cell is 9 CPP wide.

Figure 69A:
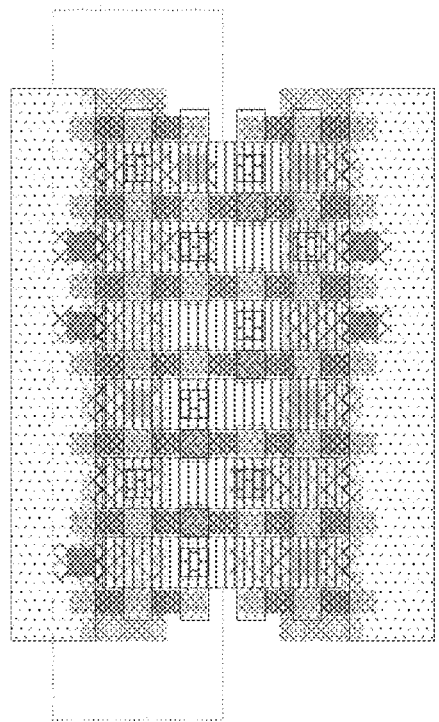
FIGS. 69A-C depict an oa21x1 cell.
Figure 69B:
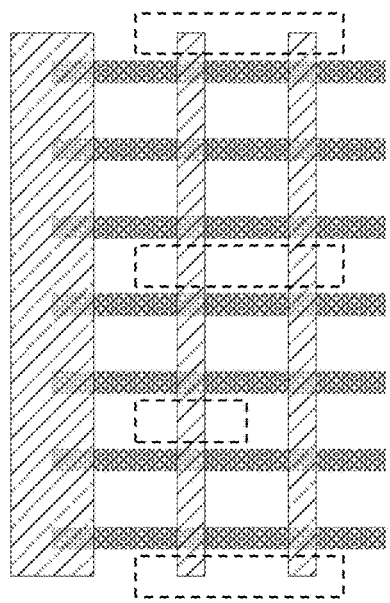
Figure 69C:
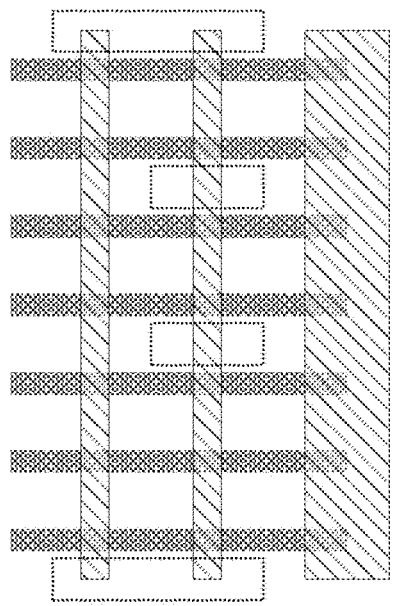

Reference is now made to FIGS. 69A-C, which depict an oa21x1 cell. This cell implements the logic function AND (OR(a,b),c), in drive strength 1. This cell is 6 CPP wide.

Figure 70A:
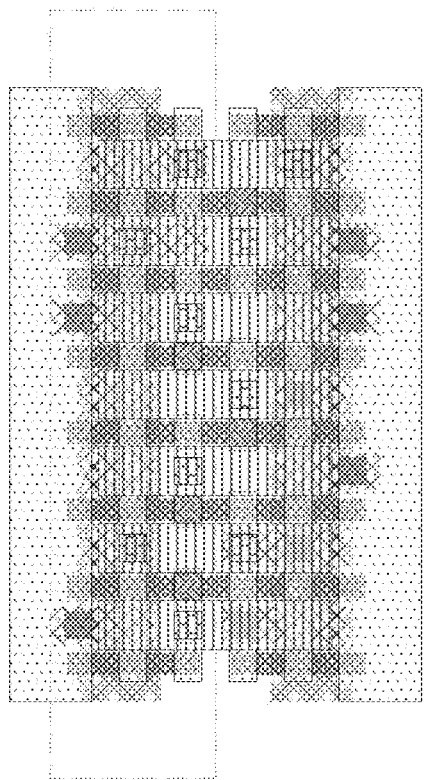
FIGS. 70A-C depict an oa31x1 cell.
Figure 70B:
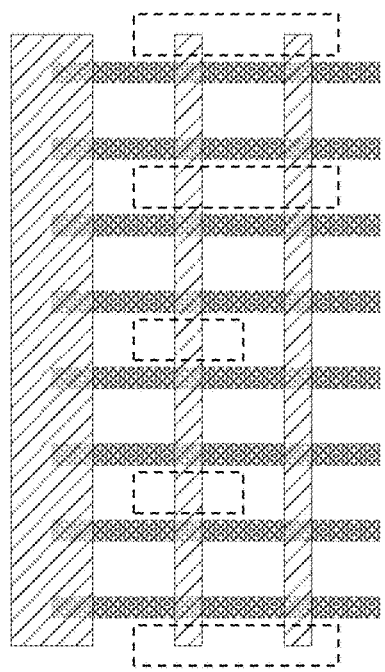
Figure 70C:
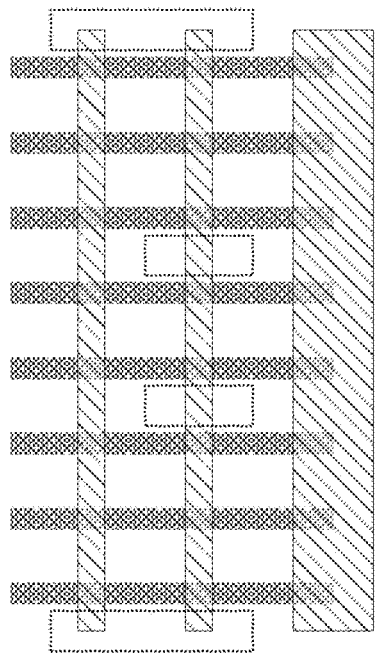

Reference is now made to FIGS. 70A-C, which depict an oa31x1 cell. This cell implements the logic function AND (OR(a,b,c),d), in drive strength 1. This cell is 7 CPP wide.

Figure 71A:
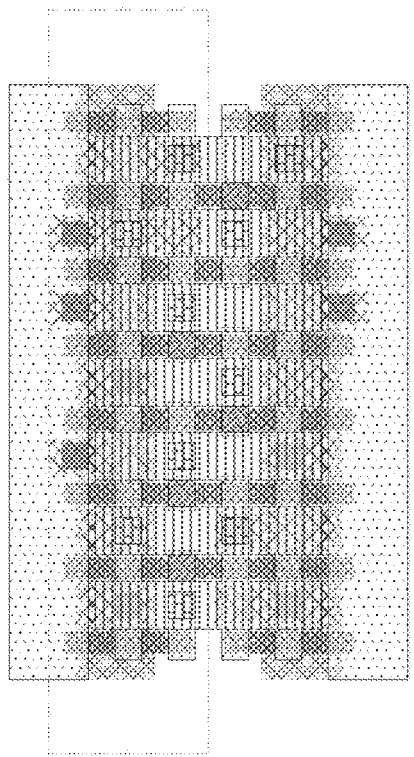
FIGS. 71A-C depict an oa211x1 cell.
Figure 71B:
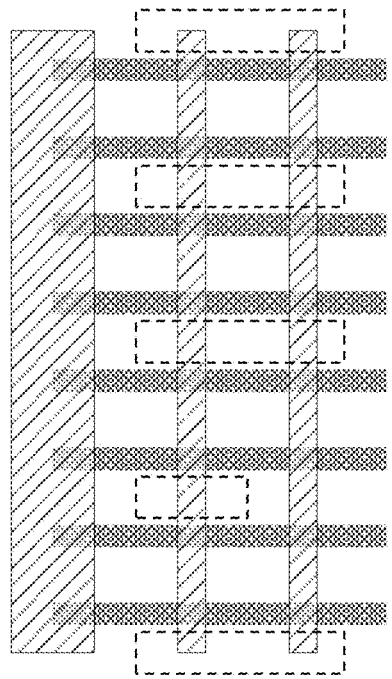
Figure 71C:
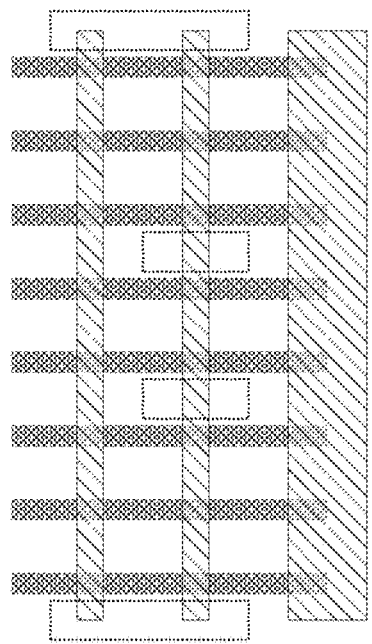

Reference is now made to FIGS. 71A-C, which depict an oa211x1 cell. This cell implements the logic function AND (OR(a,b),c,d), in drive strength 1. This cell is 7 CPP wide.

Figure 72A:
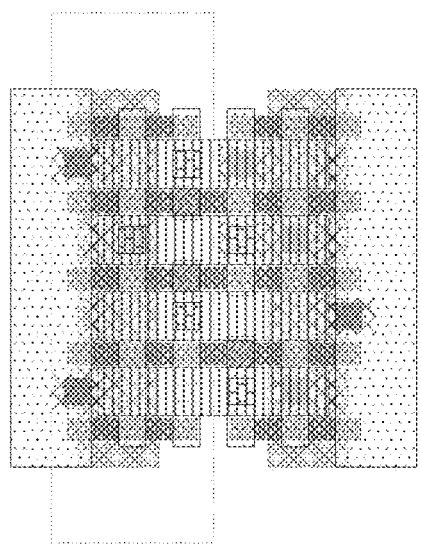
FIGS. 72A-C depict an oai21x1 cell.
Figure 72B:
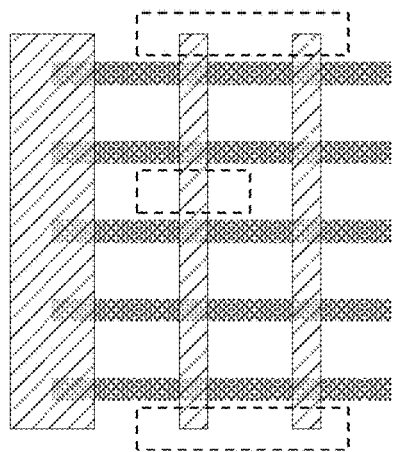
Figure 72C:
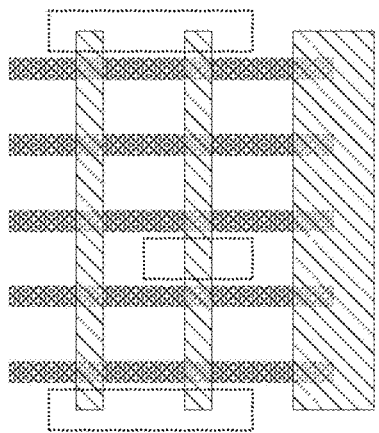

Reference is now made to FIGS. 72A-C, which depict an oai21x1 cell. This cell implements the logic function NOT (AND(OR(a,b),c)), in drive strength 1. This cell is 4 CPP wide.

Figure 73A:
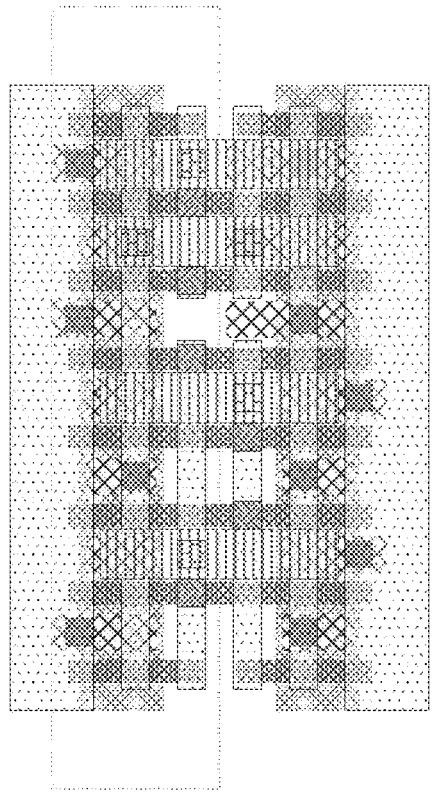
FIGS. 73A-C depict an oai21x2 cell.
Figure 73B:
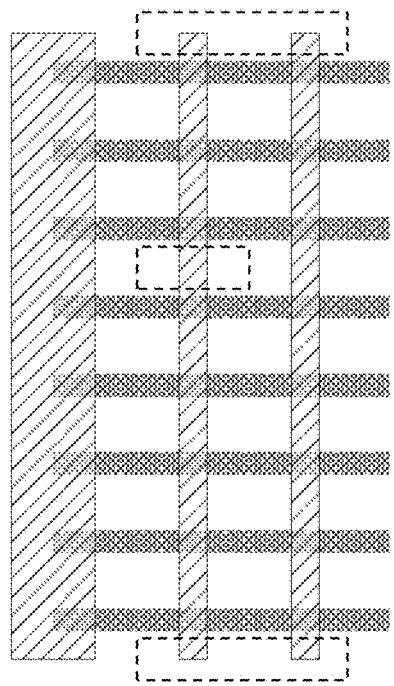
Figure 73C:
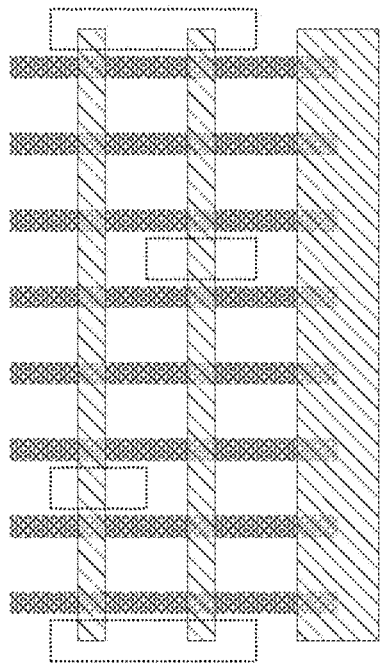

Reference is now made to FIGS. 73A-C, which depict an oai21x2 cell. This cell implements the logic function NOT (AND(OR(a,b),c)), in drive strength 2. This cell is 7 CPP wide.

Figure 74A:
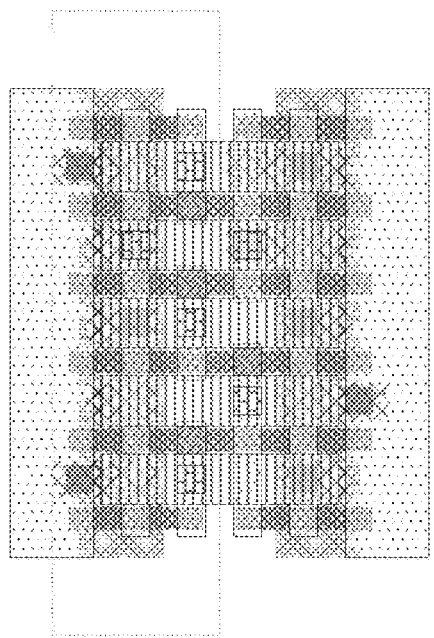
FIGS. 74A-C depict an oai22x1 cell.
Figure 74B:
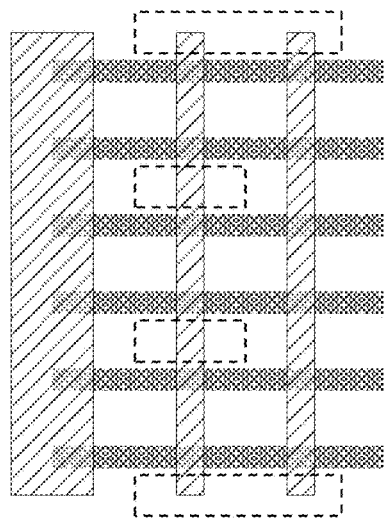
Figure 74C:
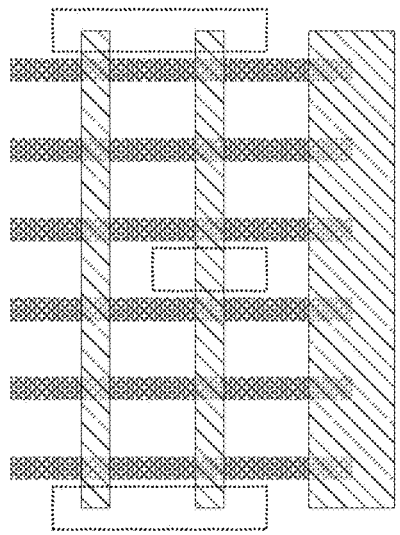

Reference is now made to FIGS. 74A-C, which depict an oai22x1 cell. This cell implements the logic function NOT (AND(OR(a,b),OR(c,d)), in drive strength 1. This cell is 5 CPP wide.

Figure 75A:
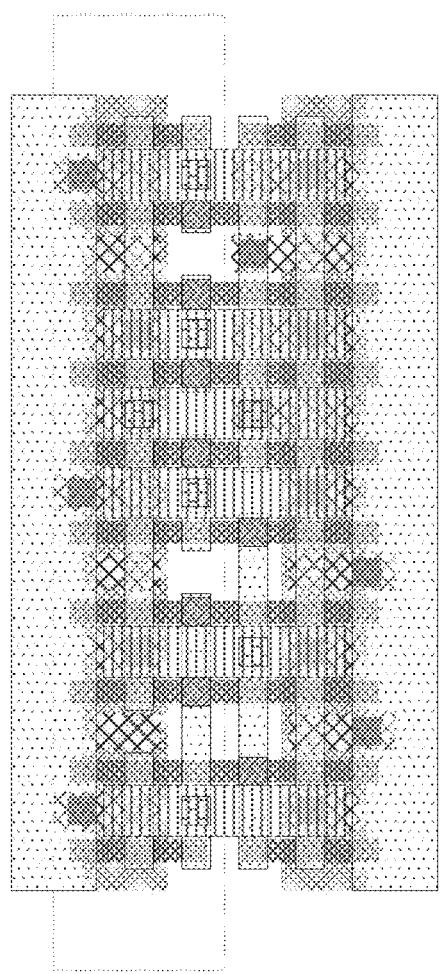
FIGS. 75A-C depict an oai22x2 cell.
Figure 75B:
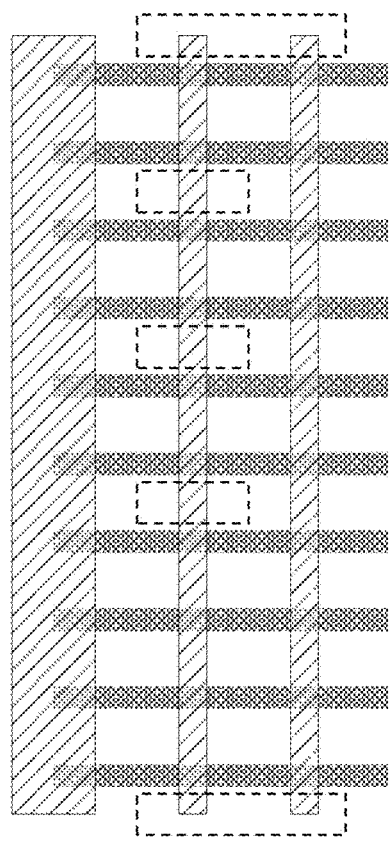
Figure 75C:
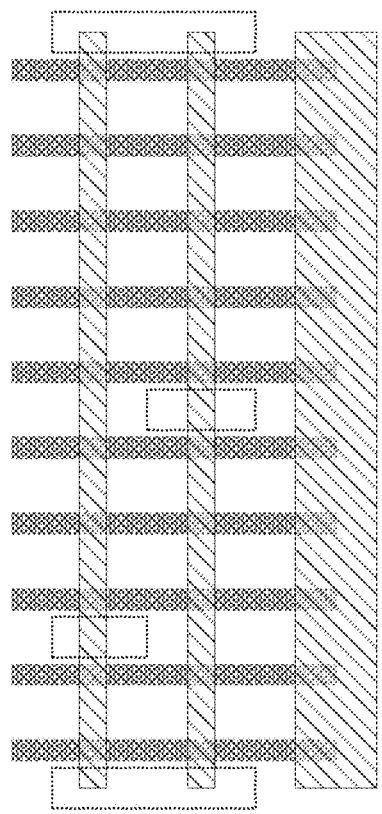

Reference is now made to FIGS. 75A-C, which depict an oai22x2 cell. This cell implements the logic function NOT (AND(OR(a,b),OR(c,d)), in drive strength 2. This cell is 9 CPP wide.

Figure 76A:
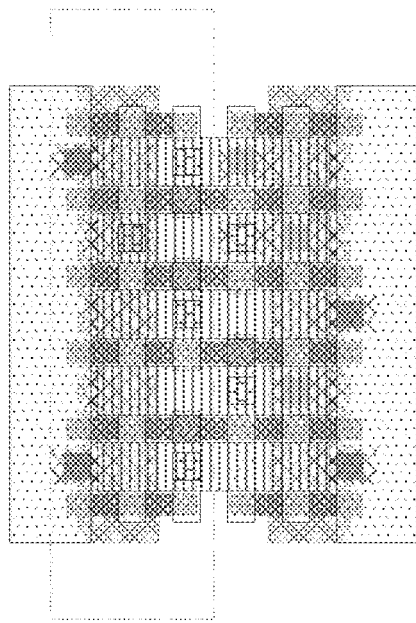
FIGS. 76A-C depict an oai31x1 cell.
Figure 76B:
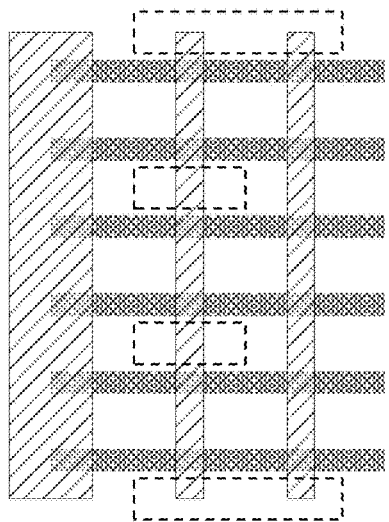
Figure 76C:
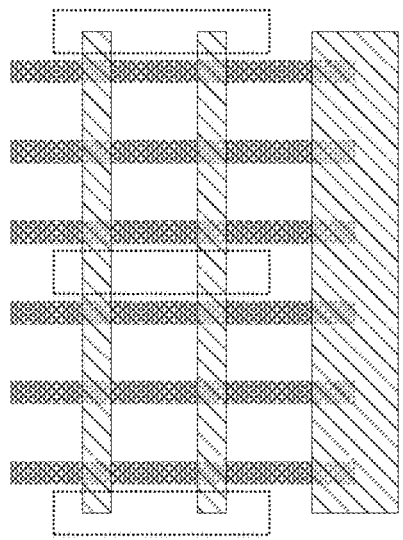

Reference is now made to FIGS. 76A-C, which depict an oai31x1 cell. This cell implements the logic function NOT (AND(OR(a,b,c),d)), in drive strength 1. This cell is 5 CPP wide.

Figure 77A:
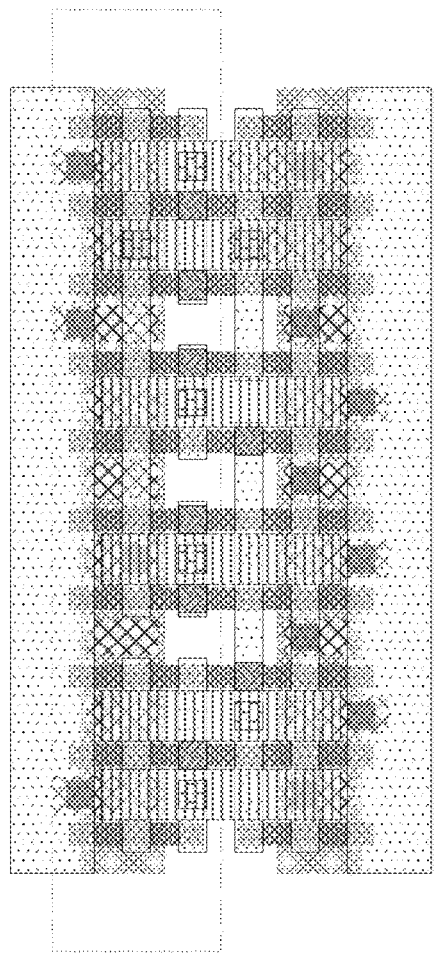
FIGS. 77A-C depict an oai31x2 cell.
Figure 77B:
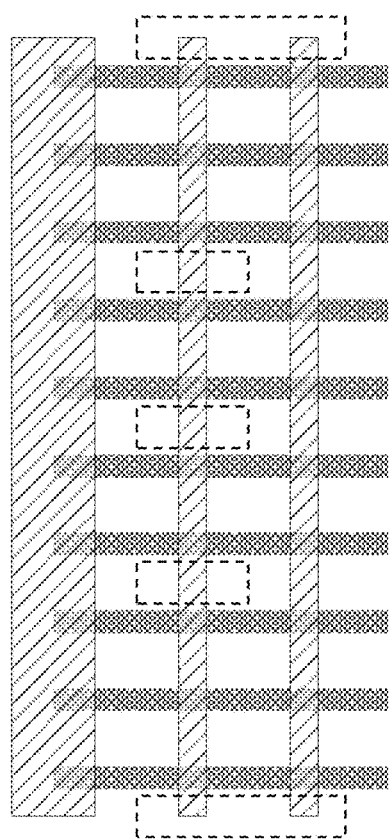
Figure 77C:
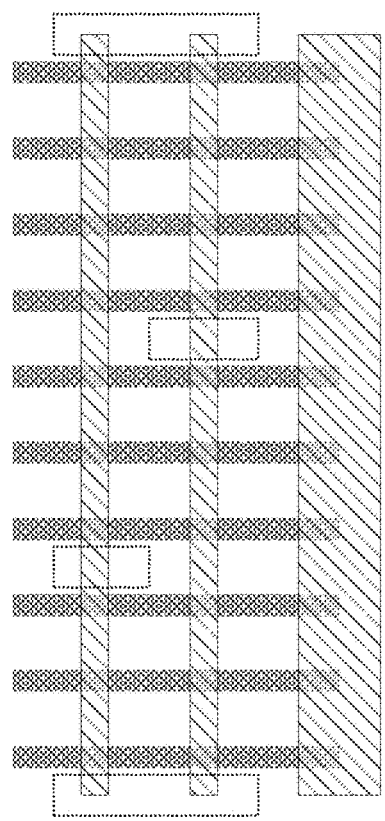

Reference is now made to FIGS. 77A-C, which depict an oai31x2 cell. This cell implements the logic function NOT (AND(OR(a,b,c),d)), in drive strength 2. This cell is 9 CPP wide.

Figure 78A:
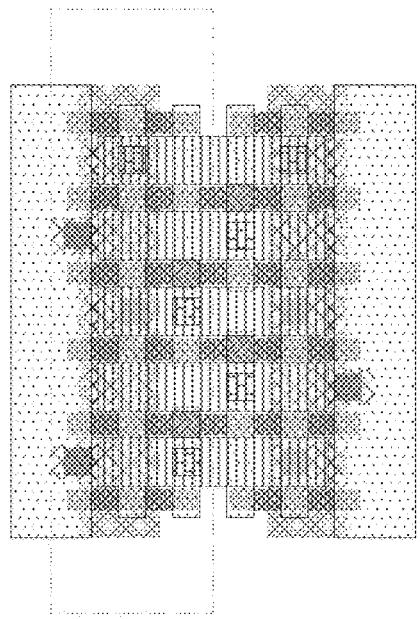
FIGS. 78A-C depict an oai211x1 cell.
Figure 78B:
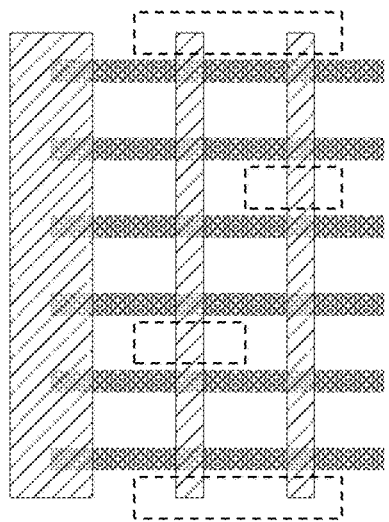
Figure 78C:
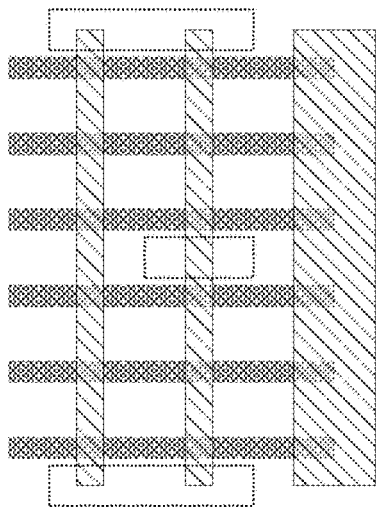

Reference is now made to FIGS. 78A-C, which depict an oai211x1 cell. This cell implements the logic function NOT (AND(OR(a,b),c,d)), in drive strength 1. This cell is 5 CPP wide.

Figure 79A:
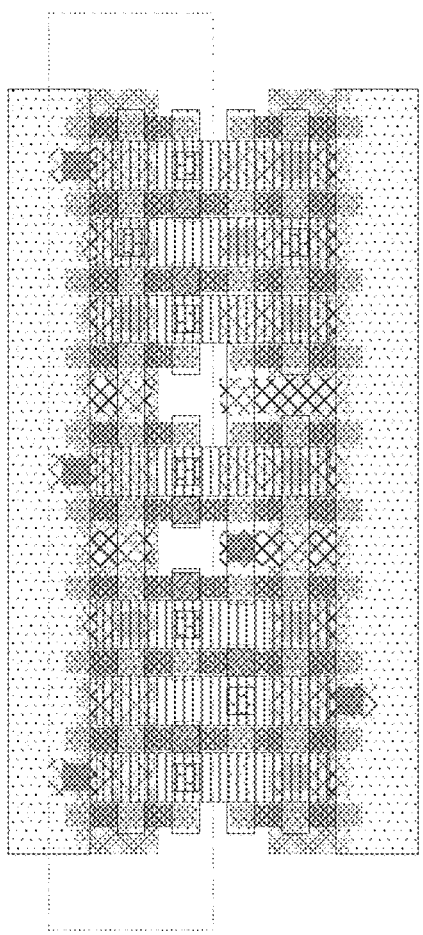
FIGS. 79A-C depict an oai222x1 cell.
Figure 79B:
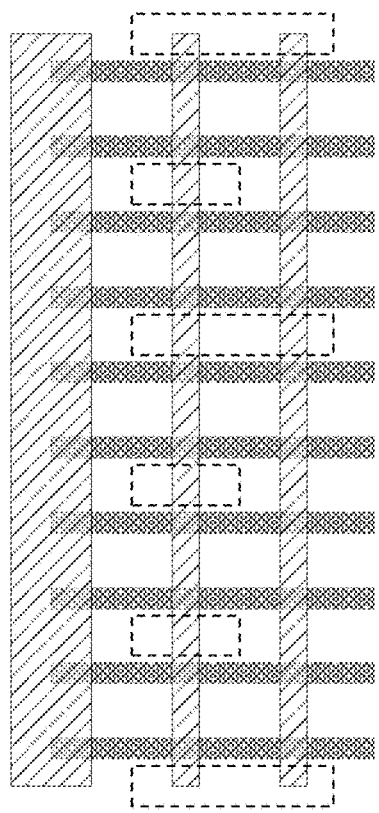
Figure 79C:
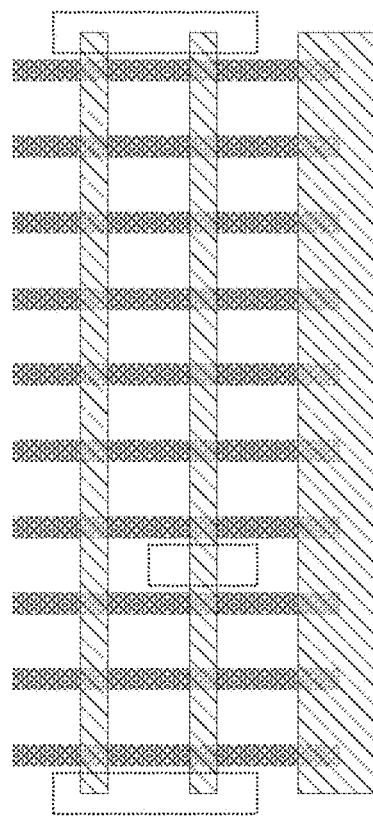

Reference is now made to FIGS. 79A-C, which depict an oai222x1 cell. This cell implements the logic function NOT(AND(OR(a,b),OR(c,d),OR(e,f))), in drive strength 1. This cell is 9 CPP wide.

Figure 80A:
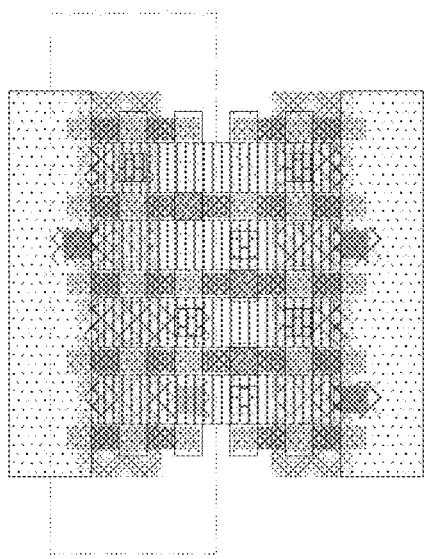
FIGS. 80A-C depict an or2x1 cell.
Figure 80B:
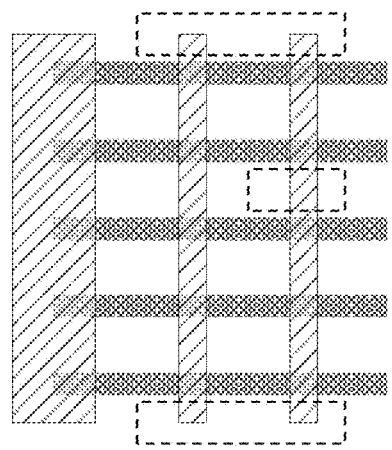
Figure 80C:
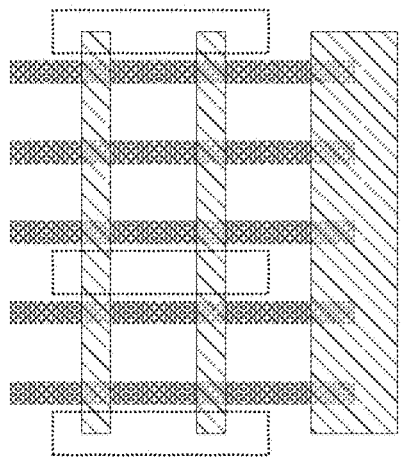

Reference is now made to FIGS. 80A-C, which depict an or2x1 cell. This cell implements the logic function of a 2-input OR, in drive strength 1. This cell is 4 CPP wide.

Figure 81A:
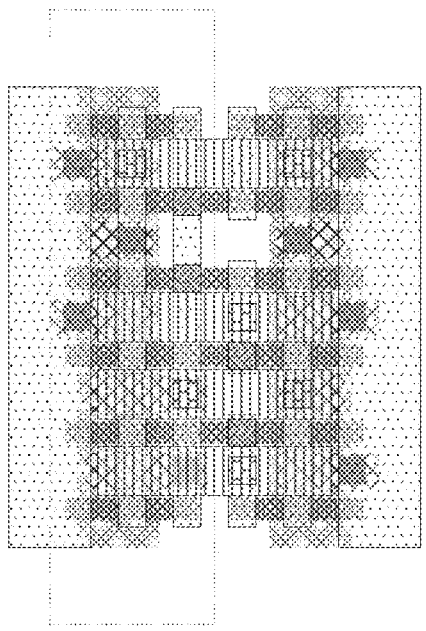
FIGS. 81A-C depict an or2x2 cell.
Figure 81B:
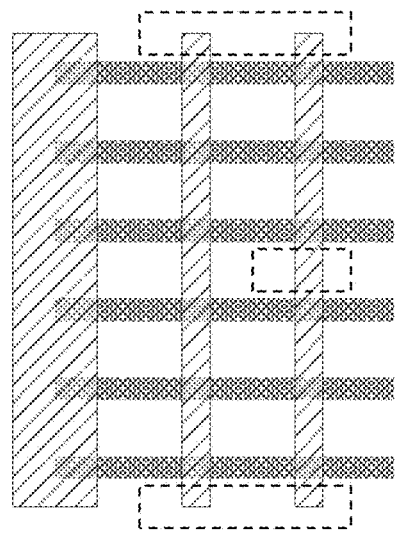
Figure 81C:
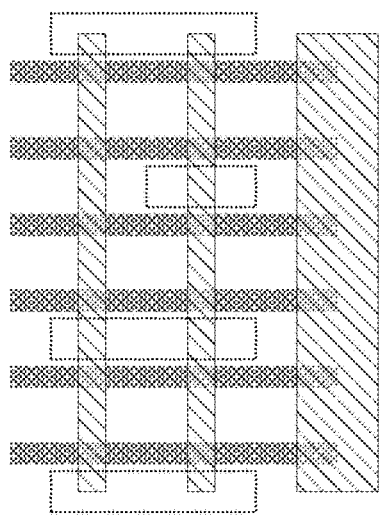

Reference is now made to FIGS. 81A-C, which depict an or2x2 cell. This cell implements the logic function of a 2-input OR, in drive strength 2. This cell is 5 CPP wide.

Figure 82A:
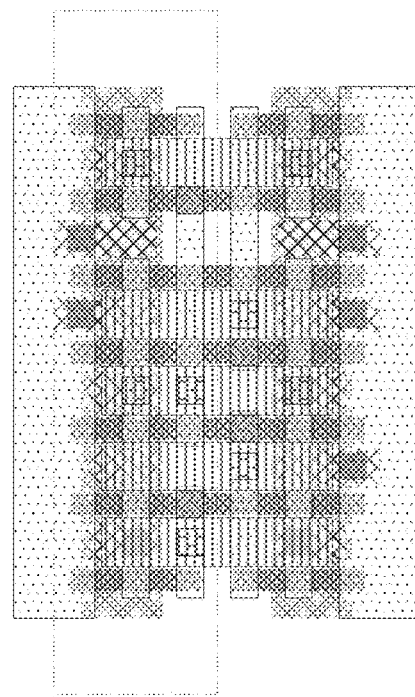
FIGS. 82A-C depict an or3x1 cell.
Figure 82B:
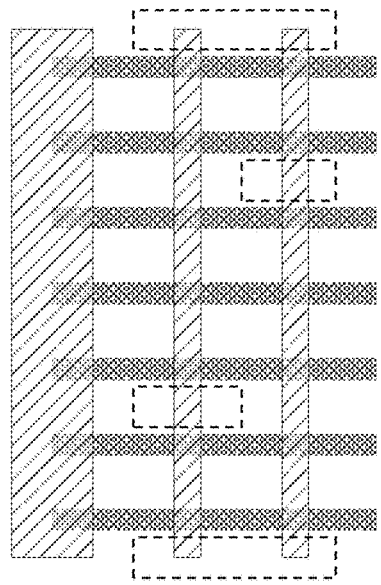
Figure 82C:
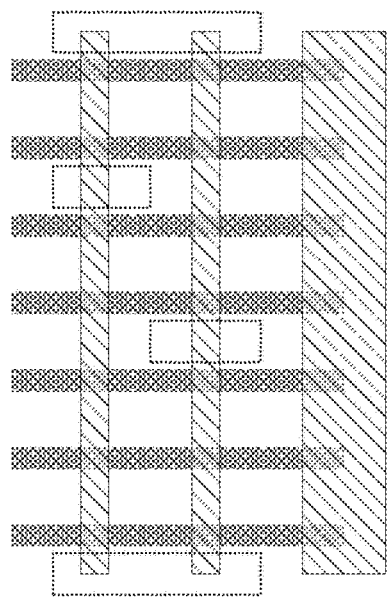

Reference is now made to FIGS. 82A-C, which depict an or3x1 cell. This cell implements the logic function of a 3-input OR, in drive strength 1. This cell is 6 CPP wide.

Figure 83A:
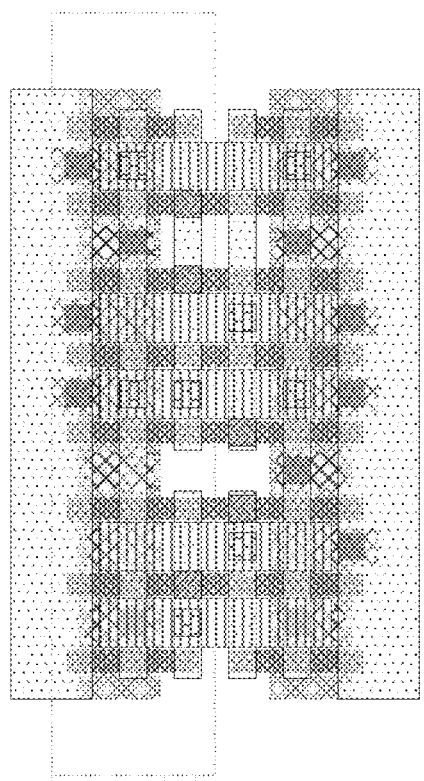
FIGS. 83A-C depict an or3x2 cell.
Figure 83B:
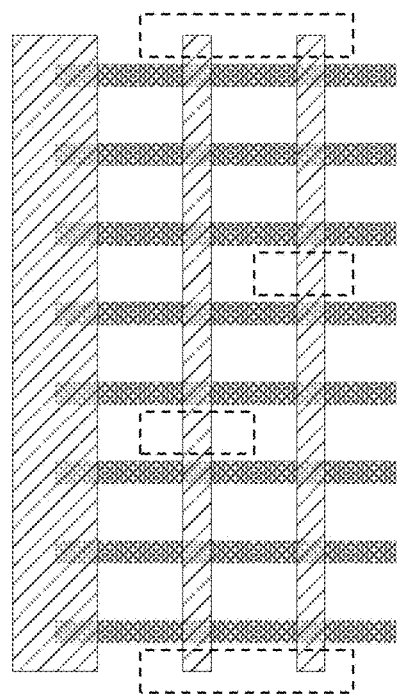
Figure 83C:
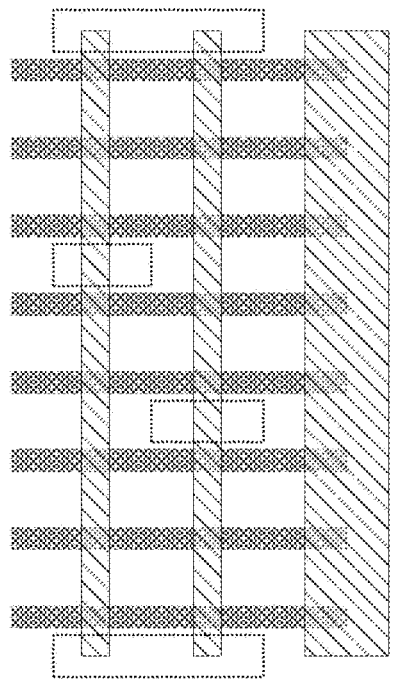

Reference is now made to FIGS. 83A-C, which depict an or3x2 cell. This cell implements the logic function of a 3-input OR, in drive strength 2. This cell is 7 CPP wide.

Figure 84A:
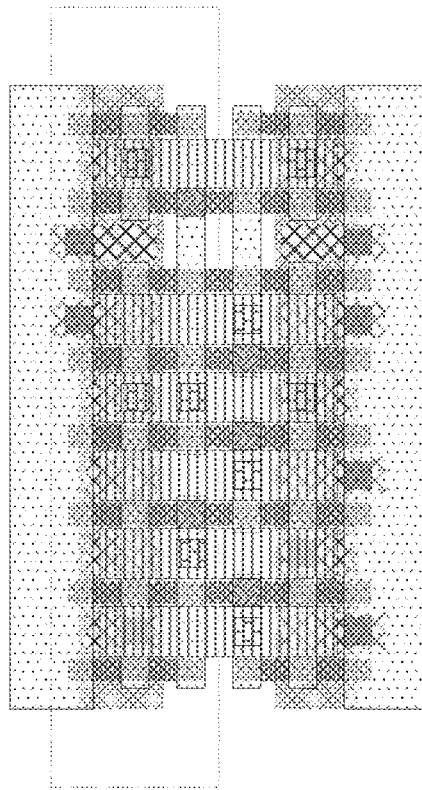
FIGS. 84A-C depict an or4x1 cell.
Figure 84B:
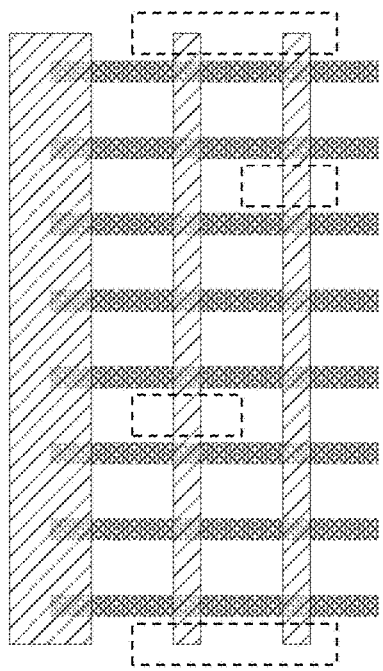
Figure 84C:
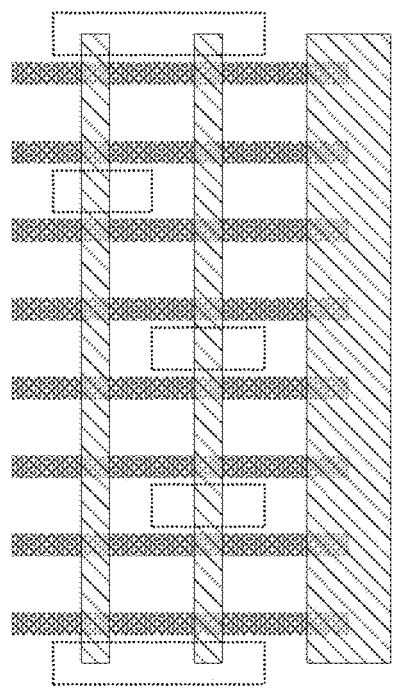

Reference is now made to FIGS. 84A-C, which depict an or4x1 cell. This cell implements the logic function of a 4-input OR, in drive strength 1. This cell is 7 CPP wide.

Figure 85A:
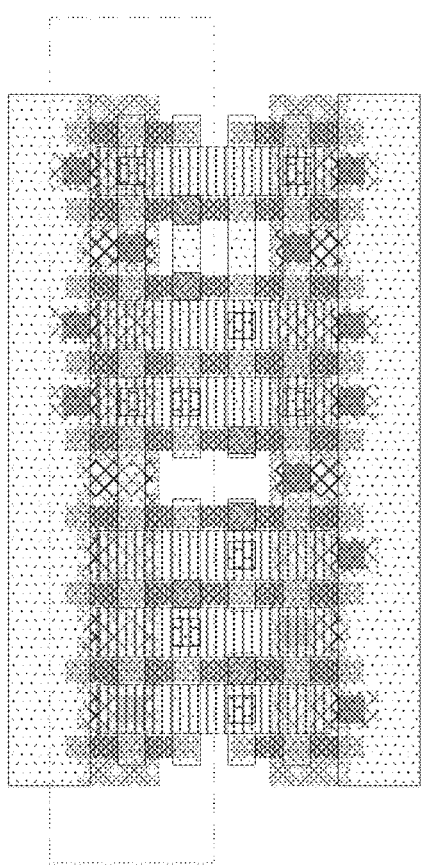
FIGS. 85A-C depict an or4x2 cell.
Figure 85B:
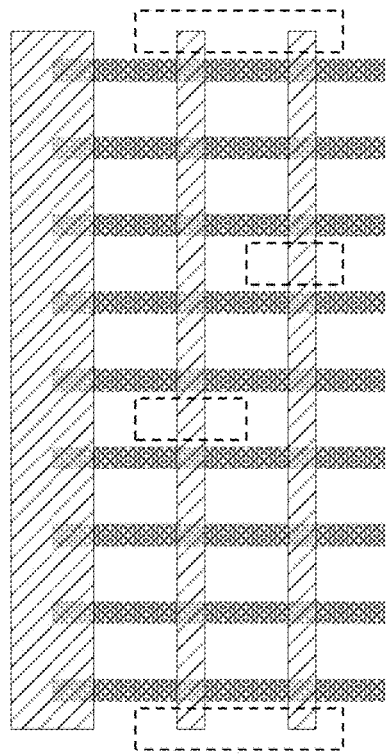
Figure 85C:
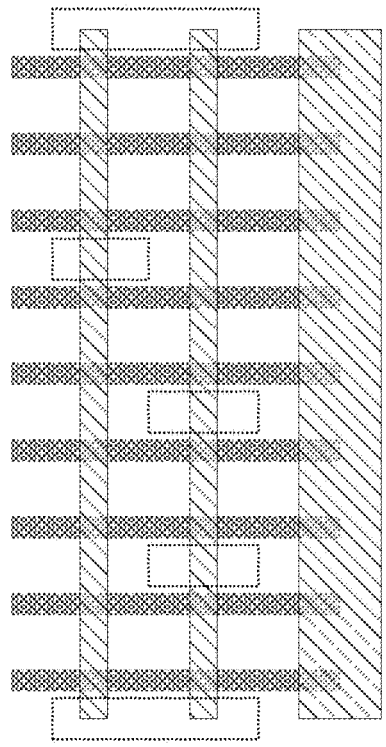

Reference is now made to FIGS. 85A-C, which depict an or4x2 cell. This cell implements the logic function of a 4-input OR, in drive strength 2. This cell is 8 CPP wide.

Figure 86A:
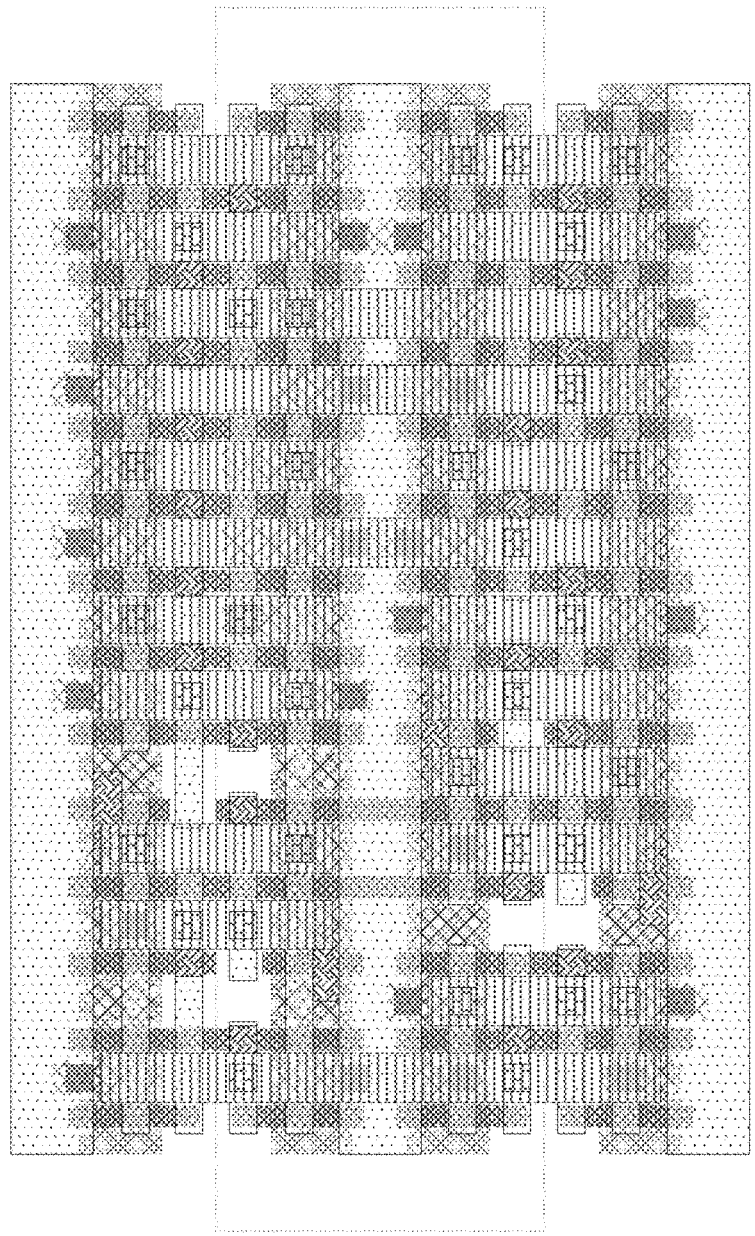
FIGS. 86A-C depict an sdffqx1 cell.
Figure 86B:
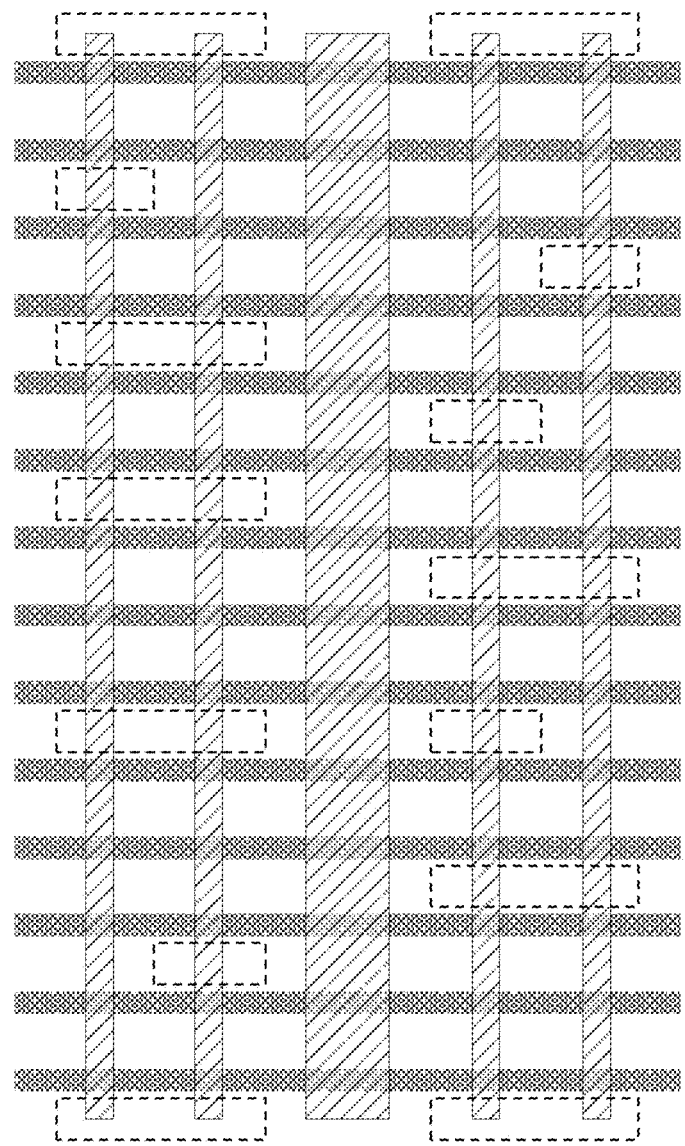
Figure 86C:
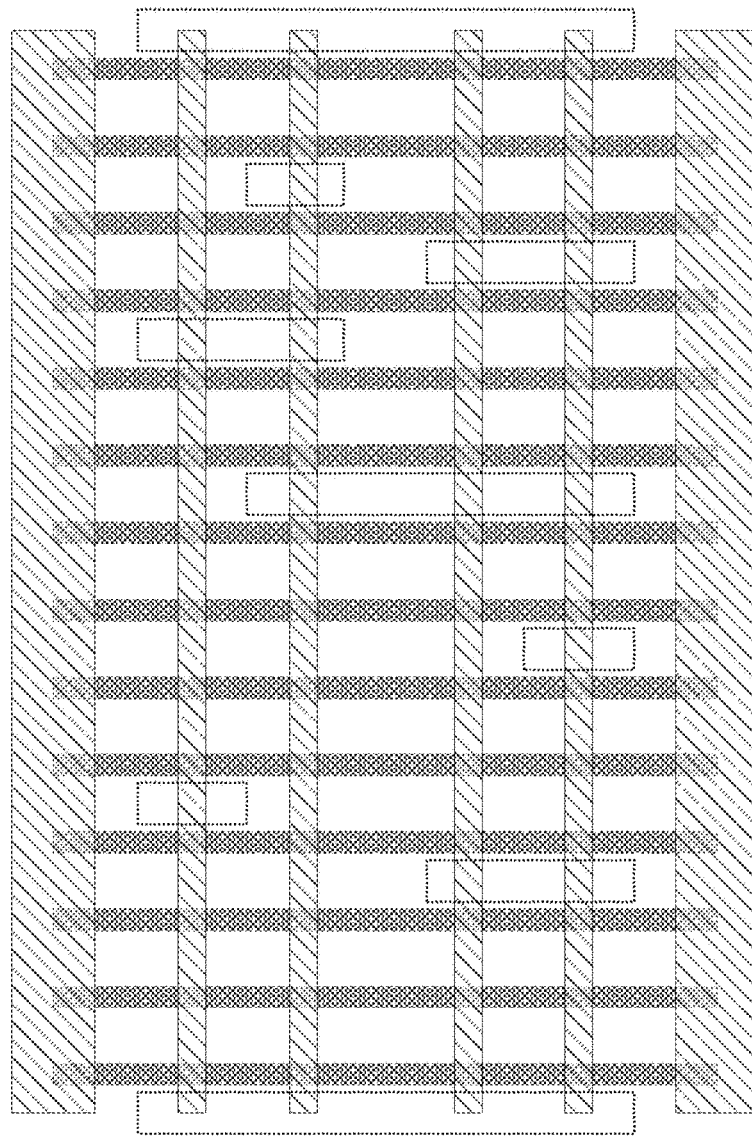

Reference is now made to FIGS. 86A-C, which depict an sdffqx1 cell. This cell implements the logic function of a scan-enabled D flip-flop, in drive strength 1. This double-height cell is 13 CPP wide.

Figure 87A:
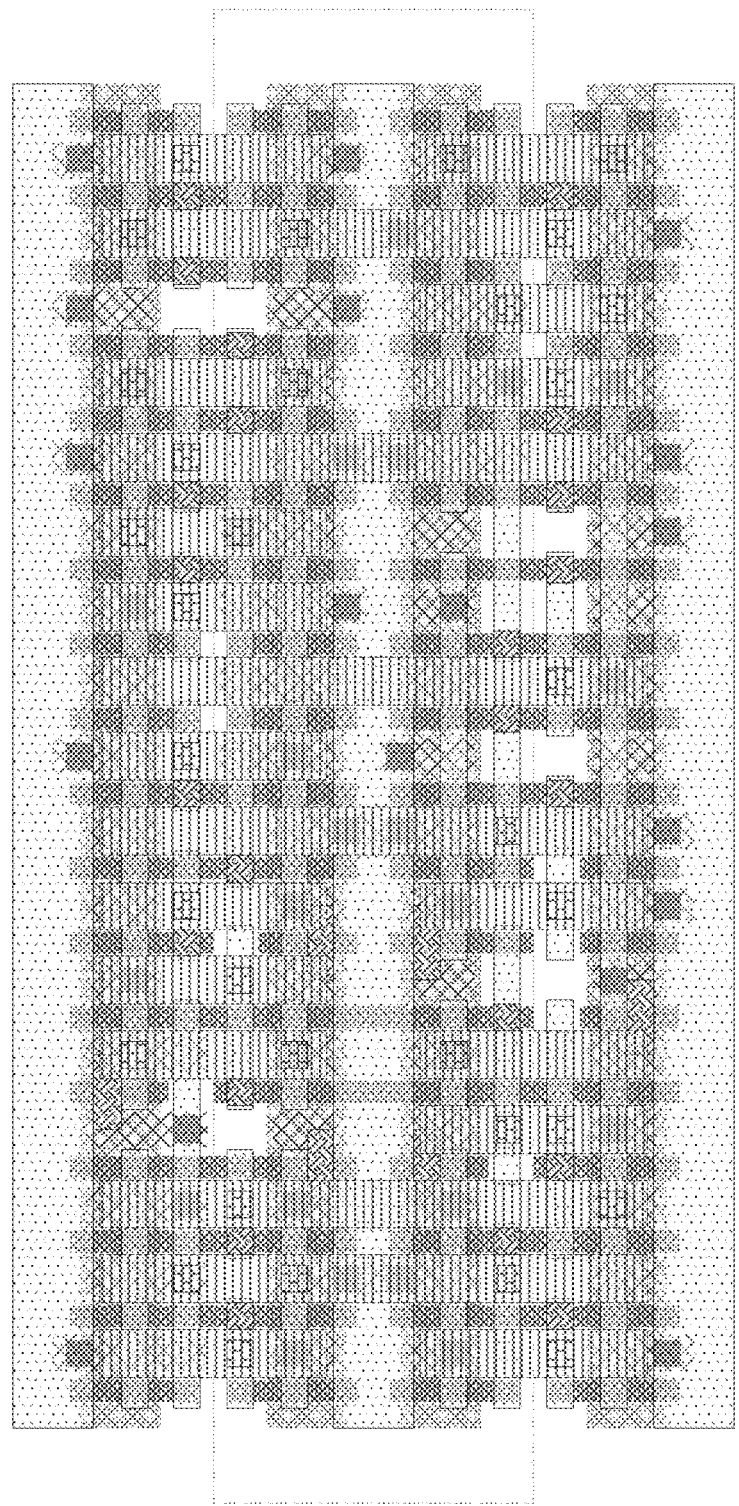
FIGS. 87A-C depict an sdffrsqx1 cell.
Figure 87B:
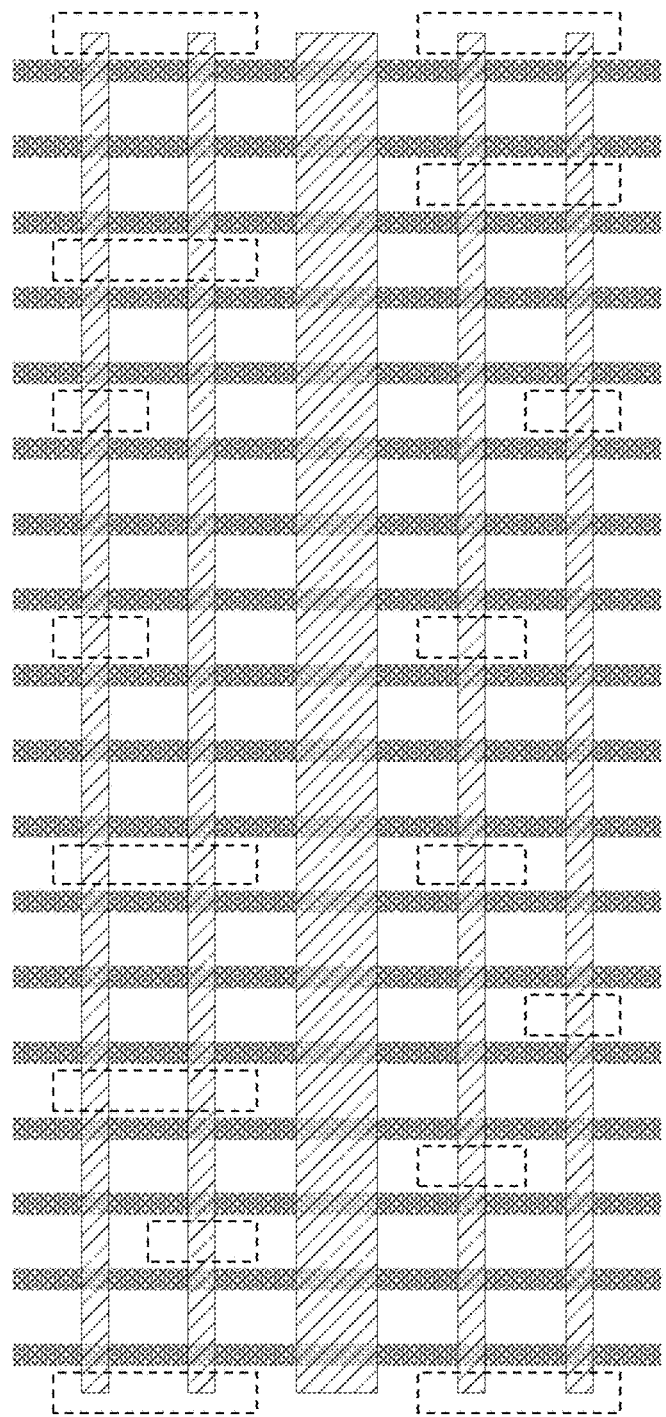
Figure 87C:
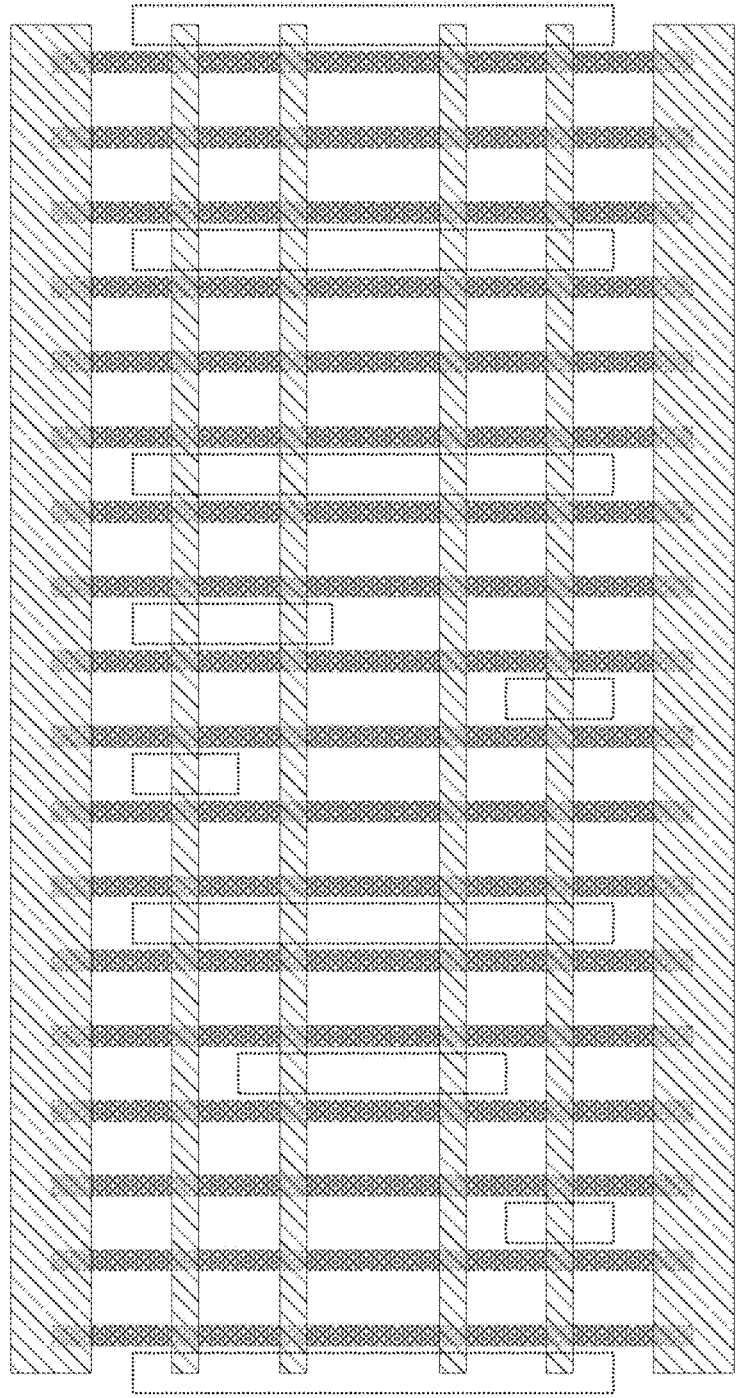

Reference is now made to FIGS. 87A-C, which depict an sdffrsqx1 cell. This cell implements the logic function of a scan-enabled D flip-flop, with set and reset, in drive strength 1. This double-height cell is 17 CPP wide.

Figure 88A:
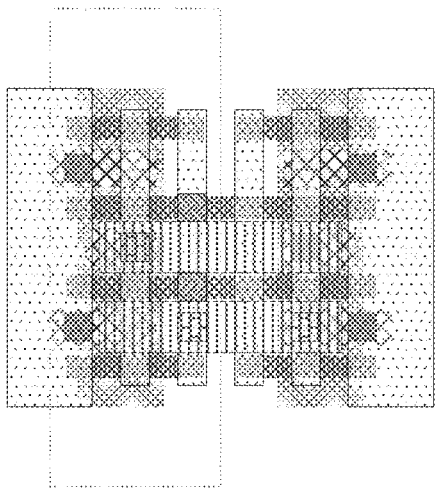
FIGS. 88A-C depict an tiehix1 cell.
Figure 88B:
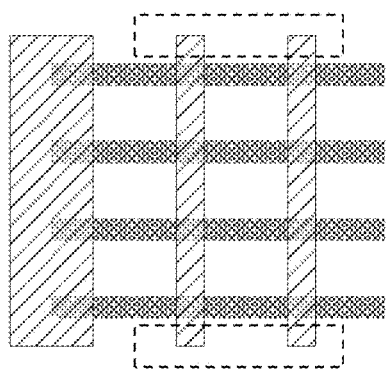
Figure 88C:
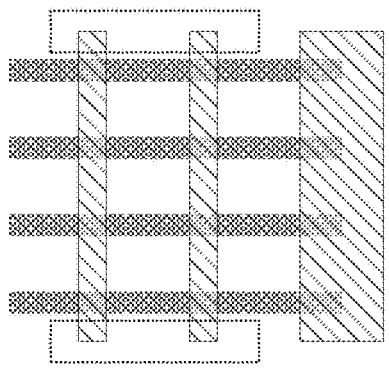

Reference is now made to FIGS. 88A-C, which depict an tiehix1 cell. This cell implements the logic function 1, in drive strength 1. This cell is 3 CPP wide.

Figure 89A:
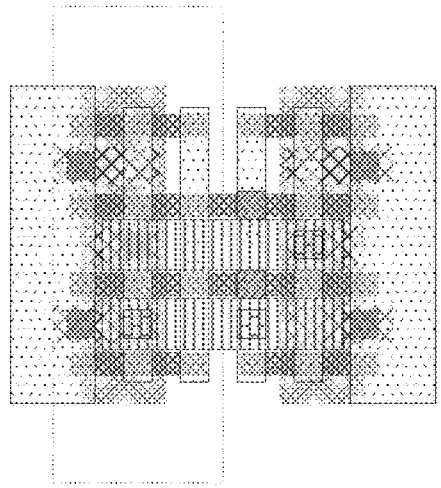
FIGS. 89A-C depict an tielox1 cell.
Figure 89B:
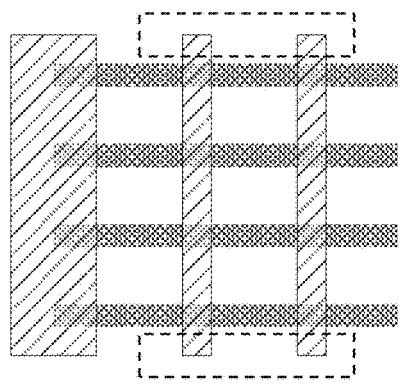
Figure 89C:
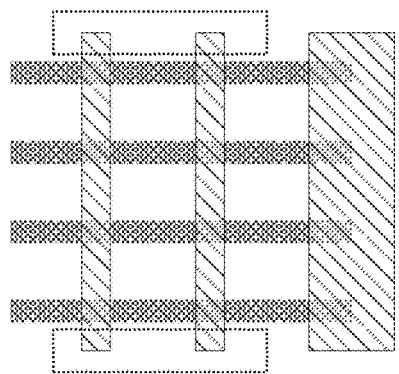

Reference is now made to FIGS. 89A-C, which depict an tielox1 cell. This cell implements the logic function 0, in drive strength 1. This cell is 3 CPP wide.

Figure 90A:
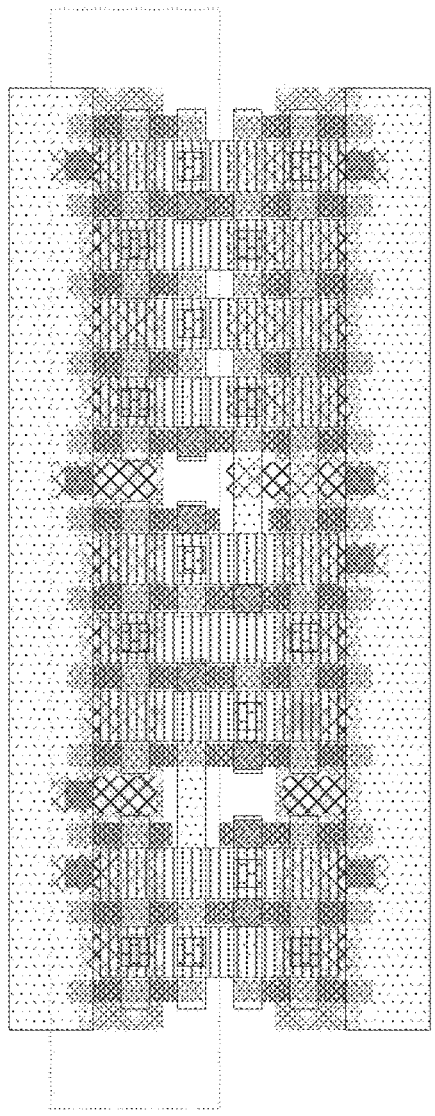
FIGS. 90A-C depict an xnr2x1 cell; and,
FIGS. 91A-C depict an xor2x1 cell.
Figure 90B:
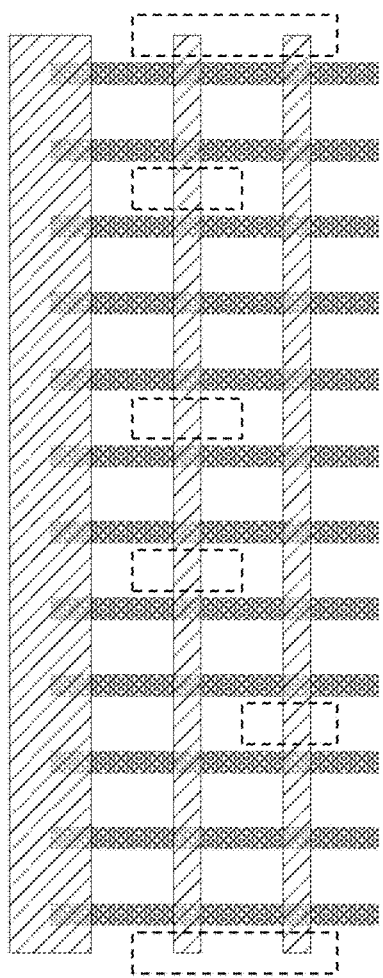
Figure 90C:
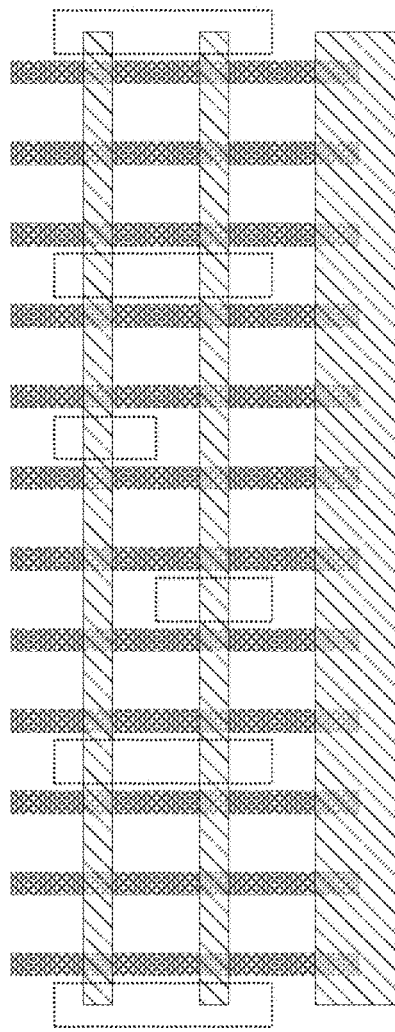

Reference is now made to FIGS. 90A-C, which depict an xnr2x1 cell. This cell implements the logic function of a 2-input XNOR, in drive strength 1. This cell is 11 CPP wide.

Figure 91A:
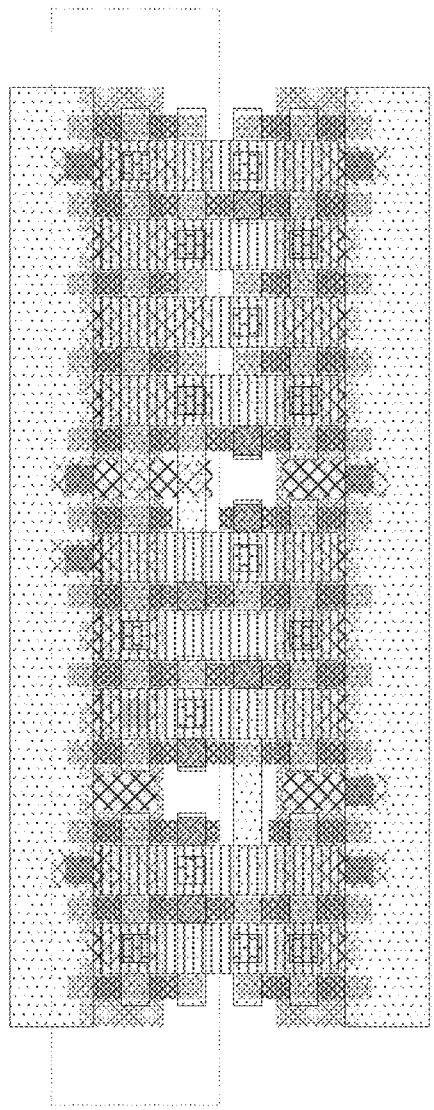
Figure 91B:
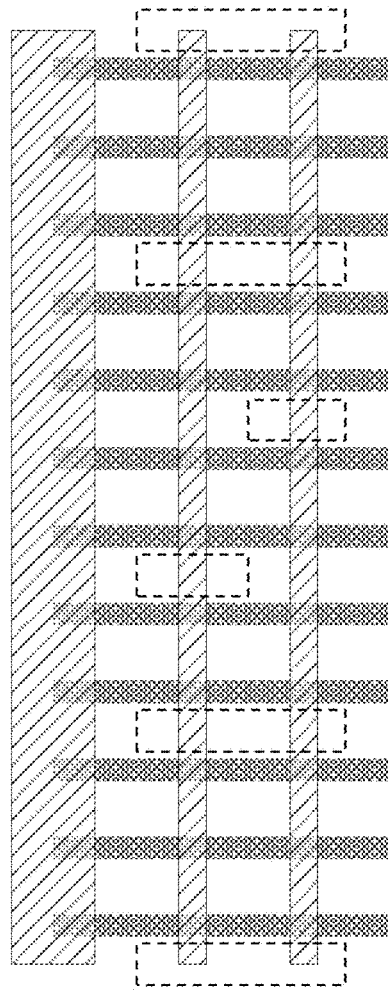
Figure 91C:
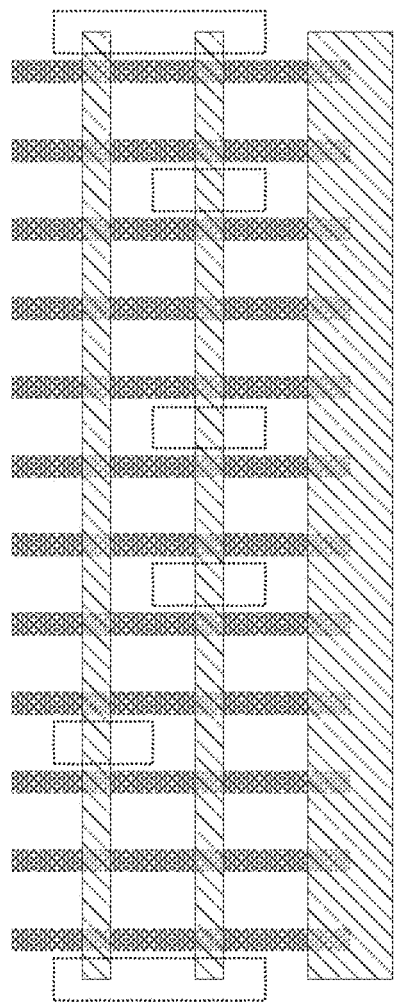

Reference is now made to FIGS. 91A-C, which depict an xor2x1 cell. This cell implements the logic function of a 2-input XOR, in drive strength 1. This cell is 11 CPP wide.

What is claimed in this application is:

1. A collection of standard logic cells, implementing a plurality of logic functions, wherein each standard cell comprises at least:
    two elongated supply rails, each formed in a first metal (M0) layer, each supply rail having a width at least twice a minimum permitted width for M0 features, each supply rail extending horizontally across the entire width of the standard cell;
    at least three elongated gate stripes, each formed in a gate (PC) layer, and each extending vertically between at least two of said supply rails, adjacent gate stripes spaced at a minimum contacted poly pitch (CPP);
    positioned vertically between said supply rails, at least two, first-exposure M0 tracks, each of said first-exposure M0 tracks having the minimum permitted width and extending horizontally across the cell, said first-exposure M0 tracks patterned, in part, by portion(s) of a first-exposure M0 mask (M0_color1) and, in part, by portion(s) of a first-exposure M0 cut mask (M0CUT1);
    positioned vertically between said supply rails, at least two, second-exposure M0 tracks, each of said second-exposure M0 tracks having the minimum permitted width and extending horizontally across the cell, said second-exposure M0 tracks patterned, in part, by portion(s) of a second-exposure M0 mask (M0_color2) and, in part, by portion(s) of a second-exposure M0 cut mask (M0CUT2); and,
    additional patterned features, in NW (N-well), TS (trench silicide), RX (active), CA (contact to active), GO (gate open), V0 (via to interconnect), and M1 (first-level interconnect) layers, configured to realize a logical function or behavior of the standard cell;
    wherein within in the cell:
        all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature;
        all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature.

2. The collection of standard logic cells, as defined in claim 1, wherein said cells are instantiated on a single silicon chip.

3. The collection of standard logic cells, as defined in claim 1, wherein said cells are instantiated as instructions for patterning features on a silicon wafer.

4. The collection of standard logic cells, as defined in claim 3, wherein said instructions are contained in a non-transient, computer-readable medium in GDSII format.

5. The collection of standard logic cells, as defined in claim 1, wherein the collection includes cells implementing at least four functions selected from the following list:
    the logic function of a 2-input AND;
    the logic function of a 3-input AND;
    the logic function of a 4-input AND;
    the logic function OR(AND(a,b),c);
    the logic function OR(AND(a,b,c),d);
    the logic function OR(AND(a,b),c,d);
    the logic function NOT(OR(AND(a,b),c));
    the logic function NOT(OR(AND(a,b),AND(c,d)));
    the logic function NOT(OR(AND(a,b,c),d));
    the logic function NOT(OR(AND(a,b),c,d));
    the logic function NOT(OR(AND(a,b),AND(c,d),AND(e,f)));
    the logic function of a buffer;
    the logic function of a clock-gating latch;
    the logic function of a delay gate;
    the logic function of a full adder;
    the logic function of a half adder;
    the logic function NOT(OR(AND(a,b),c)), with one of its inputs inverted;

the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e,f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

6. The collection of standard logic cells, as defined in claim 5, wherein the collection includes cells implementing at least eight functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND(e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d)));
the logic function NOT(AND(OR(a,b,c),d));
the logic function NOT(AND(OR(a,b),c,d));
the logic function NOT(AND(OR(a,b),OR(c,d),OR(e,f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

7. The collection of standard logic cells, as defined in claim 6, wherein the collection includes cells implementing at least twelve functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND(e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;

the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e,f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

8. The collection of standard logic cells, as defined in claim 7, wherein the collection includes cells implementing at least sixteen functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND(e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e,f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

9. A collection of standard logic cells, implementing a plurality of logic functions, wherein each standard cell comprises at least:
at least two elongated supply rails, extending horizontally across the standard cell;
at least three elongated gate stripes, each extending vertically between at least two of said supply rails, adjacent gate stripes spaced at a minimum contacted poly pitch (CPP);
positioned vertically between said supply rails, one or more first-exposure M0 tracks, each of said first-exposure M0 tracks having a minimum permitted width for M0 patterning and extending horizontally across the cell, said first-exposure M0 tracks patterned, in part, by feature(s) of a first-exposure M0 mask (M0_color1) and, in part, by feature(s) of a first-exposure M0 cut mask (M0CUT1);
positioned vertically between said supply rails, one or more second-exposure M0 tracks, each of said second-exposure M0 tracks having the minimum permitted width and extending horizontally across the cell, said second-exposure M0 tracks patterned, in part, by feature(s) of a second-exposure M0 mask (M0_color2) and, in part, by feature(s) of a second-exposure M0 cut mask (M0CUT2); and,
means, including additional patterned features in NW (N-well), TS (trench silicide), RX (active), CA (contact to active), GO (gate open), V0 (via to interconnect), and M1 (first-level interconnect) layers, configured to realize a logical function or behavior of the standard cell;
wherein within in the cell:
all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature;

all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature.

10. The collection of standard logic cells, as defined in claim 9, wherein said cells are instantiated on a single silicon chip.

11. The collection of standard logic cells, as defined in claim 9, wherein said cells are instantiated as instructions for patterning features on a silicon wafer.

12. The collection of standard logic cells, as defined in claim 11, wherein said instructions are contained in a non-transient, computer-readable medium in GDSII format.

13. The collection of standard logic cells, as defined in claim 10, wherein the collection includes cells implementing at least six functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND(e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d)));
the logic function NOT(AND(OR(a,b,c),d));
the logic function NOT(AND(OR(a,b),c,d));
the logic function NOT(AND(OR(a,b),OR(c,d),OR(e,f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

14. The collection of standard logic cells, as defined in claim 13, wherein the collection includes cells implementing at least ten functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND(e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);

the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e, f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

15. The collection of standard logic cells, as defined in claim 14, wherein the collection includes cells implementing at least fourteen functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND (e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e, f)));
the logic function of a 2-input OR;
the logic function of a 3-input OR;
the logic function of a 4-input OR;
the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

16. The collection of standard logic cells, as defined in claim 15, wherein the collection includes cells implementing at least twenty functions selected from the following list:
the logic function of a 2-input AND;
the logic function of a 3-input AND;
the logic function of a 4-input AND;
the logic function OR(AND(a,b),c);
the logic function OR(AND(a,b,c),d);
the logic function OR(AND(a,b),c,d);
the logic function NOT(OR(AND(a,b),c));
the logic function NOT(OR(AND(a,b),AND(c,d)));
the logic function NOT(OR(AND(a,b,c),d));
the logic function NOT(OR(AND(a,b),c,d));
the logic function NOT(OR(AND(a,b),AND(c,d),AND (e,f)));
the logic function of a buffer;
the logic function of a clock-gating latch;
the logic function of a delay gate;
the logic function of a full adder;
the logic function of a half adder;
the logic function NOT(OR(AND(a,b),c)), with one of its inputs inverted;
the logic function of a 2-input NAND, with one of its inputs inverted;
the logic function of a 3-input NAND, with one of its inputs inverted;
the logic function of a 2-input NOR, with one of its inputs inverted;
the logic function of a 3-input NOR, with one of its inputs inverted;
the logic function of an inverter;
the logic function NOT(AND(OR(a,b),c)), with one of its inputs inverted;
the logic function of a latch;
the logic function of a 2-input MUX;
the logic function of a 2-input MUX, with one of its inputs inverted;
the logic function of a 2-input NAND;
the logic function of a 3-input NAND;
the logic function of a 4-input NAND;
the logic function of a 2-input NOR;
the logic function of a 3-input NOR;
the logic function of a 4-input NOR;
the logic function AND(OR(a,b),c);
the logic function AND(OR(a,b,c),d);
the logic function AND(OR(a,b),c,d);
the logic function NOT(AND(OR(a,b),c));
the logic function NOT(AND(OR(a,b),OR(c,d));
the logic function NOT(AND(OR(a,b,c),d));
the logic function NOT(AND(OR(a,b),c,d));
the logic function NOT(AND(OR(a,b),OR(c,d),OR(e, f)));
the logic function of a 2-input OR;
the logic function of a 3-input OR;
the logic function of a 4-input OR;

the logic function of a scan-enabled D flip-flop;
the logic function of a scan-enabled D flip-flop, with set and reset;
the logic function 1;
the logic function 0;
the logic function of a 2-input XNOR; and,
the logic function of a 2-input XOR.

17. The collection of standard logic cells, as defined in claim 14, wherein said collection includes at least three logic cells that are implemented in at least two different drive strengths.

18. The collection of standard logic cells, as defined in claim 14, wherein said collection includes at least two logic cells that are implemented in at least three different drive strengths.

19. The collection of standard logic cells, as defined in claim 9, wherein said collection includes at least three logic cells that are implemented in at least two different drive strengths.

20. The collection of standard logic cells, as defined in claim 9, wherein said collection includes at least two logic cells that are implemented in at least three different drive strengths.

\* \* \* \* \*